(12) United States Patent
Miyake et al.

(10) Patent No.: US 11,204,658 B2
(45) Date of Patent: Dec. 21, 2021

(54) TOUCH SENSOR, DISPLAY DEVICE, DISPLAY MODULE, AND ELECTRONIC DEVICE

(71) Applicant: Semiconductor Energy Laboratory Co., Ltd., Atsugi (JP)

(72) Inventors: Hiroyuki Miyake, Aichi (JP); Takahiro Fukutome, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/784,550

(22) Filed: Oct. 16, 2017

(65) Prior Publication Data
US 2018/0113547 A1   Apr. 26, 2018

(30) Foreign Application Priority Data

Oct. 21, 2016   (JP) .............................. JP2016-207008

(51) Int. Cl.
| | | |
|---|---|---|
| G06F 3/041 | (2006.01) | |
| G06F 3/044 | (2006.01) | |
| G06F 3/045 | (2006.01) | |
| G06F 3/047 | (2006.01) | |
| G02F 1/1333 | (2006.01) | |

(52) U.S. Cl.
CPC ............ *G06F 3/0412* (2013.01); *G06F 3/045* (2013.01); *G06F 3/047* (2013.01); *G06F 3/0443* (2019.05); *G06F 3/0445* (2019.05); *G06F 3/0446* (2019.05); *G06F 3/04164* (2019.05); *G06F 3/04166* (2019.05); *G02F 1/13338* (2013.01); *G06F 2203/04104* (2013.01)

(58) Field of Classification Search
None
See application file for complete search history.

(56) References Cited

U.S. PATENT DOCUMENTS

| | | |
|---|---|---|
| 7,248,235 B2 | 7/2007 | Fujii et al. |
| 8,243,027 B2 | 8/2012 | Hotelling et al. |
| 8,259,078 B2 | 9/2012 | Hotelling et al. |

(Continued)

FOREIGN PATENT DOCUMENTS

| | | |
|---|---|---|
| CN | 001403856 A | 3/2003 |
| CN | 102999212 A | 3/2013 |

(Continued)

OTHER PUBLICATIONS

International Search Report (Application No. PCT/IB2017/056240) dated Jan. 23, 2018.

(Continued)

*Primary Examiner* — Dorothy Harris
(74) *Attorney, Agent, or Firm* — Fish & Richardson P.C.

(57) ABSTRACT

Sensing time of a touch sensor is shortened to increase responsiveness of touch sensing. A display device includes a gate driver, a plurality of touch sensors, and a plurality of touch wirings. The gate driver has a function of supplying a scan signal to the plurality of touch wirings at the same timing, and the touch sensors in different positions sense a plurality of touches at the same timing. In this manner, the responsiveness of touch sensing is increased. The gate driver has a function of controlling a scan signal for refreshing display and a scan signal used by the touch sensor for sensing.

18 Claims, 29 Drawing Sheets

(56) References Cited

U.S. PATENT DOCUMENTS

| | | | |
|---|---|---|---|
| 8,432,371 B2 | 4/2013 | Hotelling et al. | |
| 8,451,244 B2 | 5/2013 | Hotelling et al. | |
| 8,552,989 B2 | 10/2013 | Hotelling et al. | |
| 8,654,083 B2 | 2/2014 | Hotelling et al. | |
| 8,823,893 B2 | 9/2014 | Yamazaki | |
| 9,035,202 B2 | 5/2015 | Mizuhashi et al. | |
| 9,244,323 B2 | 1/2016 | Yamazaki | |
| 9,244,561 B2 | 1/2016 | Hotelling et al. | |
| 9,268,429 B2 | 2/2016 | Hotelling et al. | |
| 9,342,178 B2 * | 5/2016 | Lee | G06F 3/045 |
| 9,372,583 B2 | 6/2016 | Kim et al. | |
| 9,448,433 B2 | 9/2016 | Yamazaki et al. | |
| 9,575,610 B2 | 2/2017 | Hotelling et al. | |
| 9,715,845 B2 | 7/2017 | Umezaki et al. | |
| 9,779,678 B2 | 10/2017 | Mizuhashi et al. | |
| 10,191,576 B2 | 1/2019 | Hotelling et al. | |
| 10,976,846 B2 | 4/2021 | Hotelling et al. | |
| 2008/0158167 A1 * | 7/2008 | Hotelling | G06F 3/0416 345/173 |
| 2012/0044166 A1 * | 2/2012 | Mizuhashi | G06F 3/0412 345/173 |
| 2012/0075240 A1 * | 3/2012 | Kida | G06F 3/044 345/174 |
| 2012/0162584 A1 * | 6/2012 | Chang | G02F 1/13306 349/106 |
| 2012/0218199 A1 * | 8/2012 | Kim | G06F 3/0412 345/173 |
| 2012/0274612 A1 * | 11/2012 | Sogabe | H01L 27/124 345/204 |
| 2013/0069894 A1 | 3/2013 | Chen et al. | |
| 2013/0147724 A1 * | 6/2013 | Hwang | G06F 3/0412 345/173 |
| 2013/0241868 A1 * | 9/2013 | Kim | G06F 3/0412 345/174 |
| 2013/0257798 A1 | 10/2013 | Tamura et al. | |
| 2014/0049508 A1 * | 2/2014 | Kim | G06F 3/044 345/174 |
| 2014/0071360 A1 * | 3/2014 | Chang | G06F 3/0412 349/12 |
| 2014/0132560 A1 * | 5/2014 | Huang | G06F 3/044 345/174 |
| 2014/0139457 A1 * | 5/2014 | Hotelling | G06F 3/0412 345/173 |
| 2014/0160061 A1 * | 6/2014 | Kim | G06F 3/044 345/174 |
| 2014/0160086 A1 * | 6/2014 | Lee | G06F 3/0418 345/178 |
| 2014/0285466 A1 | 9/2014 | Hayashi | |
| 2015/0028339 A1 * | 1/2015 | Sogabe | H01L 27/124 257/71 |
| 2015/0185902 A1 * | 7/2015 | Liu | G02F 1/136209 345/174 |
| 2016/0018916 A1 * | 1/2016 | Lee | G09G 3/3208 345/173 |
| 2016/0041666 A1 * | 2/2016 | Lee | G06F 3/045 345/174 |
| 2016/0179273 A1 * | 6/2016 | Lee | G09G 5/00 345/174 |
| 2016/0188040 A1 * | 6/2016 | Shin | G06F 3/0412 345/174 |
| 2016/0195972 A1 * | 7/2016 | Chen | G02F 1/13338 345/173 |
| 2016/0283028 A1 | 9/2016 | Yamazaki et al. | |
| 2016/0328055 A1 * | 11/2016 | Wu | G06F 3/046 |
| 2016/0349558 A1 | 12/2016 | Shishido et al. | |
| 2016/0358986 A1 | 12/2016 | Yamazaki et al. | |
| 2016/0364072 A1 * | 12/2016 | Chiang | G06F 3/0416 |
| 2016/0365040 A1 | 12/2016 | Yamazaki et al. | |
| 2016/0365041 A1 | 12/2016 | Yamazaki et al. | |
| 2017/0040403 A1 | 2/2017 | Kuwabara | |
| 2017/0061863 A1 | 3/2017 | Eguchi | |
| 2017/0082882 A1 | 3/2017 | Hirakata et al. | |
| 2017/0147127 A1 * | 5/2017 | Sun | G06F 3/0416 |
| 2017/0205913 A1 | 7/2017 | Kimura et al. | |
| 2017/0221410 A1 | 8/2017 | Akimoto et al. | |
| 2017/0309212 A1 | 10/2017 | Umezaki et al. | |
| 2018/0095575 A1 * | 4/2018 | Ota | G06F 3/0412 |
| 2019/0196634 A1 | 6/2019 | Hotelling et al. | |

FOREIGN PATENT DOCUMENTS

| | | |
|---|---|---|
| CN | 103594050 A | 2/2014 |
| CN | 104965621 A | 10/2015 |
| CN | 107077807 A | 8/2017 |
| EP | 2259172 A | 12/2010 |
| EP | 2330491 A | 6/2011 |
| EP | 2330492 A | 6/2011 |
| EP | 2330493 A | 6/2011 |
| EP | 2330494 A | 6/2011 |
| EP | 3264240 A | 1/2018 |
| EP | 3805907 A | 4/2021 |
| JP | 2003-076302 A | 3/2003 |
| JP | 2011-085918 A | 4/2011 |
| JP | 2011-154357 A | 8/2011 |
| JP | 2012-043355 A | 3/2012 |
| JP | 2013-065301 A | 4/2013 |
| JP | 2014-186537 A | 10/2014 |
| KR | 2003-0022049 A | 3/2003 |
| KR | 2013-0030222 A | 3/2013 |
| KR | 2017-0066443 A | 6/2017 |
| TW | 588185 | 5/2004 |
| TW | 201214226 | 4/2012 |
| TW | 201631564 | 9/2016 |
| WO | WO-2007/041150 | 4/2007 |
| WO | WO-2007/146779 | 12/2007 |
| WO | WO-2007/146780 | 12/2007 |
| WO | WO-2007/146783 | 12/2007 |
| WO | WO-2007/146785 | 12/2007 |
| WO | WO-2016/088488 | 6/2016 |

OTHER PUBLICATIONS

Written Opinion (Application No. PCT/IB2017/056240) dated Jan. 23, 2018.

Invitation to Pay Additional Fees (Application No. PCT/IB2017/056240), International Searching Authority, dated Dec. 5, 2017.

Taiwanese Office Action (Application No. 106135532) dated Jul. 19, 2021.

* cited by examiner

FIG. 23A-1　　FIG. 23B-1　　FIG. 23C-1
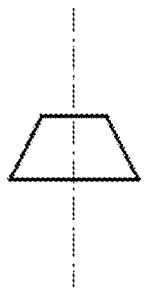 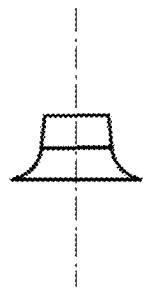 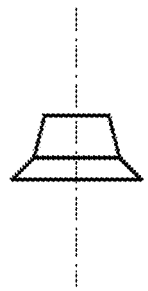
FIG. 23A-2　　FIG. 23B-2　　FIG. 23C-2
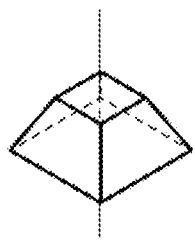 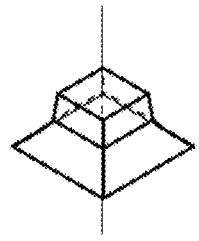 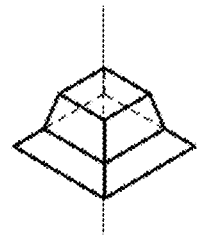
FIG. 23D-1　　FIG. 23E-1　　FIG. 23F-1
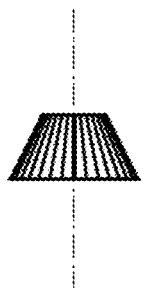 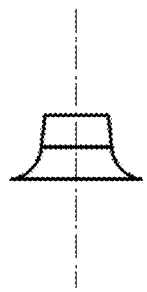 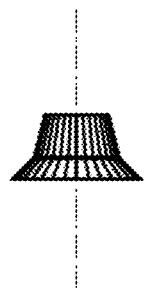
FIG. 23D-2　　FIG. 23E-2　　FIG. 23F-2
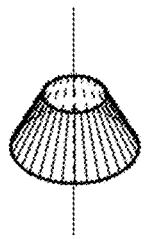 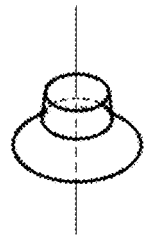 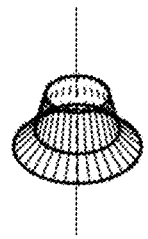

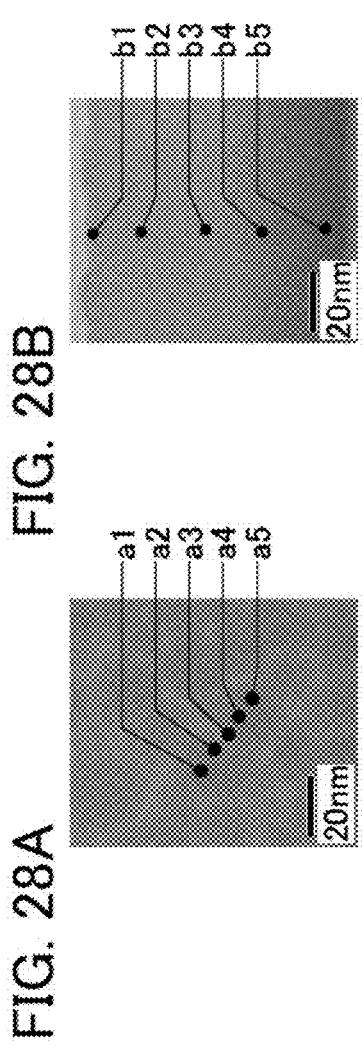
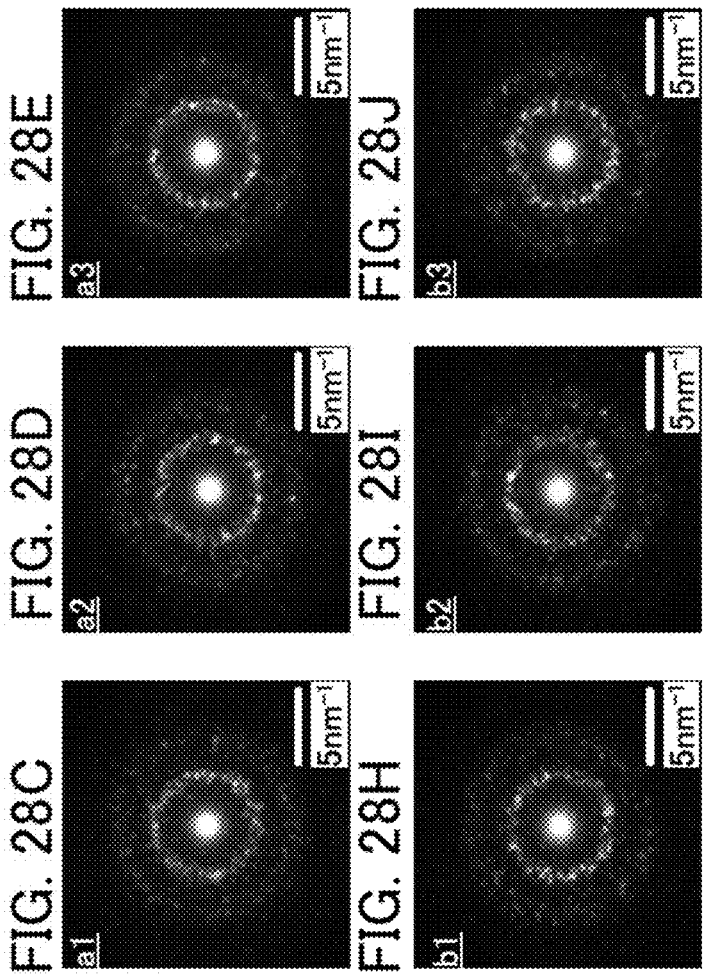

TOUCH SENSOR, DISPLAY DEVICE, DISPLAY MODULE, AND ELECTRONIC DEVICE

TECHNICAL FIELD

One embodiment of the present invention relates to a touch sensor, a display device, a display module, and an electronic device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a memory device, a touch panel, a driving method thereof, and a manufacturing method thereof.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

BACKGROUND ART

Mobile devices such as smartphones, tablets, and electronic books have become increasingly popular. A reduced size, a reduced thickness, a reduced weight, flexibility, or operability is demanded of electronic devices. The electronic devices need to display images suitable for the brightness of a use environment (i.e., an outdoor environment or an indoor environment). In addition, increased operability in touch input is demanded of smartphones, tablets, e-book readers, and the like.

For example, a display device proposed in Patent Document 1 displays an image by utilizing reflected light in sufficiently bright external light, such as natural light or light from an indoor lighting device, and displays an image by utilizing a light-transmitting element in an environment without enough brightness, thereby achieving low power consumption.

For example, in Patent Document 2, display in a certain region is selectively refreshed with the use of a decoder circuit to reduce power consumption of mobile devices.

For example, Patent Document 3 discloses hybrid display devices in each of which a pixel circuit for controlling a liquid crystal element and a pixel circuit for controlling a light-emitting element are provided in one pixel.

REFERENCE

[Patent Document 1] Japanese Published Patent Application No. 2011-154357
[Patent Document 2] Japanese Published Patent Application No. 2011-085918
[Patent Document 3] PCT International Publication No. WO2007/041150

DISCLOSURE OF INVENTION

One way to increase the operability of an electronic device at the time of touch input is to increase the touch sensing frequency. However, when the touch sensing frequency is increased, a driving signal of a display device or the like causes noise and the touch sensing accuracy is reduced.

A reduced size, a reduced thickness, a reduced weight, flexibility, or operability is demanded of electronic devices. For higher operability, display devices including touch sensors are demanded. For a reduced size, a reduced thickness, and a reduced weight, a reduction in the number of components is demanded. For flexibility, a reduction in the thickness of the display device is demand.

Smartphones, tablets, e-book readers, personal computers, and the like are more and more often used in a place with bright external light. Among such mobile devices, smartphones, tablets, and the like which are often used in a place with bright external light display an image with a high luminance to improve the viewability. These mobile devices thus easily consume power. Accordingly, a large-capacity battery is necessary for long-term use. However, a higher-capacity battery leads to a heavier mobile device.

When used for a long time, smartphones, tablets, e-book readers, and the like need to save power. To control power consumption, typically, power gating, clock gating, or the like is employed. In the case of a display device, the number of times of display refreshing is reduced in a suggested method. However, when the refreshing interval of display is long, leakage of electric charges occurs in a switch transistor retaining data. The retained data is deteriorated by the leakage of electric charges, which causes flickers to reduce the viewability.

In view of the above problems, an object of one embodiment of the present invention is to provide a display device with improved operability in touch input. Another object of one embodiment of the present invention is to provide a display device with a novel structure including a touch sensor. Another object of one embodiment of the present invention is to provide an electronic device with reduced power consumption.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a display device that includes a gate driver, a plurality of touch sensors, and a plurality of wirings. The plurality of wirings are respectively connected to the plurality of touch sensors. The gate driver has a function of supplying a scan signal to the plurality of wirings at the same timing. The plurality of touch sensors in different positions have a function of sensing a plurality of touches at the same timing.

One embodiment of the present invention is a display device that includes a display region and a gate driver. The display region includes a plurality of pixels, a plurality of touch sensors, a plurality of scan lines, and a plurality of touch wirings. The gate driver has a function of supplying a first scan signal to the plurality of scan lines. The gate driver has a function of supplying a second scan signal for sensing a touch to the plurality of touch wirings.

In the above display devices, it is preferable that the pixel include a first display element and the first display element be a transmissive liquid crystal element.

In the above display devices, it is preferable that the pixel include a first display element and the first display element be a reflective liquid crystal element.

In the above display device, the pixel preferably includes the first display element and a second display element. The first display element preferably has a function of reflecting visible light. The second display element preferably has a function of emitting visible light.

In the above display device, the second display element is preferably a light-emitting element.

The above display devices preferably include a transistor and the transistor preferably includes polysilicon in a semiconductor layer.

The above display devices preferably include a transistor and the transistor preferably includes a metal oxide in a semiconductor layer.

In the above display devices, an image is preferably displayed with one or both of first light reflected by the first display element and second light emitted by the second display element.

According to one embodiment of the present invention, a display device with improved operability in touch input can be provided. According to another embodiment of the present invention, a display device with a novel structure including a touch sensor can be provided. According to another embodiment of the present invention, an electronic device with reduced power consumption can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF DRAWINGS

FIGS. 23A-1, 23A-2, 23B-1, 23B-2, 23C-1, 23C-2, 23D-1, 23D-2, 23E-1, 23E-2, 23F-1, and 23F-2 are cross-sectional views and perspective views illustrating shapes of an optical element in a display device.

FIGS. 28A and 28B are TEM images of samples and FIGS. 28C to 28L are electron diffraction patterns thereof.

BEST MODE FOR CARRYING OUT THE INVENTION

Figure 1A:
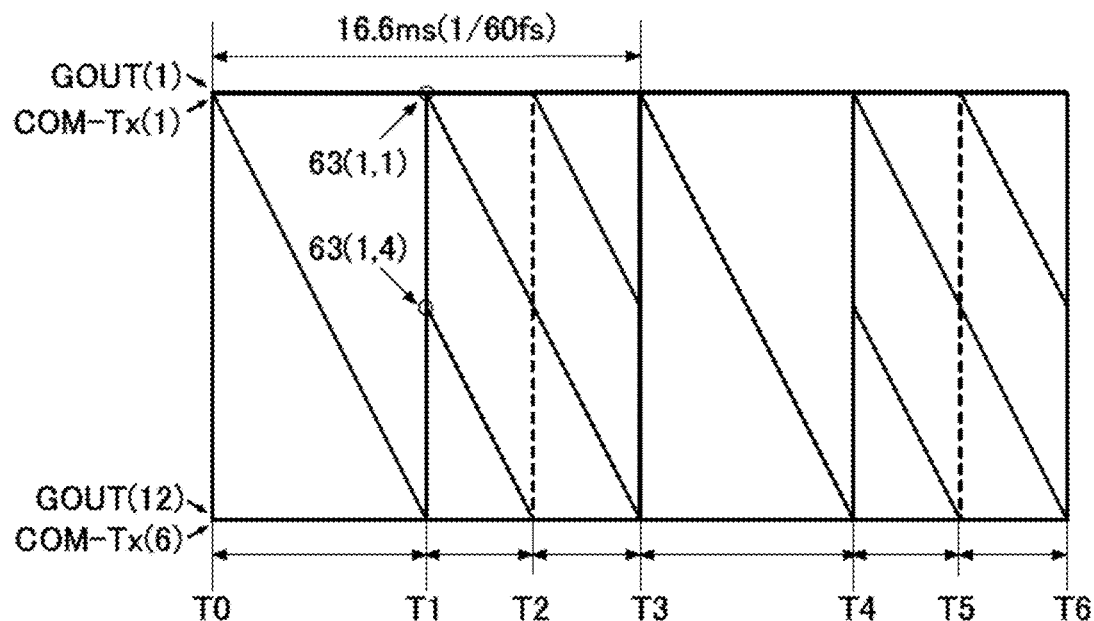
FIG. 1A illustrates driving timing of a touch sensor and FIG. 1B is a block diagram illustrating a display device.

Hereinafter, embodiments will be described with reference to drawings. Note that the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the channel region between the source region and the drain region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electrical signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of −0.5 V, and $1 \times 10^{-22}$ A at $V_{gs}$ of −0.8 V. The drain current of the transistor is $1 \times 10^{-19}$ A or lower at $V_{gs}$ of −0.5 V or at $V_{gs}$ in the range of −0.8 V to −0.5 V; therefore, it can be said that the off-state current of the transistor is $1 \times 10^{-19}$ A or lower. Since there is $V_{gs}$ at which the drain current of the transistor is $1 \times 10^{-22}$ A or lower, it may be said that the off-state current of the transistor is $1 \times 10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and "potential" and "voltage" are used as synonymous words in many cases. Therefore, in this specification, "potential" can be replaced with "voltage" and vice versa, unless otherwise specified.

Embodiment 1

In this embodiment, an in-cell touch sensor whose operability in touch sensing is improved is described with reference to FIGS. 1A and 1B, FIG. 2, FIG. 3, FIG. 4, FIGS. 5A to 5C, FIGS. 6A and 6B, FIGS. 7A and 7B, FIGS. 8A and 8B, and FIG. 9.

Figure 1B:
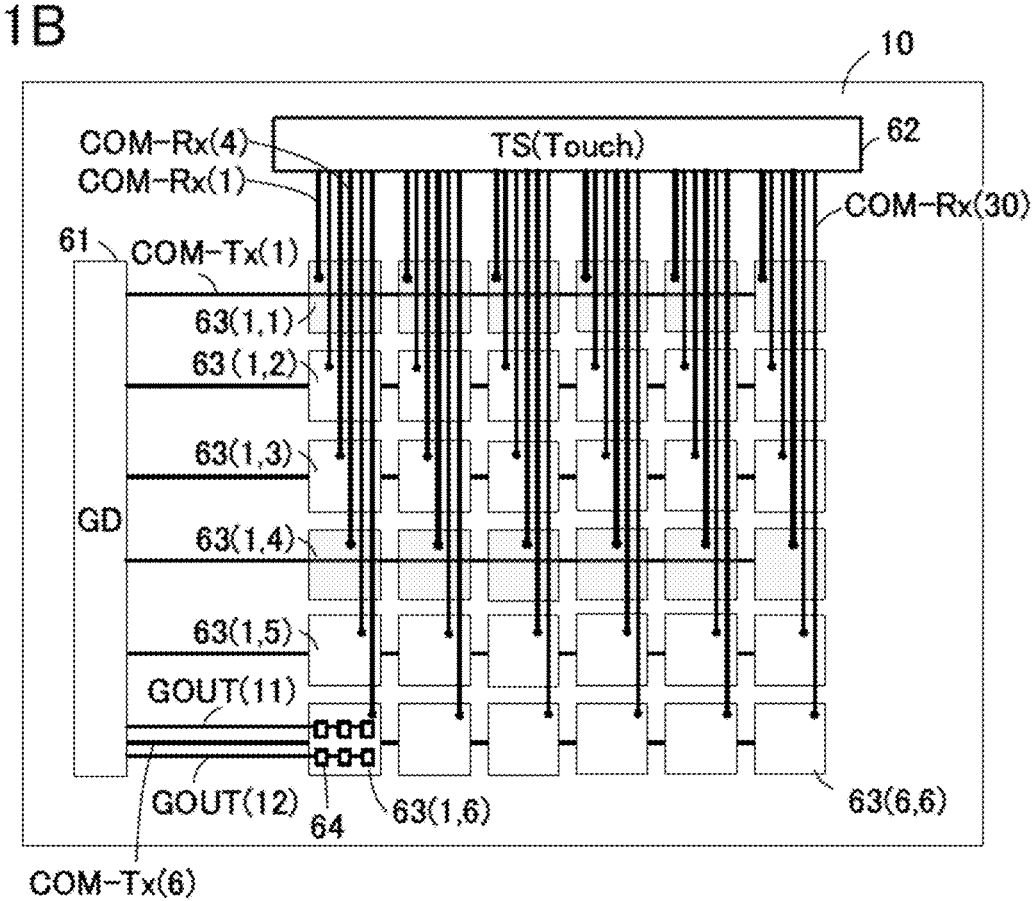

FIG. 1A illustrates driving timing of a display device 10 including a touch sensor. FIG. 1B is a block diagram of the display device 10. As an example, FIG. 1A illustrates displaying 60 frames in one second. One frame is a period in which all the data of pixels included in the display device are refreshed. One frame period is approximately 16.6 ms.

In FIG. 1A, one frame period includes a period T0-T1 in which display is refreshed and a period T1-T3 in which a touch by a sensing target is sensed with a touch sensor. The period T0-T1 in which display is refreshed and the period T1-T3 in which touch sensing is performed may have the same length or alternatively, the period T1-T3 in which touch sensing is performed may be longer than the period T0-T1 in which display is refreshed. Further alternatively, the period T0-T1 in which display is refreshed may be longer than the period T1-T3 in which touch sensing is performed. FIG. 1A illustrates an example in which the period T0-T1 in which display is refreshed and the period T1-T3 in which touch sensing is performed are controlled to have the same length.

FIG. 1A illustrates an example in which in one frame period T0-T3, display is refreshed in the period T0-T1 and touch sensing is performed in the rest period T1-T3. The period in which touch sensing is performed further includes two periods T1-T2 and T2-T3 in each of which touch sensing is performed. When the number of times of touch sensing is set to two or more, touch sensing accuracy can be increased. Note that touch sensing may be performed in only one period.

The touch sensing accuracy increases when one frame period includes a larger number of periods in which touch sensing is performed. In the example illustrated in FIG. 1A, a non-sensing period with a duration of approximately 8 ms and two sensing periods each with a duration of 4 ms are provided. When the number of periods in which touch sensing is performed is two or more, touch sensing accuracy can be increased.

The control signal supplied in refreshing display causes noise and sensing errors by the touch sensor occur; thus, in the period in which display is refreshed, touch sensing is preferably suspended. In addition, display is not refreshed in the period in which touch sensing is performed. It is thus preferable that a circuit for refreshing display not operate in the period in which touch sensing is performed. In addition, a selection transistor for retaining the data to be displayed preferably has a low leakage current in an off state. The pixels will be described in detail with reference to FIG. 3. The transistor with a low leakage current will be described in detail in Embodiment 4.

A touch sensor based on any of a variety of operation principles may be used, such as a projected capacitive touch sensor, a surface capacitive touch sensor, a resistive touch sensor, or an optical touch sensor. In any type of sensors, data is input when a sensing target touches or approaches the touch sensor. In an example in this embodiment, a projected capacitive touch sensor is used.

The display device 10 in FIG. 1B includes a gate driver 61 that drives the touch sensor and controls signal lines in the row direction, the receiver circuit 62 that senses a touch, and a plurality of touch sensors 63. The gate driver 61 is electrically connected to the touch sensors 63 and pixels 64. In the example illustrated in FIG. 1B, the pixels 64 are provided to overlap with the touch sensor 63(1,6).

The touch sensor 63 includes pixels, a touch wiring COM-Tx supplied with a scan signal for the touch sensor, and a touch wiring COM-Rx transmitting sensing of a touch as an electrical signal. To the pixels, which will be described in detail with reference to FIG. 3, a scan line for refreshing display, a signal line, and a wiring CSCOM are electrically connected. The details of the touch sensor 63 will be described with reference to FIG. 3. Although the touch sensors 63 are arranged in a 6×6 matrix in the example illustrated in FIG. 1B, the number of the touch sensors 63 can be set as appropriate.

Details of the driving timing illustrated in FIG. 1A will be described with reference to the block diagram in FIG. 1B. With the driving timing in the example illustrated in FIG. 1A, the touch sensor 63(1,1) and the touch sensor 63(1,4) concurrently perform touch sensing.

When the touch sensor 63(1,1) and the touch sensor 63(1,4) that are distanced perform sensing, the distance between the two touch sensors 63 prevents the interference of scan signals supplied at the same timing. Therefore, the two touch sensors 63 can perform touch sensing at the same timing.

The touch sensors provided in a display region can be scanned in one-half the time. In other words, the touch sensors can be scanned at a frequency twice the frequency in row-by-row scanning. Scan signals are supplied to the touch wirings COM-Tx in two rows at the same time in the example illustrated in FIGS. 1A and 1B; however, when a touch sensing region is wide, scan signals may be supplied to the touch wirings in three or more rows at the same time.

Figure 2:
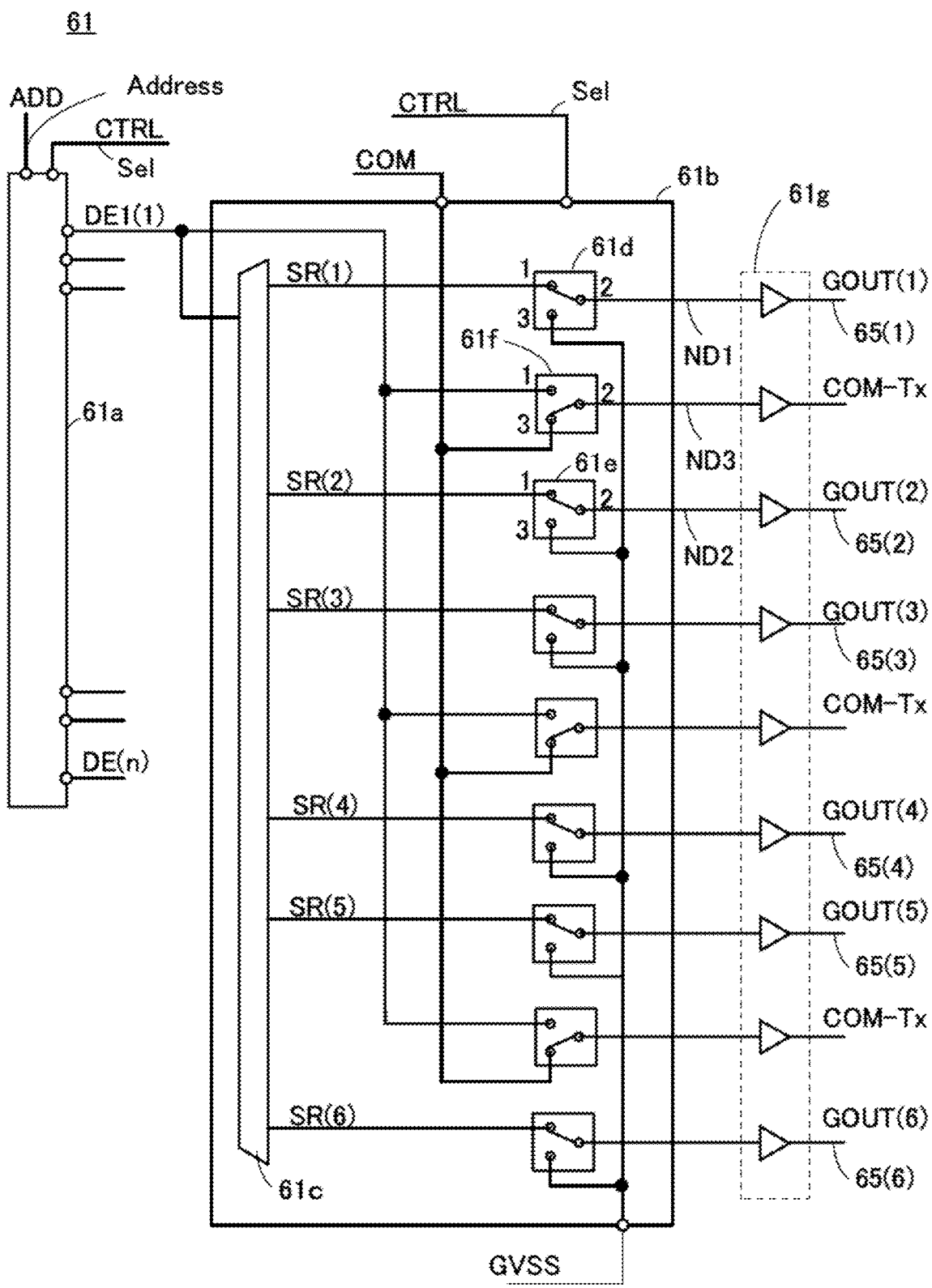
FIG. 2 is a block diagram illustrating a gate driver.

FIG. 2 illustrates the gate driver 61. The gate driver 61 has a function of supplying a scan signal for refreshing display to the scan line and a function of supplying a scan signal to be supplied to the touch sensor to the touch wiring. In the drawing, n represents an integer of one or more.

The gate driver 61 includes a decoder 61$a$, a plurality of selection circuits 61$b$, and a plurality of buffers 61$g$. The selection circuit 61$b$ includes a shift register 61$c$, a switch 61$d$, a switch 61$e$, and a switch 61$f$.

A terminal 2 of the switch 61$d$ is electrically connected to a scan line 65(1) through the buffer 61$g$. A terminal 2 of the switch 61$e$ is electrically connected to a scan line 65(2) through the buffer 61$g$. A terminal 2 of the switch 61$f$ is electrically connected to the touch wiring COM-Tx through the buffer 61$g$.

To the decoder 61$a$, a wiring ADD and a wiring CTRL are electrically connected. Output signals DE are generated from a signal Address that is supplied to the wiring ADD. It is preferable that a plurality of signals Address be supplied to a plurality of wirings ADD. Furthermore, a signal Sel that is supplied to the wiring CTRL allows switching between a scan signal for refreshing display and a scan signal for sensing a touch that are to be output. For example, "L" is supplied as the signal Sel to refresh display and "H" is supplied as the signal Sel to control the touch sensor, whereby the output signal DE can be used as different kinds of scan signals.

The selection circuit 61*b* can supply a plurality of scan signals GOUT to the scan lines through the buffer 61*g*. The number of scan lines electrically connected to the selection circuit 61*b* can be set appropriately in accordance with the number of pixels connected to one touch sensor 63.

The shift register 61*c* has a function of sequentially outputting signals SR(1) to SR(6) when "L" is supplied as the signal Sel.

When "L" is supplied as the signal Sel, a terminal 1 and the terminal 2 of the switch 61*d* are electrically connected to each other and the signal SR(1) is output to a wiring ND1. The signal supplied to the wiring ND1 is supplied to the scan line 65(1) as the scan signal GOUT(1) through the buffer 61*g*.

When "L" is supplied as the signal Sel, a terminal 1 and the terminal 2 of the switch 61*e* are electrically connected to each other and the signal SR(2) is output to a wiring ND2. The signal supplied to the wiring ND2 is supplied to the scan line 65(2) as the scan signal GOUT(2) through the buffer 61*g*.

When "L" is supplied as the signal Sel, a terminal 3 and the terminal 2 of the switch 61*f* are electrically connected to each other and a common potential supplied to a wiring COM can be supplied to the touch wiring COM-Tx through the buffer 61*g*.

When "H" is supplied as the signal Sel, a terminal 3 and the terminal 2 of the switch 61*d* are electrically connected to each other and an L1 potential, which is supplied to a wiring GVSS, is output to the wiring ND1. The L1 potential supplied to the wiring ND1 is supplied to the scan line 65(1) as the scan signal GOUT(1) through the buffer 61*g*. The L1 potential is the lowest potential to be supplied to the scan line.

When "H" is supplied as the signal Sel, a terminal 3 and the terminal 2 of the switch 61*e* are electrically connected to each other and the L1 potential, which is supplied to the wiring GVSS, is output to the wiring ND2. The L1 potential supplied to the wiring ND2 is supplied to the scan line 65(2) as the scan signal GOUT(2) through the buffer 61*g*.

When "H" is supplied as the signal Sel, a terminal 1 and the terminal 2 of the switch 61*f* are electrically connected to each other and the signal DE(1) is output to a wiring ND3. The signal supplied to the wiring ND3 can be supplied to the touch wiring COM-Tx as a scan signal through the buffer 61*g*.

The period in which the signal Sel is "H" is the period in which touch sensing is performed; the L1 potential is supplied to the scan lines and output of the decoder is supplied to the touch wiring COM-Tx as a scan signal.

Figure 3:
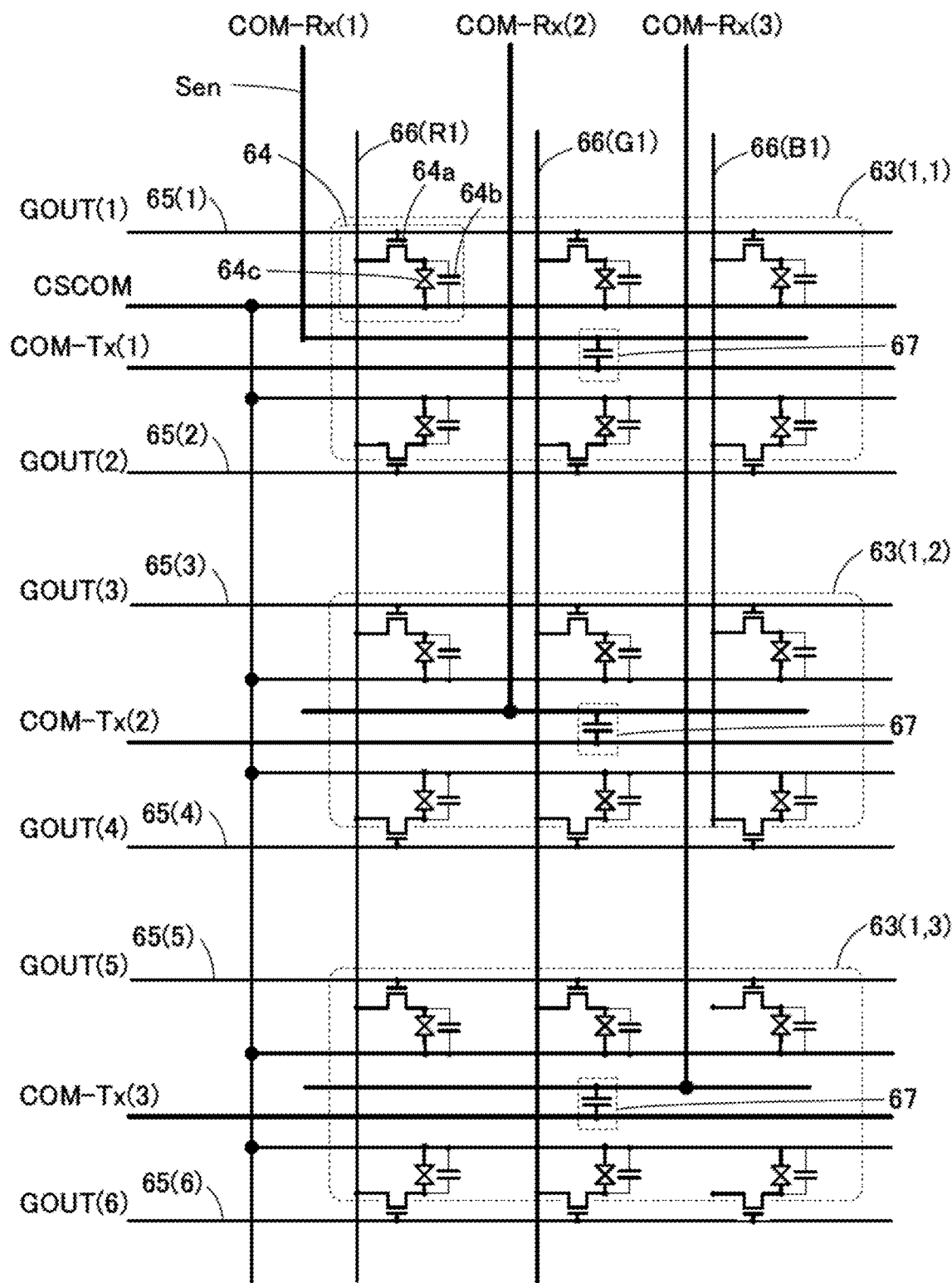
FIG. 3 is a circuit diagram illustrating touch sensors and pixels in a display device.

The touch sensor 63 illustrated in FIG. 3 includes a plurality of pixels 64. In the example illustrated in FIG. 3, one touch sensor 63 includes six pixels 64. When the gate driver 61 in FIG. 2 is used for control, the shift register 61*c* preferably has two stages.

Figure 7A:
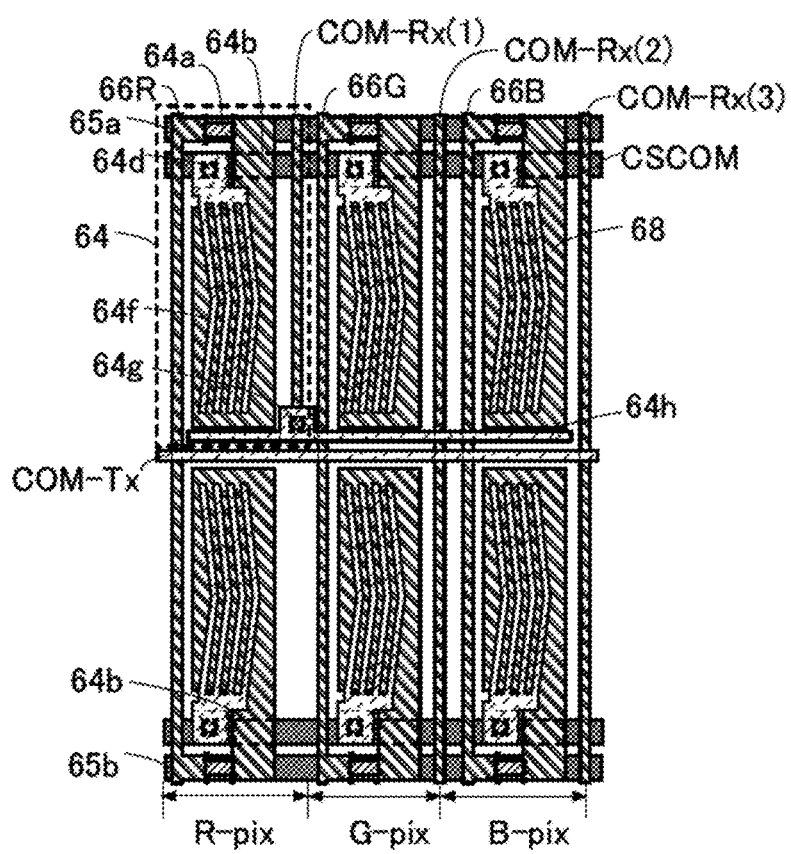
FIGS. 7A and 7B are top views each illustrating a structure of a touch sensor in a display device.
Figure 7B:
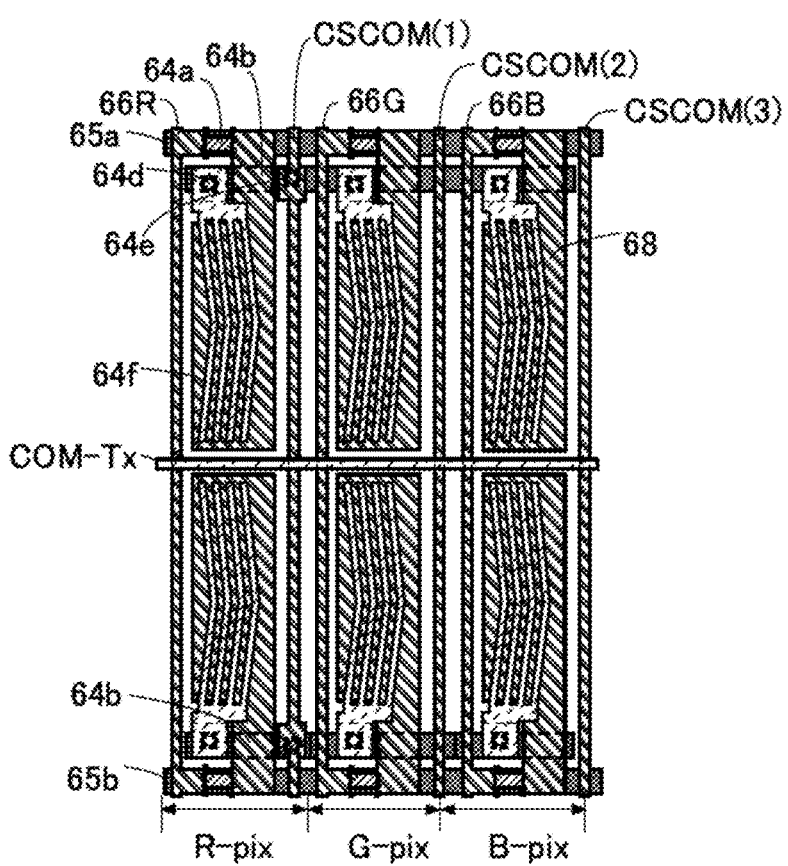

The pixel 64 includes a selection transistor 64*a*, a capacitor 64*b*, and a liquid crystal display element 64*c*. The liquid crystal display element 64*c* includes a pixel electrode 68 (which is illustrated in FIGS. 7A and 7B) and a liquid crystal whose alignment changes with the potential difference between the pixel electrode 68 and the wiring CSCOM.

Here, the touch sensor 63(1,1) is described as an example. A gate of the selection transistor 64*a* is electrically connected to the scan line 65(1). One of a source and a drain of the selection transistor 64*a* is electrically connected to a signal line 66. The pixel electrode 68 and one electrode of the capacitor 64*b* are electrically connected to the other of the source and the drain of the selection transistor 64*a*. The other electrode of the capacitor 64*b* is electrically connected to the wiring CSCOM.

The touch wiring COM-Rx(1) is provided in the touch sensor 63(1,1). The touch wiring COM-Rx(1) serves as one electrode of a sensor element of the touch sensor, and the touch wiring COM-Tx(1) serves as the other electrode of the sensor element of the touch sensor. Thus, in the touch sensor 63(1,1), a capacitor 67 the pair of electrodes of which are the touch wiring COM-Tx(1) and the touch wiring COM-Rx(1) is formed as the sensor element.

When the touch wiring COM-Tx and the touch wiring COM-Rx operate as part of the touch sensor 63, a scan signal is supplied to the touch wiring COM-Tx as illustrated in FIG. 2. Thus, whether or not touch operation is performed can be sensed in accordance with the amount of change in the electrical signal transmitted by the touch wiring COM-Rx. Accordingly, the touch sensors 63 can independently sense whether or not touch operation is performed.

With the configuration illustrated in FIG. 3, the touch sensor 63(1,1) and the touch sensor 63(1,4) can concurrently perform touch sensing as illustrated in FIG. 1B. Since one electrode of each sensor element is independent, the touch sensors do not affect each other. The touch sensor 63(1,1), the touch sensor 63(2,1), the touch sensor 63(3,4), and the touch sensor 63(4,4) can perform sensing concurrently, for example.

In this manner, the touch sensors 63 in a specific region can selectively perform sensing and thus the touch sensor function can be partly activated or deactivated in accordance with display when, for example, only part of display is refreshed.

A configuration different from that of the touch sensor 63 in FIG. 3 is described with reference to FIG. 4.

A difference is that the wiring CSCOM is electrically connected to a terminal 2 of a switch 61*h*. A terminal 1 of the switch 61*h* is electrically connected to the wiring COM. A terminal 3 of the switch 61*h* is electrically connected to the touch wiring COM-Rx.

The switch 61*h* is electrically connected to the wiring CTRL and is supplied with the signal Sel. In the period when the signal Sel is "L", the terminal 1 and the terminal 2 of the switch 61*h* are electrically connected to each other, so that the common potential supplied to the wiring COM is supplied to the wiring CSCOM. In the period when the signal Sel is "H", the terminal 2 and the terminal 3 of the switch 61*h* are electrically connected to each other, so that a sensing signal Sen of the wiring CSCOM is output to the touch wiring COM-Rx.

Thus, a common potential is supplied to the wiring CSCOM as a reference potential of the liquid crystal display element 64*c* when pixels perform display. When the wiring CSCOM operates as part of the touch sensor, the wiring CSCOM serves as one electrode of the sensor element of the touch sensor, and the touch wiring COM-Tx serves as the other electrode of the sensor element of the touch sensor.

As the sensor element of the touch sensor 63, the capacitor 67 the pair of electrodes of which are the touch wiring COM-Tx and the wiring CSCOM is formed. In the period in which the signal Sel is "L", a common potential is supplied to the touch wiring COM-Tx and the wiring CSCOM through the wiring COM, so that the capacitance of the capacitor 67 is cancelled; thus, display quality is not adversely affected.

In the period in which the signal Sel is "H", the wiring CSCOM functions as one electrode of the sensor element of the touch sensor; thus, the off-state current of the selection transistor 64*a* in the pixel 64 needs to be low.

When the touch wiring COM-Tx and the wiring CSCOM operate as part of the touch sensor, a scan signal is supplied to the touch wiring COM-Tx as illustrated in FIG. 2. The liquid crystal display element 64*c* expresses gray levels of display with the use of a liquid crystal whose alignment direction changes with the potential difference between the pixel electrode and the wiring CSCOM. It is thus preferable that the gray-level voltage held in the capacitor 64*b* not change. When the off-state current of the selection transistor 64*a* is low, leakage through the selection transistor 64*a* can be minimized. Even if the voltage value of the wiring CSCOM changes, a change in gray level can be minimized owing to the low off-state current of the selection transistor.

The gate driver 61 illustrated in FIG. 2 can control both display and touch sensing. The display and touch sensing can be controlled at different timings. Thus, the signal/noise ratio (SN ratio) of the touch sensor can be high, increasing the sensing accuracy.

Figure 5A:
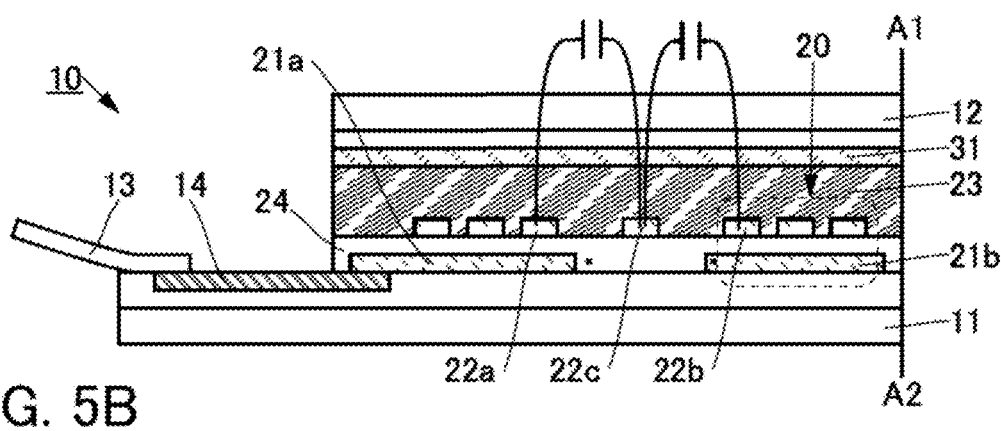
FIGS. 5A to 5C are schematic cross-sectional views each illustrating a mode employed in a display device.
Figure 5B:
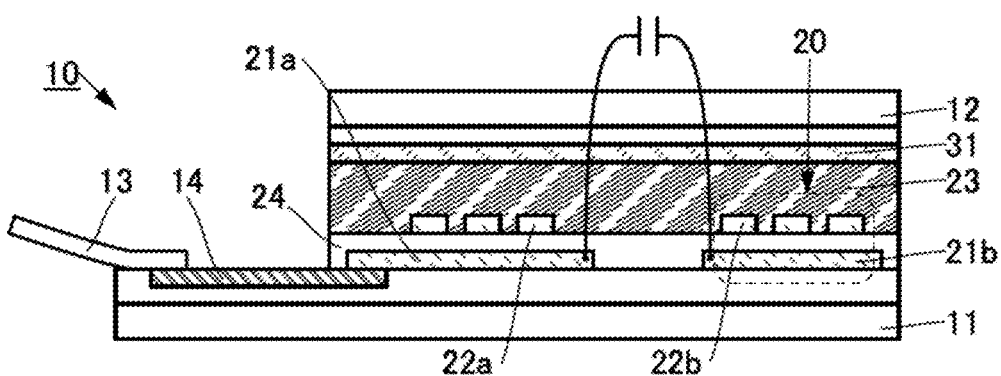
Figure 5C:
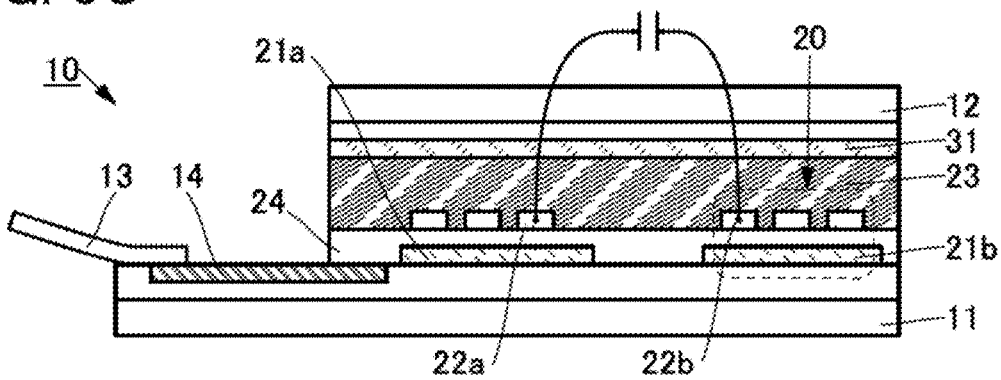

FIGS. 5A to 5C are schematic cross-sectional views each illustrating the touch sensor of the display device 10. Note that in the schematic cross-sectional views in FIGS. 5A to 5C, only the components necessary for describing the operation of the touch sensor are illustrated. For example, an element such as a transistor is sometimes provided over a substrate 11 but is not illustrated in the drawings.

The touch sensor illustrated in FIG. 5A includes the substrate 11, a substrate 12, an FPC 13, a conductive layer 14, a liquid crystal element 20, a coloring film 31, and the like.

The liquid crystal element 20 includes a conductive layer 21, a conductive layer 22, and a liquid crystal 23. The conductive layer 22 is positioned over the conductive layer 21 with an insulating layer 24 provided therebetween. The conductive layer 21 functions as a pixel electrode of the liquid crystal element 20 and the conductive layer 22 functions as a common electrode.

The conductive layer 21 and the conductive layer 22 are provided so as to form an electric field intersecting the thickness direction of the liquid crystal 23 (the A1-A2 direction in the drawing).

The touch sensor can perform sensing by utilizing the capacitance formed between the conductive layer 22*a* or 22*b* on the substrate 11 side that serves as one of a pair of electrodes of the liquid crystal element 20 and the conductive layer 22*c* serving as the touch wiring COM-Tx.

In the example illustrated in FIG. 5B, the conductive layers 21*a* and 21*b* serving as the pixel electrodes of the liquid crystal elements 20 also serve as the pair of electrodes of the touch sensor.

In the example illustrated in FIG. 5C, the conductive layers 22*a* and 22*b* serving as the common electrodes of the liquid crystal elements 20 also serve as the pair of electrodes of the touch sensor.

In the structure illustrated in FIG. 5A, one electrode of the liquid crystal element 20 can also serve as one electrode of the touch sensor. With the structure illustrated in FIG. 5B or 5C, one electrode of the liquid crystal element 20 can serve as the pair of electrodes of the touch sensor.

The conductive layer 22*a*, the conductive layer 22*b*, and the conductive layer 22*c* can be formed using one conductive layer, which simplifies the process. The conductive layer 21*a* and the conductive layer 21*b* can also be formed using one conductive layer, which simplifies the process.

Figure 6A:
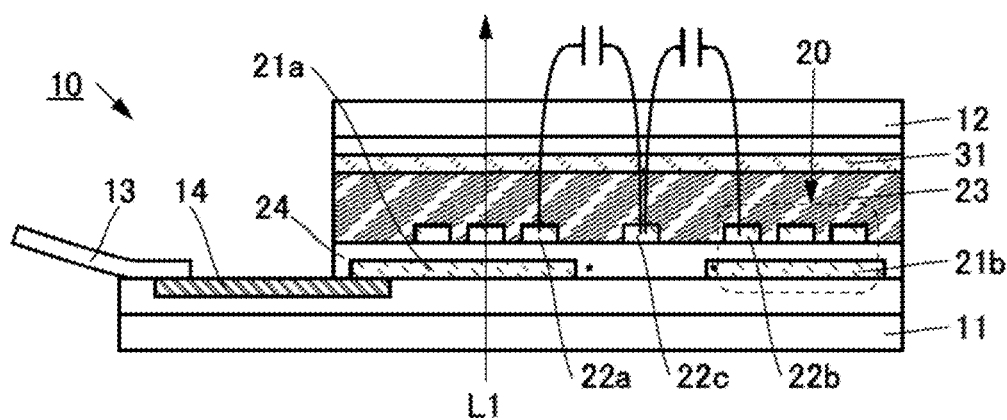
FIGS. 6A and 6B are schematic cross-sectional views each illustrating a mode employed in a display device.

The schematic cross-sectional view in FIG. 6A illustrates a light extraction method using FIG. 5A.

FIG. 6A illustrates an example in which the conductive layer 21 and the conductive layer 22 are formed using light-transmitting conductive layers. In that case, the display device 10 preferably includes a light source emitting visible light L1, under the substrate 11. The visible light L1 incident through the substrate 11 can be emitted toward the substrate 12 after the gray level of the light is controlled with the liquid crystal element sandwiched between the substrate 11 and the substrate 12.

Figure 6B:
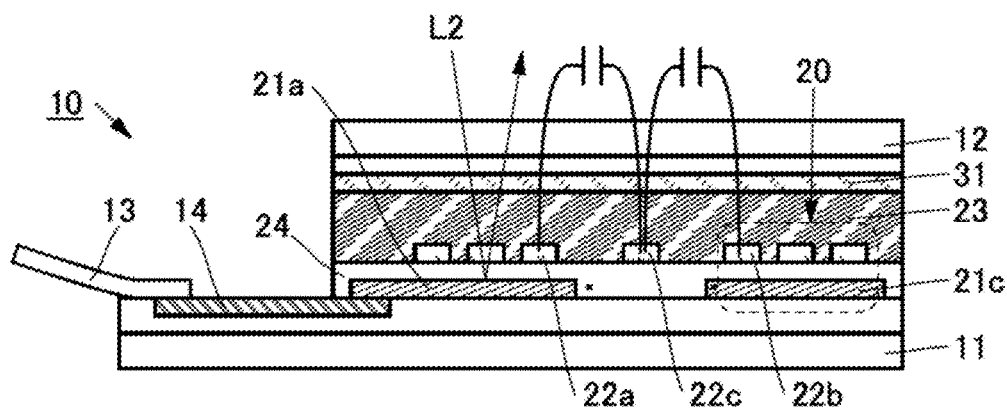

The structure illustrated in FIG. 6B is different from that illustrated in FIG. 6A in that the conductive layer 21 is formed using a conductive layer that reflects visible light. Accordingly, light L2 incident through the substrate 12 is reflected by the conductive layer 21 to be emitted to the outside through the substrate 12.

When utilizing external light, display can be performed without a light source unlike in the display device illustrated in FIG. 6A. As a result, the number of components of the display device can be reduced. Furthermore, there is no power consumed by a light source. In a bright environment such as an environment under sunlight, the luminance of the reflected light increases in proportion to the luminance of the external light, which increases the viewability.

The conductive layer reflecting visible light preferably has high reflectance. High reflectance leads to high luminance at the time of reflective display using external light.

For example, a material containing one of indium (In), zinc (Zn), and tin (Sn) is preferably used for the conductive material that transmits visible light. Specifically, indium oxide, indium tin oxide, indium zinc oxide, indium oxide containing tungsten oxide, indium zinc oxide containing tungsten oxide, indium oxide containing titanium oxide, indium tin oxide containing titanium oxide, indium tin oxide containing silicon oxide, zinc oxide, and zinc oxide containing gallium are given, for example. Note that a film including graphene can be used as well. The film including graphene can be formed, for example, by reducing a film containing graphene oxide.

Examples of a conductive material that reflects visible light include aluminum, silver, and an alloy including any of these metal elements. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (also referred to as Ag—Pd—Cu or APC), or an alloy of silver and magnesium may be used.

FIG. 7A is a top view of the touch sensor 63 illustrated in FIG. 3. The touch sensor 63 including six pixels 64 is described using the example illustrated in FIG. 3. The touch sensor 63 may include a plurality of pixels 64 and the number of the pixels 64 is not limited. The top view in FIG. 7A illustrates an example in which an R element, a G element, and a B element (the coloring film 31 in FIGS. 5A to 5C) are provided in a stripe shape.

The structure illustrated in FIG. 7A includes a plurality of scan lines 65, a plurality of signal lines 66, the wiring CSCOM, the touch wiring COM-Tx, the touch wiring COM-Rx, and a plurality of pixels 64. Each of the pixels 64 includes the selection transistor 64a, the capacitor 64b, and the pixel electrode 68.

As an example, the pixel 64 connected to a scan line 65a is described. The gate of the selection transistor 64a in the pixel 64 is electrically connected to the scan line 65a. One of the source and the drain of the selection transistor 64a is electrically connected to the signal line 66R. Furthermore, one electrode of the capacitor 64b is formed using the same conductive layer as the other of the source and the drain of the selection transistor 64a. The capacitor 64b is formed in a region overlapping with the wiring CSCOM. The pixel electrode 68 is formed using the same conductive layer as the other of the source and the drain of the selection transistor 64a.

The other electrode of the capacitor 64b is electrically connected to a common electrode 64f through a contact 64d. The gray level of display is controlled by the liquid crystal whose alignment direction changes with the potential difference between the pixel electrode 68 and the common electrode 64f. Therefore, the liquid crystal 23 is provided over the common electrode 64f as illustrated in FIG. 5A.

The touch wiring COM-Rx is electrically connected to a wiring 64h through a contact 64g. In the touch sensor 63, the capacitor 67 with a sensing function is formed with the wiring 64h and the touch wiring COM-Tx serving as a pair of electrodes. Thus, the touch wiring COM-Tx and the touch wiring COM-Rx are preferably formed using the same conductive layer.

Although the touch wiring COM-Rx(2) and the touch wiring COM-Rx(3) are illustrated in FIG. 7A, they are electrically connected to a touch sensor provided in a position different from that of the touch sensor 63 illustrated in FIG. 7A. The touch wiring COM-Rx may be provided as appropriate and as needed depending on the number of the pixels 64 in the touch sensor 63. Accordingly, when the touch sensor 63 includes many pixels 64, the touch wiring COM-Rx(2) and the touch wiring COM-Rx(3) illustrated in FIG. 7A are not necessarily provided.

The sensitivity of the touch sensor 63 can be controlled by changing the size of the capacitor 67 having the sensing function. Since the number of pixels in the touch sensor 63 and the size of the capacitor 67 are proportional to each other, the number of the pixels 64 and the number of the touch wirings COM-Tx can be selected as appropriate such that the size of the capacitor 67 is optimized.

Figure 4:
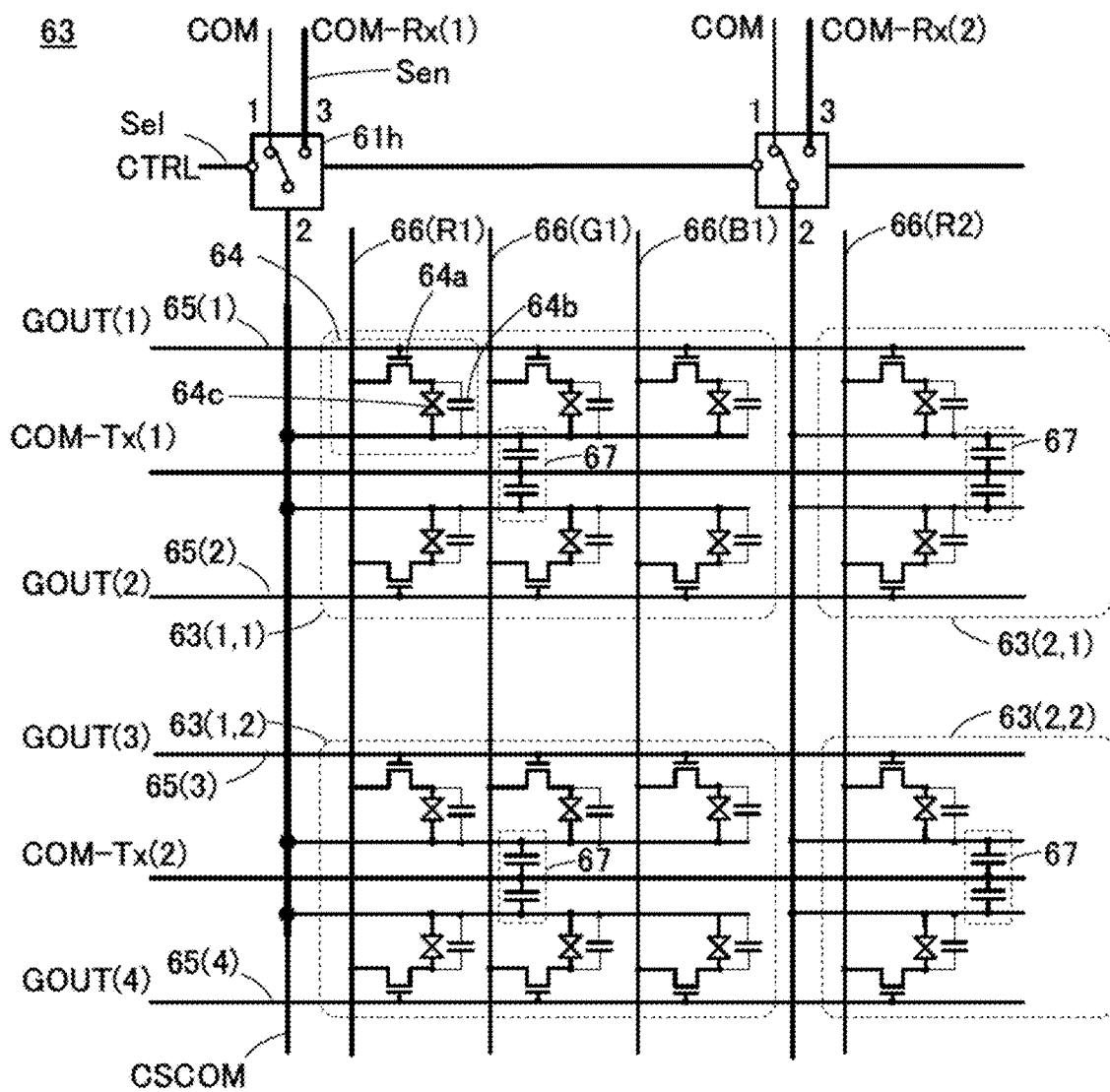
FIG. 4 is a circuit diagram illustrating touch sensors and pixels in a display device.

FIG. 7B is a top view of the touch sensor 63 illustrated in FIG. 4. A structure different from that in FIG. 7A is described.

The structure illustrated in FIG. 7B includes the plurality of scan lines 65, the plurality of signal lines 66, a plurality of wirings CSCOM, the touch wiring COM-Tx, and the plurality of pixels 64. Each of the pixels 64 includes the selection transistor 64a, the capacitor 64b, and the pixel electrode 68.

A difference is that one electrode of the capacitor 64b is electrically connected to the wiring CSCOM(1) through a contact 64e. The wiring CSCOM(1) serves as a common electrode in each of the pixels 64 in the touch sensor 63.

Although the wiring CSCOM(2) and the wiring CSCOM(3) are illustrated in FIG. 7B, they are electrically connected to a touch sensor provided in a position different from that of the touch sensor 63 illustrated in FIG. 7B. The wiring CSCOM may be provided as needed depending on the number of the pixels 64 in the touch sensor 63. Accordingly, when the touch sensor 63 includes many pixels 64, the wiring CSCOM(2) and the wiring CSCOM(3) illustrated in FIG. 7B are not necessarily provided.

The touch wiring COM-Tx is equidistant from the common electrodes 64f of the pixels. The capacitor 67 having a sensing function is formed with the touch wiring COM-Tx and the common electrode 64f serving as a pair of electrodes. Thus, the touch wiring COM-Tx and the common electrode 64f are preferably formed using the same conductive layer.

<Cross-Sectional Structure of Display Device>

A cross-sectional structure of a display device functioning as an in-cell touch panel is described as an example. As typical examples of the in-cell touch panel, a hybrid in-cell type and a full-in-cell type can be given. A cross-sectional structure of a full-in-cell touch panel using a liquid crystal element as a display element is described below. The full-in-cell touch panel using a liquid crystal element as a display element functions as a liquid crystal display device.

In the case of a liquid crystal display device functioning as a full-in-cell touch panel, a structure of a counter substrate can be simplified, which is preferable. The liquid crystal display device is preferable because an electrode constituting a part of the display element also serves as an electrode constituting a part of the sensor element and thus the manufacturing process can be simplified and the manufacturing cost can be reduced.

Figure 8A:
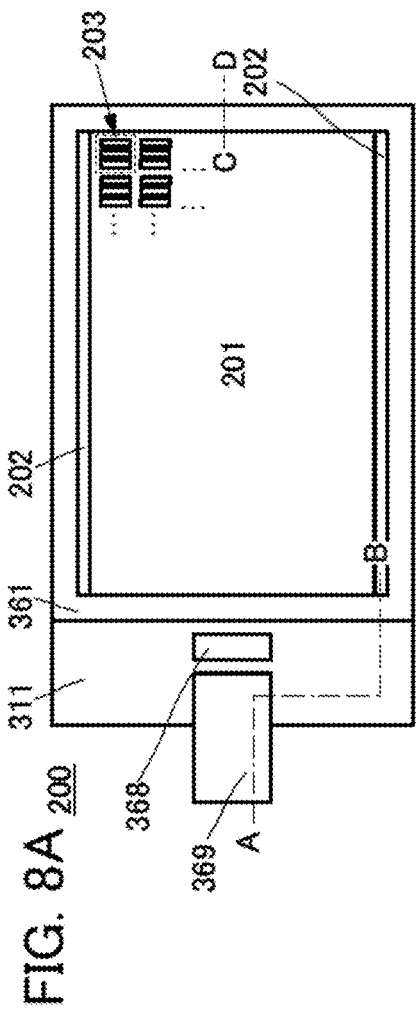
FIGS. 8A and 8B are a top view and a schematic cross-sectional view of a display device.
Figure 8B:
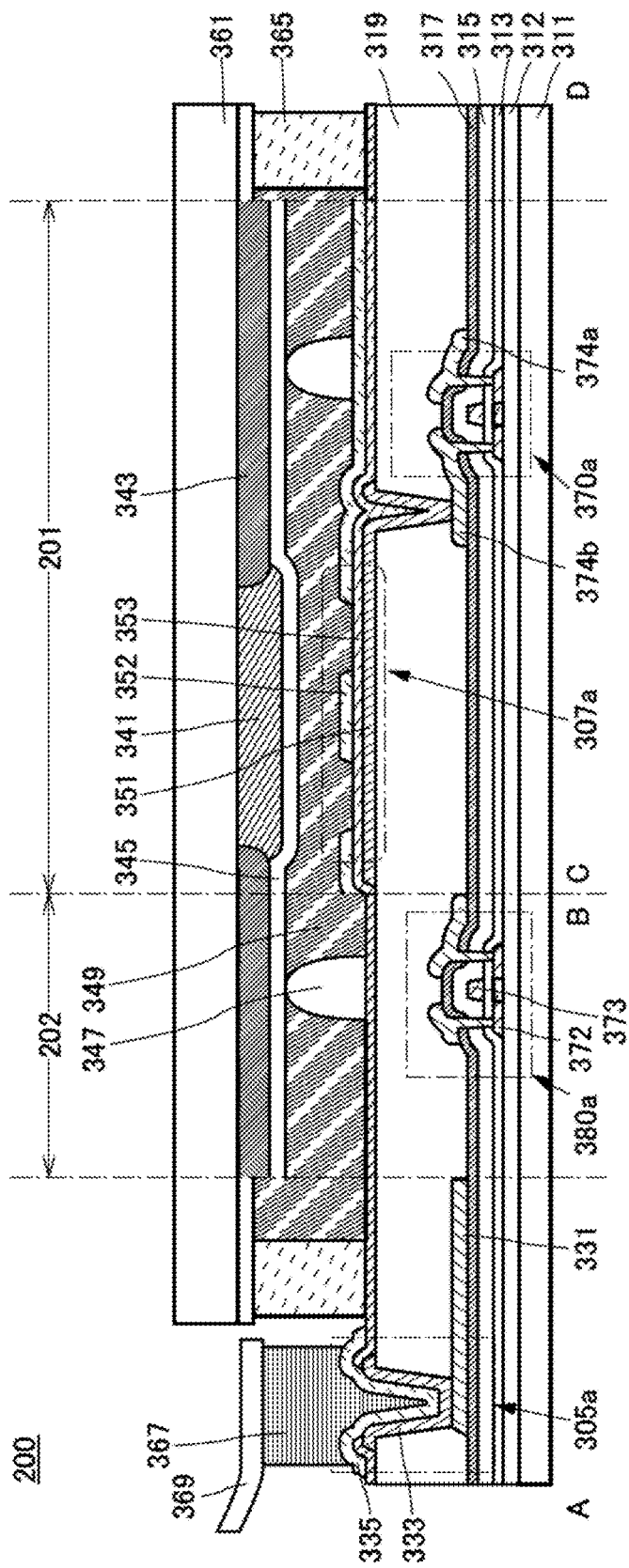

FIG. 8A is a top view of a liquid crystal display device 200 that can function as a touch panel. FIG. 8B is a cross-sectional view taken along dashed-dotted lines A-B and C-D in FIG. 8A.

As illustrated in FIG. 8A, the liquid crystal display device 200 includes a display portion 201 and gate line driver circuits 202. The display portion 201 includes a plurality of pixels 203, a plurality of source lines, and a plurality of gate lines, and has a function of displaying an image. Moreover, the display portion 201 also serves as an input portion. That is, the display portion includes a plurality of sensor elements that can sense touch or proximity of a sensing target to the liquid crystal display device 200 and thus serves as a touch sensor. The gate line driver circuit 202 has a function of outputting a scan signal to the gate lines included in the display portion 201. The pixel 203 includes a plurality of subpixels. Although FIG. 8A illustrates an example in which the pixel 203 includes three subpixels, one embodiment of the present invention is not limited to this example.

Although FIG. 8A illustrates an example in which the liquid crystal display device 200 includes the gate line driver circuits, one embodiment of the present invention is not limited to this example. The liquid crystal display device 200 that does not include any of a gate line driver circuit, a source line driver circuit, and a sensor driver circuit may be employed, or the liquid crystal display device 200 that includes any one or more of a gate line driver circuit, a source line driver circuit, and a sensor driver circuit may be employed.

In the liquid crystal display device 200, an IC 368 is mounted on a substrate 311 by a COG method or the like. The IC 368 includes, for example, any one or more of a source line driver circuit, a gate line driver circuit, and a sensor driver circuit.

An FPC 369 is connected to the liquid crystal display device 200. The IC 368 and the gate line driver circuits are supplied with a signal from the outside via the FPC 369. Furthermore, a signal can be output from the IC 368 to the outside via the FPC 369.

An IC may be mounted on the FPC 369. For example, an IC including any one or more of a source line driver circuit, a gate line driver circuit, and a sensor driver circuit may be mounted on the FPC 369. For example, the IC may be mounted on the FPC 369 by a COF method or a tape automated bonding (TAB) method.

For example, the IC 368 may include a source line driver circuit and a sensor driver circuit. Alternatively, for example, the IC 368 may include a source line driver circuit and the IC mounted on the FPC 369 may include a sensor driver circuit.

As illustrated in FIG. 8B, the liquid crystal display device 200 includes a transistor 380*a*, a transistor 370*a*, a connection portion 305*a*, a liquid crystal element 307*a*, and the like over the substrate 311.

FIG. 8B illustrates the cross section of one subpixel as an example of the display portion 201. For example, a subpixel exhibiting a red color, a subpixel exhibiting a green color, and a subpixel exhibiting a blue color form one pixel, and thus full-color display can be achieved in the display portion 201. Note that the color exhibited by subpixels is not limited to red, green, and blue. For example, a subpixel exhibiting white, yellow, magenta, cyan, or the like may be used for a pixel.

The transistors 380*a* and 370*a* each include a conductive layer 373, an insulating layer 312, an insulating layer 315, an insulating layer 313, a polysilicon film 372, a conductive layer 374*a*, and a conductive layer 374*b*.

The conductive layer 373 can function as a gate or a back gate. The conductive layer 374*a* can function as one of a source electrode and a drain electrode. The conductive layer 374*b* can function as the other of the source electrode and the drain electrode.

The polysilicon film 372 includes an impurity region that is formed by adding an impurity element. The polysilicon film 372 may include a lightly doped drain (LDD) region that is formed by adding an impurity element at a low concentration.

As the polysilicon film 372, a semiconductor film having a crystal structure is used, which is formed in such a manner that an amorphous silicon film is formed by a sputtering method, an LPCVD method, a plasma CVD method, or the like, and then the amorphous silicon film is crystallized by crystallization treatment (a laser crystallization method, a thermal crystallization method, a thermal crystallization method using a catalyst such as nickel, or the like).

The transistors 380*a* and 370*a* each include the polysilicon film as a semiconductor layer. A transistor including a polysilicon film can have a higher field-effect mobility and thus have higher on-state current than a transistor including amorphous silicon. Consequently, a circuit capable of high-speed operation can be obtained. Furthermore, the area occupied by a circuit portion can be reduced.

The transistors 380*a* and 370*a* are covered with an insulating layer 317 and an insulating layer 319. Note that the insulating layers 317 and 319 can be regarded as the components of the transistors 380*a* and 370*a*.

The liquid crystal element 307*a* is a liquid crystal element having a fringe field switching (FFS) mode. The liquid crystal element 307*a* includes a conductive layer 351, a conductive film layer 352, and a liquid crystal 349. Alignment of the liquid crystal 349 can be controlled with an electric field generated between the conductive layers 351 and 352. The conductive layer 351 can serve as a pixel electrode. The conductive layer 352 can serve as a common electrode.

When a conductive material that transmits visible light is used for the conductive layers 351 and 352, the liquid crystal display device 200 can serve as a transmissive liquid crystal display device. When a conductive material that reflects visible light is used for the conductive layer 351 and a conductive material that transmits visible light is used for the conductive layer 352, the liquid crystal display device 200 can serve as a reflective liquid crystal display device.

The conductive layer 351 serving as a pixel electrode is electrically connected to a source or a drain of the transistor 370*a*. Here, the conductive layer 351 is electrically connected to the conductive layer 374*b*.

The conductive layer 352 has a comb-like top surface shape or a top surface shape provided with a slit (a top surface shape is also referred to as a planar surface shape). An insulating layer 353 is provided between the conductive layers 351 and 352. The conductive layer 351 partly overlaps with the conductive layer 352 with the insulating layer 353 interposed therebetween. In a region where a coloring film 341 overlaps with the conductive layer 351, there is a portion where the conductive layer 352 is not provided over the conductive layer 351.

The connection portion 305*a* is electrically connected to an external input terminal through which a signal (e.g., a video signal, a clock signal, a start signal, and a reset signal) or a potential from the outside is transmitted to the gate line driver circuit 202. An example in which the FPC 369 is provided as an external input terminal is shown here.

The connection portion 305*a* includes a conductive layer 331 over the insulating layer 313, a conductive layer 333 over the conductive layer 331, and a conductive layer 335 over the conductive layer 333. The conductive layer 331 is electrically connected to the conductive layer 335 via the conductive layer 333. The conductive layer 335 is electrically connected to the FPC 369 via a connector 367.

The conductive layer 331 can be formed using the same material and the same step as those of the conductive layer 374*a* and the conductive layer 374*b* included in the transistors 380*a* and 370*a*. The conductive layer 333 can be formed using the same material and the same step as those of the conductive layer 351 included in the liquid crystal element 307*a*. The conductive layer 335 can be formed using the same material and the same step as those of the conductive layer 352 included in the liquid crystal element 307*a*. It is preferable to form the conductive layers included in the connection portion 305*a* using the same materials and the same steps as an electrode or a wiring used for a display portion or a driver circuit portion in such a manner because an increase in number of steps can be prevented.

A substrate 361 is provided with the coloring film 341, a light-blocking film 343, and an insulating layer 345. FIG. 8B illustrates an example in which the substrate 361 has a smaller thickness than the substrate 311; however, one embodiment of the present invention is not limited to this example. One of the substrates 361 and 311 may be thinner than the other, or the substrates 361 and 311 may have the same thickness. It is preferable to make the substrate on the display surface side (the side near a sensing target) thin because the sensitivity of a sensor element can be increased.

The coloring film 341 partly overlaps with the liquid crystal element 307*a*. The light-blocking film 343 partly overlaps with at least one of the transistors 380*a* and 370*a*.

The insulating layer 345 preferably has a function of an overcoat preventing impurities contained in the coloring film 341, the light-blocking film 343, and the like from diffusing into the liquid crystal 349. The insulating layer 345 is not necessarily provided.

Note that alignment films may be provided on sides of the substrates 311 and 361 which are in contact with the liquid crystal 349. The alignment film can control the alignment of the liquid crystal 349. For example, in FIG. 8B, an alignment film may be formed to cover the conductive layer 352 or may be formed between the insulating layer 345 and the liquid crystal 349. The insulating layer 345 may serve as an alignment film and an overcoat.

The liquid crystal display device 200 includes a spacer 347. The spacer 347 has a function of preventing the distance between the substrate 311 and the substrate 361 from being shorter than or equal to a certain distance.

FIG. 8B illustrates an example in which the spacer 347 is provided over the insulating layer 353 and the conductive layer 352; however, one embodiment of the present invention is not limited thereto. The spacer 347 may be provided on the substrate 311 side or on the substrate 361 side. For example, the spacer 347 may be formed on the insulating layer 345. Moreover, although FIG. 8B illustrates an example in which the spacer 347 is in contact with the insulating layers 353 and 345, the spacer 347 is not necessarily in contact with a component provided on the substrate 311 side or on the substrate 361 side.

A particulate spacer may be used as the spacer 347. Although a material such as silica can be used for the particulate spacer, an elastic material such as a resin or rubber is preferably used. In that case, the particulate spacer may be vertically crushed.

The substrates 311 and 361 are attached to each other with a bonding layer 365. A region surrounded by the substrate 311, the substrate 361, and the bonding layer 365 is filled with the liquid crystal 349.

Note that when the liquid crystal display device 200 serves as a transmissive liquid crystal display device, two polarizing plates are provided so that a display portion is sandwiched between the two polarizing plates. Light from a backlight provided outside the polarizing plate enters through the polarizing plate. At this time, the alignment of the liquid crystal 349 is controlled with a voltage applied between the conductive layers 351 and 352, whereby optical modulation of light can be controlled. In other words, the intensity of light emitted through the polarizing plate can be controlled. Light excluding light in a particular wavelength range is absorbed by the coloring film 341, so that red, blue, or green light is emitted.

In addition to the polarizing plate, a circularly polarizing plate can be used, for example. As the circularly polarizing plate, for example, a stack including a linear polarizing plate and a quarter-wave retardation plate can be used. With the circularly polarizing plate, the viewing angle dependence of display of the liquid crystal display device can be reduced.

Note that the liquid crystal element 307a is an element using an FFS mode here; however, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned microcell (ASM) mode, an optically compensated birefringence (OCB) mode, a ferroelectric liquid crystal (FLC) mode, an antiferroelectric liquid crystal (AFLC) mode, a vertical alignment in-plane-switching (VA-IPS) mode, or the like can be used.

Furthermore, a normally black liquid crystal display device, for example, a transmissive liquid crystal display device using a vertical alignment (VA) mode, may be used as the liquid crystal display device 200. As a vertical alignment mode, a multi-domain vertical alignment (MVA) mode, a patterned vertical alignment (PVA) mode, or an ASV mode can be employed, for example.

Note that the liquid crystal element is an element that controls transmission or non-transmission of light by utilizing an optical modulation action of liquid crystal. Note that optical modulation action of a liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a blue phase, a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode and design to be used.

A substrate with which a sensing target, such as a finger or a stylus, is to be in contact may be provided above the substrate 361. In that case, a polarizing plate or a circularly polarizing plate is preferably provided between the substrate 361 and the above substrate. In that case, a protective layer (such as a ceramic coat) is preferably provided over the above substrate. The protective layer can be formed using an inorganic insulating material such as silicon oxide, aluminum oxide, yttrium oxide, or yttria-stabilized zirconia (YSZ). Alternatively, tempered glass may be used for the substrate. Physical or chemical processing by an ion exchange method, a wind tempering method, or the like is performed on the tempered glass, so that compressive stress is applied on the surface.

Figure 9:
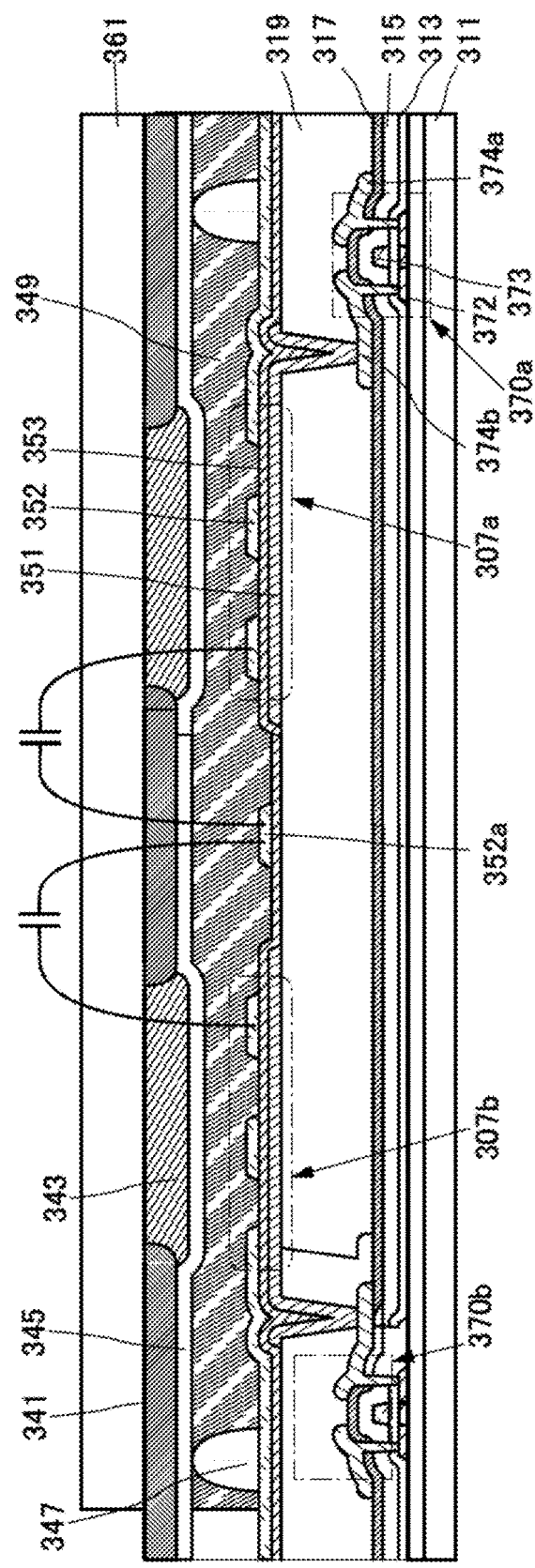
FIG. 9 is a schematic cross-sectional view of a display device.

FIG. 9 is a cross-sectional view of two adjacent subpixels. Two subpixels illustrated in FIG. 9 are included in respective pixels.

In FIG. 9, proximity, touch, or the like of a sensing target can be sensed by utilizing capacitance formed between the conductive layer 352 of a liquid crystal element 307b included in a subpixel and a wiring 352a and capacitance formed between the conductive layer 352 of the liquid crystal element 307a included in an adjacent subpixel and the wiring 352a. The wiring 352a is positioned between the two conductive layers 352. That is, in the liquid crystal display device of one embodiment of the present invention, the conductive layer 352 serves as a common electrode of the liquid crystal element and an electrode of the sensor element.

As described above, an electrode included in the liquid crystal element also serves as an electrode included in the sensor element in the liquid crystal display device of one embodiment of the present invention; thus, the manufacturing process can be simplified and the manufacturing cost can be reduced. In addition, the thickness and weight of the liquid crystal display device can be reduced.

When the capacitance between the electrode of the sensor element and a signal line is too large, the time constant of the electrode of the sensor element becomes too large in some cases. Thus, an insulating layer having a planarizing function is preferably provided between the electrode of the sensor element and the transistors to reduce the capacitance between the electrode of the sensor element and the signal line. For example, in FIG. 9, as the insulating layer having a planarizing function, the insulating layer 319 is provided. With the insulating layer 319, the capacitance between the conductive layer 352 and the signal line can be small. Accordingly, the time constant of the electrode of the sensor element can be small. As described above, the smaller the time constant of the electrode of the sensor element is, the higher the sensitivity and the sensing accuracy are.

For example, the time constant of the electrode of the sensor element is greater than 0 seconds and smaller than or equal to $1\times10^{-4}$ seconds, preferably greater than 0 seconds and smaller than or equal to $5\times10^{-5}$ seconds, more preferably greater than 0 seconds and smaller than or equal to $5\times10^{-6}$ seconds, more preferably greater than 0 seconds and smaller than or equal to $5\times10^{-7}$ seconds, more preferably greater than 0 seconds and smaller than or equal to $2\times10^{-7}$ seconds. In particular, when the time constant is smaller than or equal to $1\times10^{-6}$ seconds, high sensitivity can be achieved while the influence of noise is reduced.

Next, the details of the materials and the like that can be used for components of the liquid crystal display device of this embodiment are described.

<<Substrate>>

There is no particular limitation on a material and the like of the substrates included in the liquid crystal display device 200 as long as the material has heat resistance high enough to withstand at least heat treatment performed later. For example, a glass substrate, a ceramic substrate, a quartz substrate, a sapphire substrate, or the like may be used as the substrates. Alternatively, a single crystal semiconductor substrate or a polycrystalline semiconductor substrate made of silicon or silicon carbide, a compound semiconductor substrate made of silicon germanium or the like, an SOI substrate, or the like may be used. Still alternatively, any of these substrates provided with a semiconductor element may be used as the substrates 311 and 361. In the case where a glass substrate is used as the substrates 311 and 361, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Alternatively, a flexible substrate may be used as the substrates 311 and 361, and the transistor, the capacitor, and the like may be formed directly on the flexible substrate.

The weight and thickness of the liquid crystal display device can be reduced by using a thin substrate. Furthermore, a flexible liquid crystal display device can be obtained by using a substrate that is thin enough to have flexibility.

Other than the above, a transistor can be formed using various substrates as the substrates 311 and 361. The type of a substrate is not limited to a certain type. Examples of the substrate include a plastic substrate, a metal substrate, a stainless steel substrate, a substrate including stainless steel foil, a tungsten substrate, a substrate including tungsten foil, a flexible substrate, an attachment film, paper including a fibrous material, and a base film. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, polyvinyl chloride, and the like. Examples of the material for the base film include polyester, polyamide, polyimide, inorganic vapor deposition film, and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Note that a transistor may be formed using one substrate, and then the transistor may be transferred to another substrate. Examples of a substrate to which a transistor is transferred include, in addition to the above substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability or high heat resistance can be provided, or reduction in weight or thickness can be achieved.

<<Transistor Using Polysilicon Film>>

The structure of the transistors in the liquid crystal display device of one embodiment of the present invention is not particularly limited. For example, a planar transistor, a staggered transistor, or an inverted staggered transistor may be used. A top-gate transistor or a bottom-gate transistor may be used. Gate electrodes may be provided above and below a channel.

Transistors including polysilicon films can form various functional circuits, such as a shift register circuit, a level shifter circuit, a buffer circuit, and a sampling circuit, because of their high field-effect mobility.

<<Insulating Layer>>

An organic insulating material or an inorganic insulating material can be used as an insulating material that can be used for the insulating layer, the overcoat, the spacer, or the like included in the liquid crystal display device. Examples of a resin include an acrylic resin, an epoxy resin, a polyimide resin, a polyamide resin, a polyamide-imide resin, a siloxane resin, a benzocyclobutene-based resin, and a phenol resin. Examples of an inorganic insulating layer include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

<<Conductive Layer>>

For the conductive layer such as the gate, the source, and the drain of a transistor and the wiring, the electrode, and the like of the liquid crystal display device, a single-layer structure or a stacked structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film, a two-layer structure in which a titanium film is stacked over a tungsten film, a two-layer structure in which a copper film is stacked over a molybdenum film, a two-layer structure in which a copper film is stacked over an alloy film containing molybdenum and tungsten, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. For example, in the case where the conductive layer has a three-layer structure, it is preferable that each of the first and third layers be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. A light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used.

Note that the conductive layer may be formed using a method for controlling the resistivity of an oxide semiconductor.

The structure and method described in this embodiment can be implemented by being combined as appropriate with any of the other structures and methods described in the other embodiments.

Embodiment 2

In this embodiment, the structure of a display device of one embodiment of the present invention will be described with reference to FIGS. 10A to 10D, FIGS. 11A and 11B, FIGS. 12A and 12B, FIGS. 13A and 13B, FIGS. 14A and 14B, FIGS. 15A to 15C, FIGS. 16A to 16C, FIG. 17, FIGS. 18A and 18B, FIG. 19, FIGS. 20A to 20D, FIGS. 21A to 21C, FIGS. 22A and 22B, FIGS. 23A-1, 23A-2, 23B-1, 23B-2, 23C-1, 23C-2, 23D-1, 23D-2, 23E-1, 23E-2, 23F-1, and 23F-2, and FIGS. 24A to 24C.

Figure 10A:
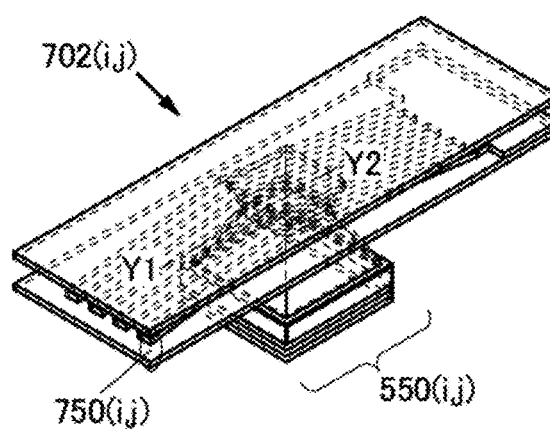
FIGS. 10A to 10D are schematic views illustrating a structure of a pixel in a display device.
Figure 10B:
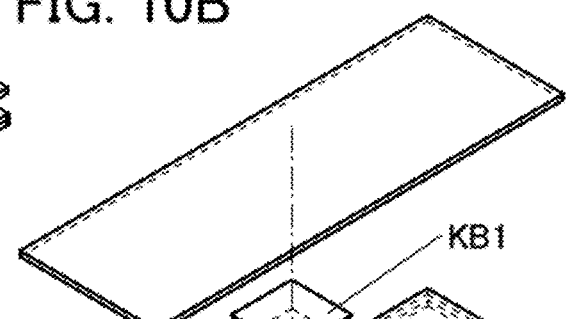
Figure 10C:
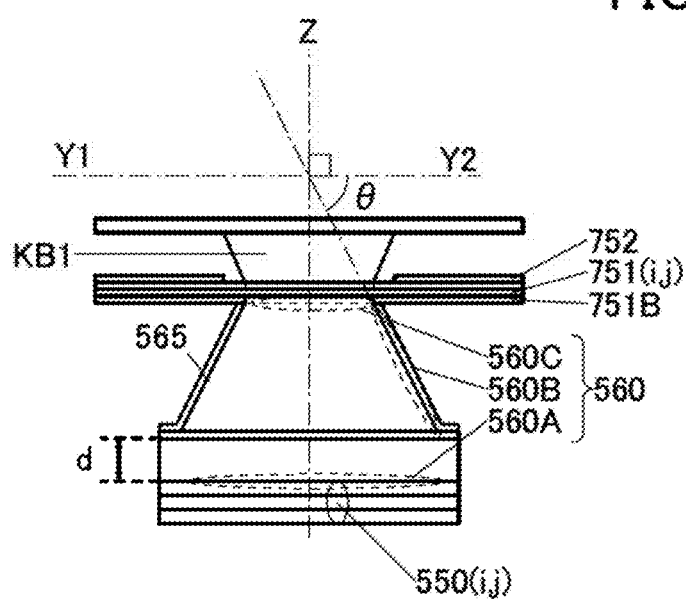
Figure 10D:
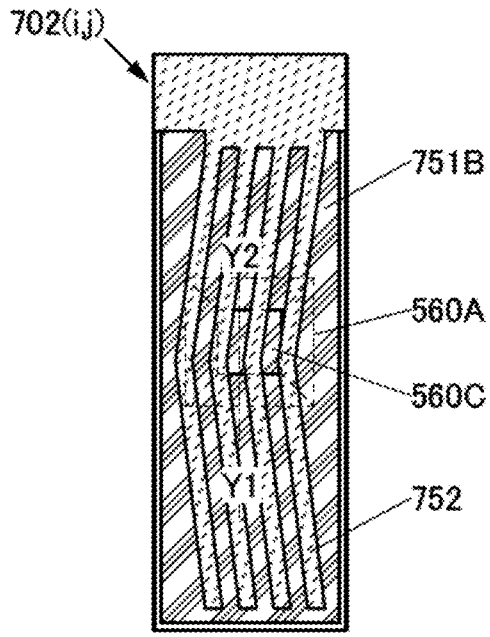

FIGS. 10A to 10D illustrate the structure of the display device of one embodiment of the present invention. FIG. 10A is a projection view of a pixel, and FIG. 10B is an exploded view illustrating part of the structure of the pixel in FIG. 10A. FIG. 10C is a cross-sectional view that is taken along line Y1-Y2 in FIG. 10A and illustrates part of the structure of the pixel. FIG. 10D is a top view of the pixel in FIG. 10A.

Figure 11A:
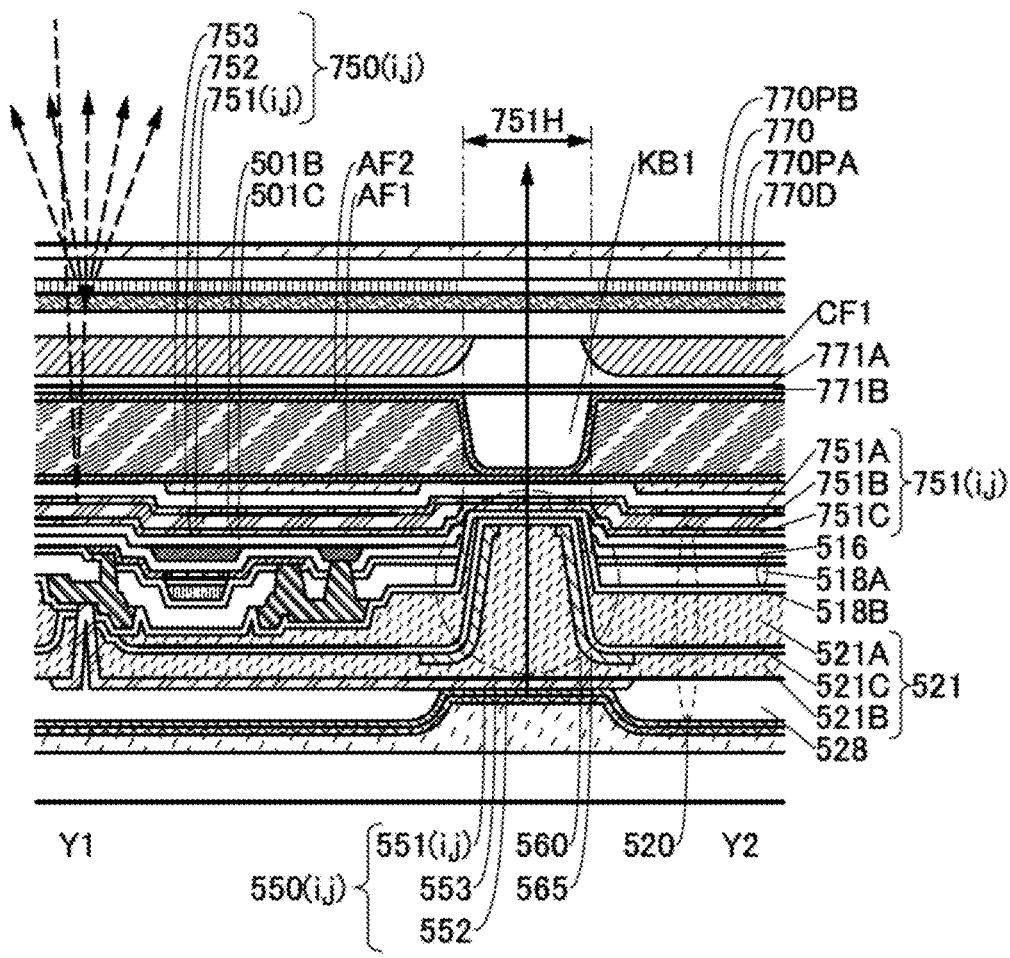
FIGS. 11A and 11B are cross-sectional views illustrating a structure of a pixel in a display device.
Figure 11B:
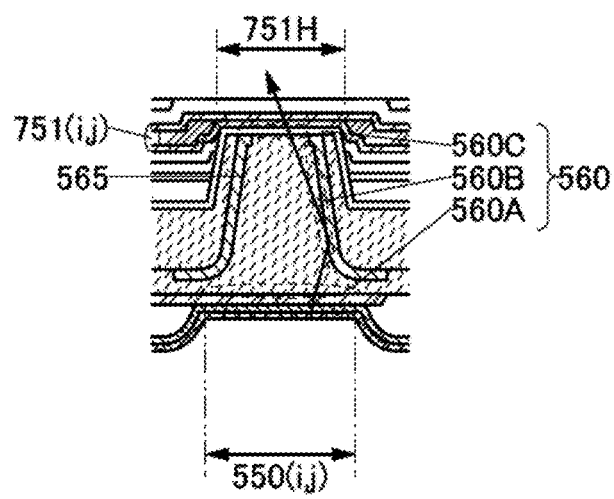

FIGS. 11A and 11B illustrate the structure of the display device of one embodiment of the present invention. FIG. 11A is a cross-sectional view of the pixel taken along line Y1-Y2 in FIG. 10A. FIG. 11B is a cross-sectional view illustrating part of the structure of the pixel in FIG. 11A.

Figure 12A:
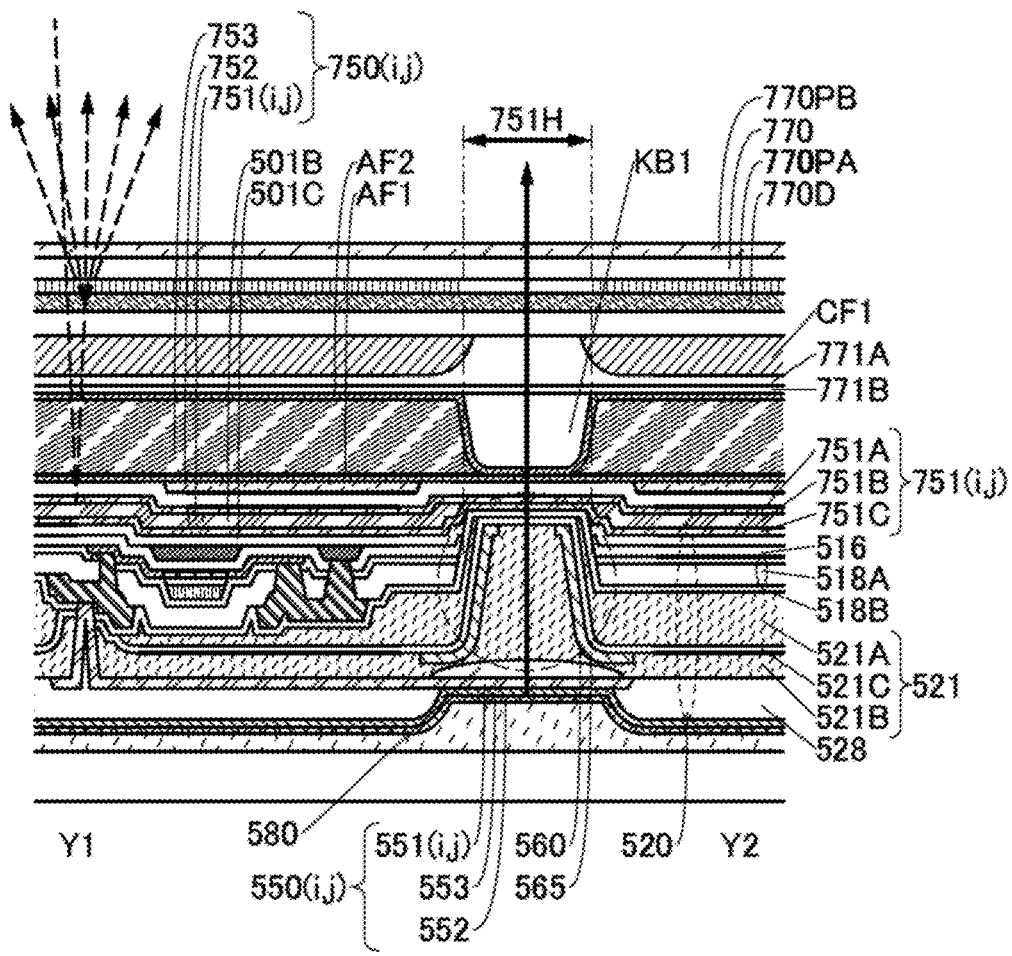
FIGS. 12A and 12B are cross-sectional views illustrating a structure of a pixel in a display device.
Figure 12B:
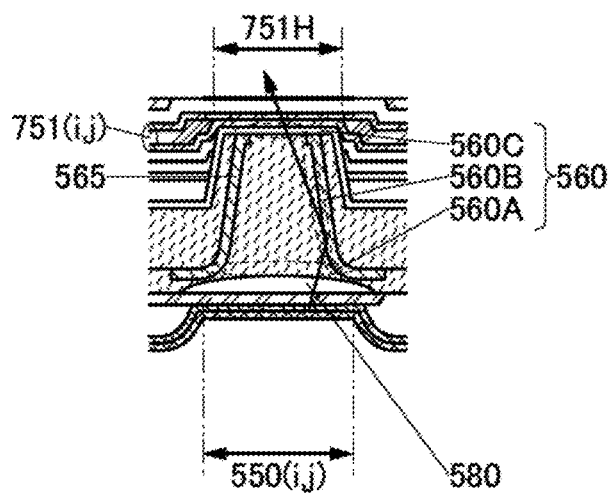

FIGS. 12A and 12B illustrate the structure of the display device of one embodiment of the present invention. FIG. 12A is a cross-sectional view of the pixel, which corresponds to the cross-sectional view taken along line Y1-Y2 in FIG. 10A. FIG. 12B is a cross-sectional view illustrating part of the structure of the pixel in FIG. 12A.

Figure 13A:
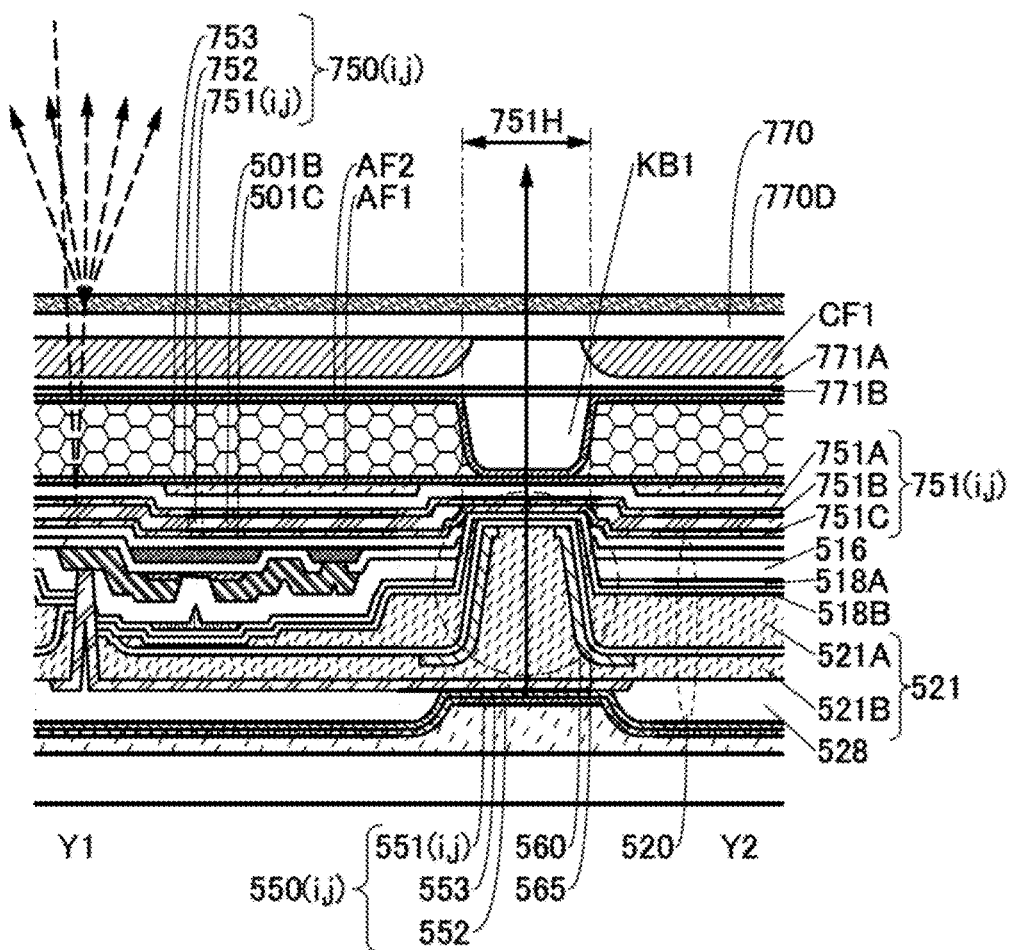
FIGS. 13A and 13B are cross-sectional views illustrating a structure of a pixel in a display device.
Figure 13B:
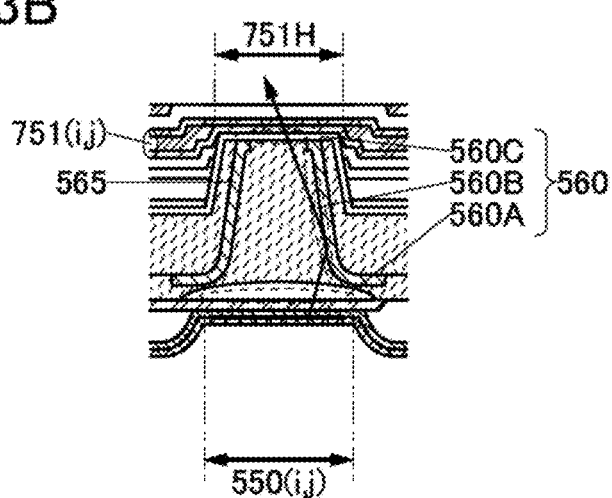

FIGS. 13A and 13B illustrate the structure of the display device of one embodiment of the present invention. FIG. 13A is a cross-sectional view of the pixel, which corresponds to the cross-sectional view taken along line Y1-Y2 in FIG. 10A. FIG. 13B is a cross-sectional view illustrating part of the structure of the pixel in FIG. 13A.

Figure 14A:
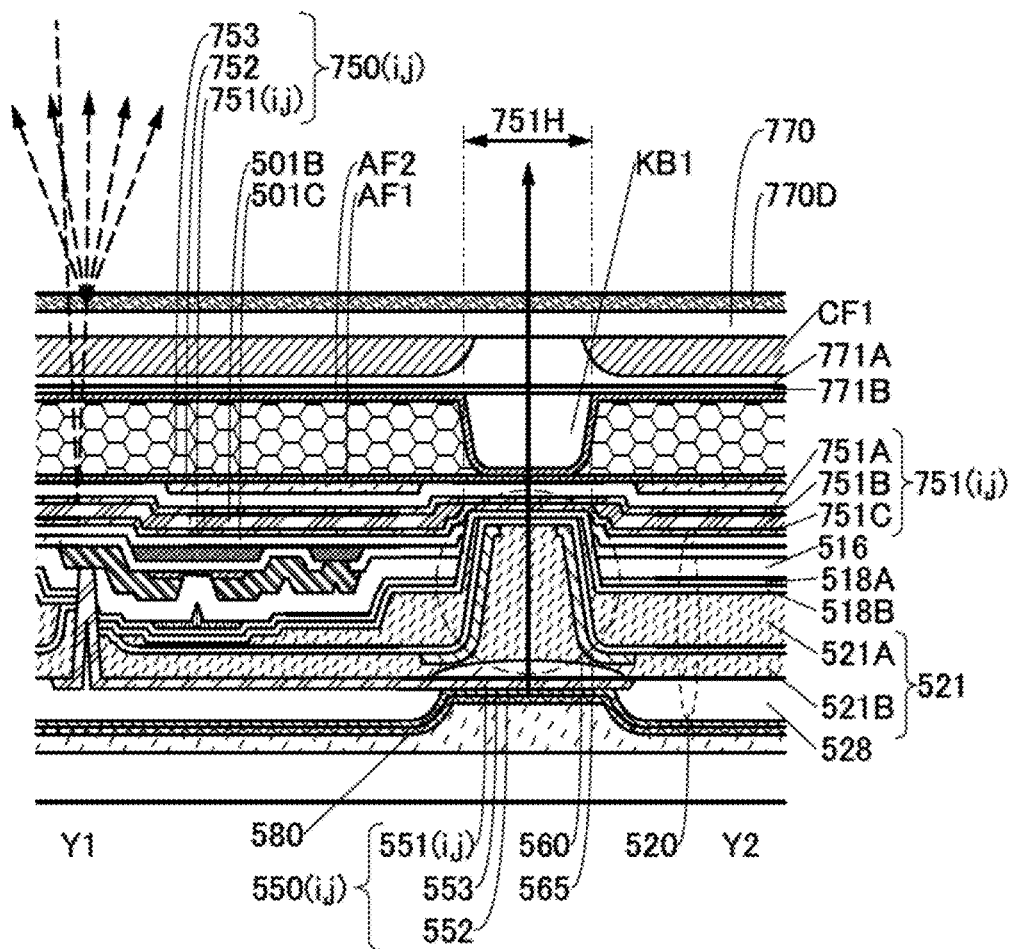
FIGS. 14A and 14B are cross-sectional views illustrating a structure of a pixel in a display device.
Figure 14B:
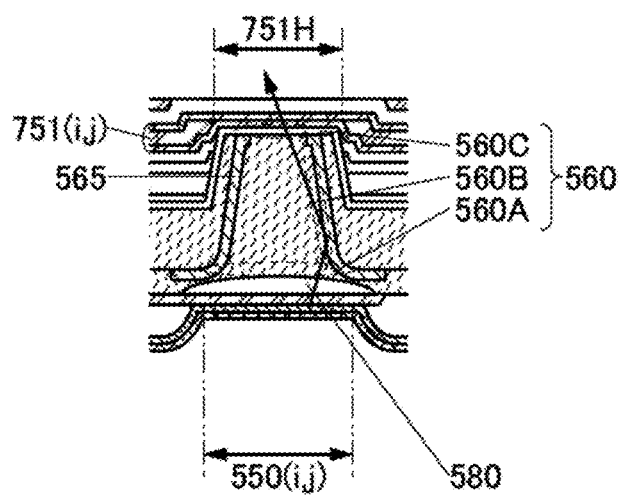

FIGS. 14A and 14B illustrate the structure of the display device of one embodiment of the present invention. FIG. 14A is a cross-sectional view of the pixel, which corresponds to the cross-sectional view taken along line Y1-Y2 in FIG. 10A. FIG. 14B is a cross-sectional view illustrating part of the structure of the pixel in FIG. 14A.

Figure 15A:
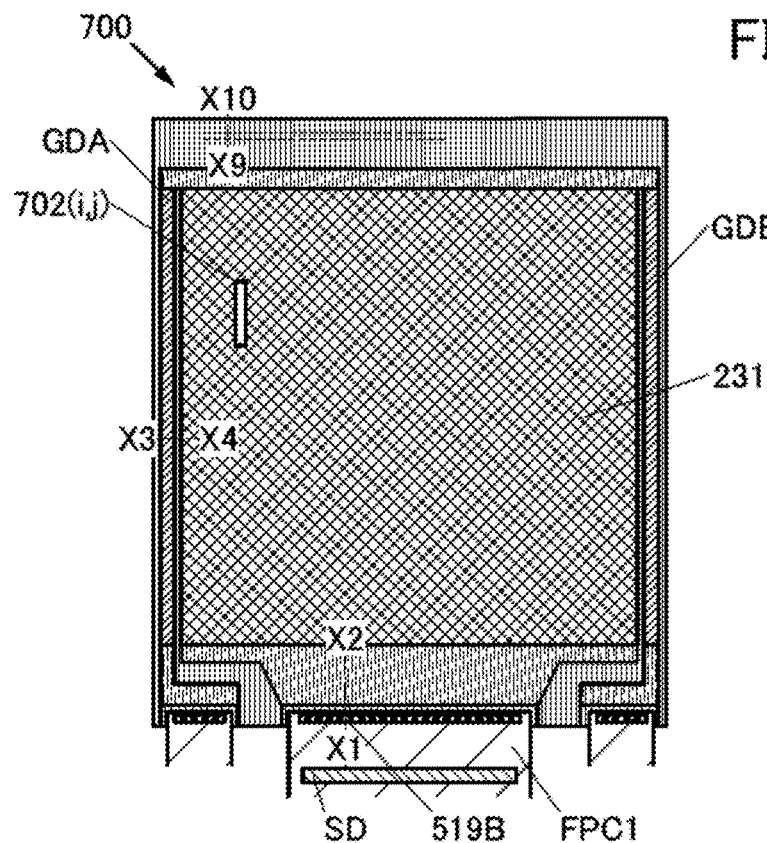
FIGS. 15A to 15C are top views and a cross-sectional view illustrating a structure of a display device.
Figure 15B:
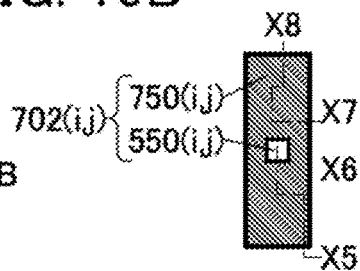
Figure 15C:
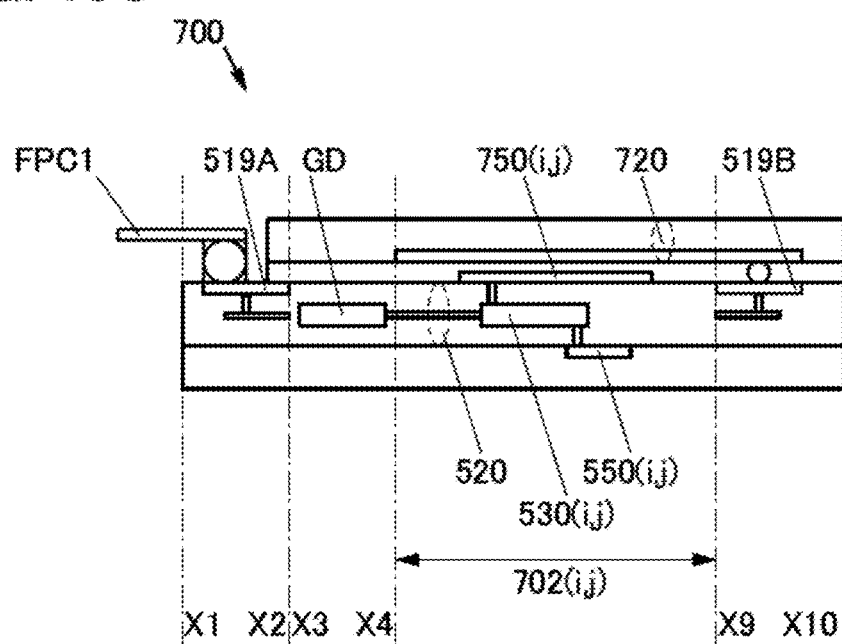

FIGS. 15A to 15C illustrate the structure of the display device of one embodiment of the present invention. FIG. 15A is a top view of the display device. FIG. 15B is a top view illustrating part of the pixel of the display device in FIG. 15A. FIG. 15C is a schematic view illustrating a cross-sectional structure of the display device in FIG. 15A.

Figure 16A:
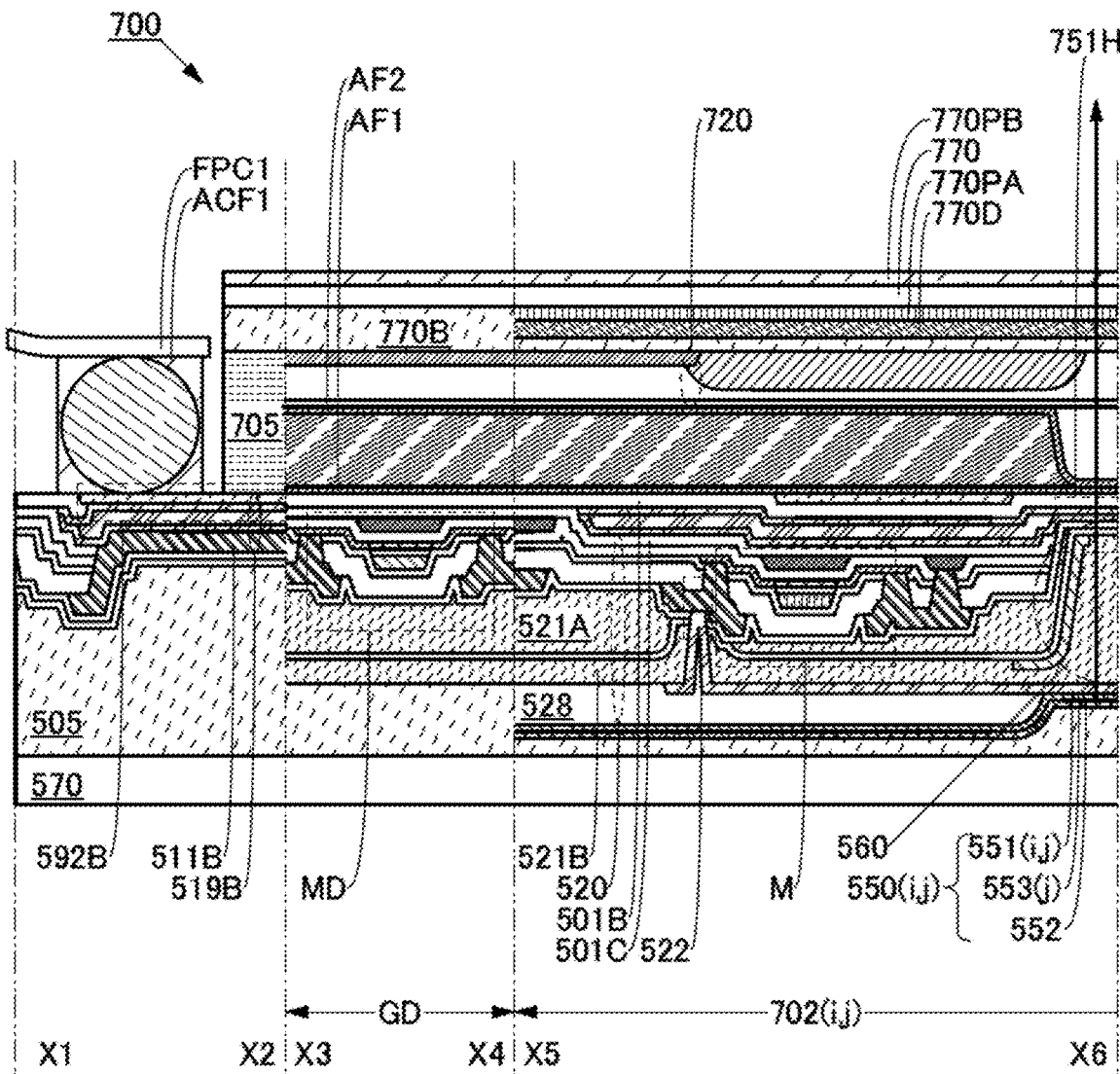
FIGS. 16A to 16C are cross-sectional views illustrating a structure of a display device.
Figure 16B:
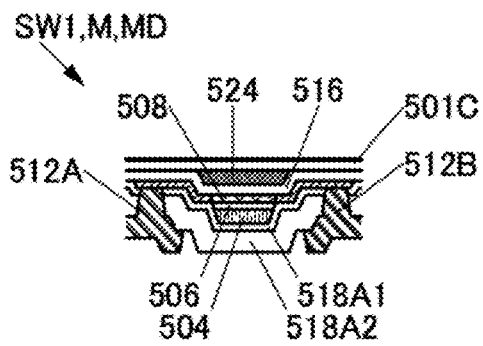
Figure 16C:
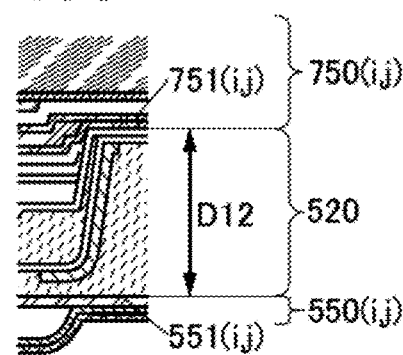

FIGS. 16A to 16C and FIG. 17 are cross-sectional views illustrating the structure of the display device. FIG. 16A is a cross-sectional view taken along line X1-X2 and line X3-X4 in FIG. 15A, and line X5-X6 in FIG. 15B. FIGS. 16B and 16C each illustrate part of FIG. 16A.

Figure 17:
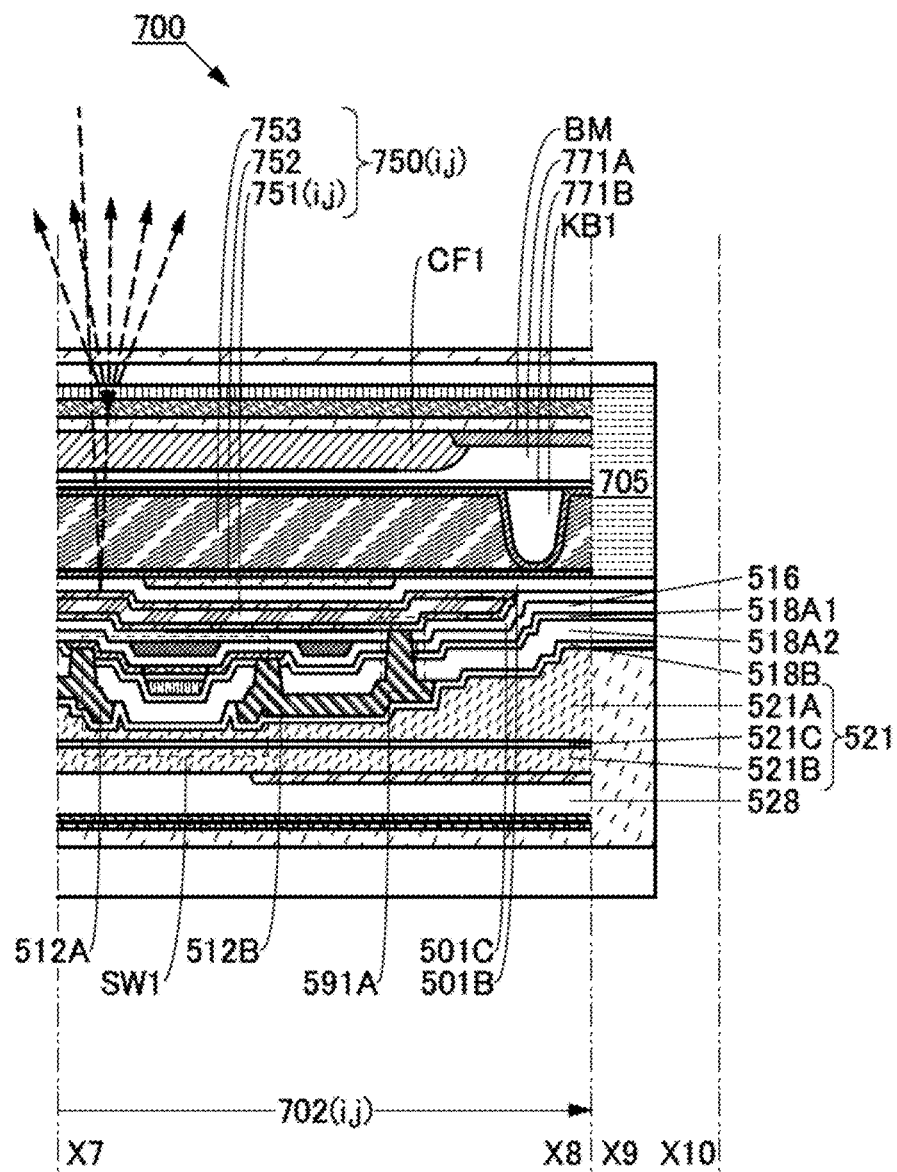
FIG. 17 is a cross-sectional view illustrating a structure of a display device.

FIG. 17 is a cross-sectional view taken along line X7-X8 in FIG. 15B and line X9-X10 in FIG. 15A.

Figure 18A:
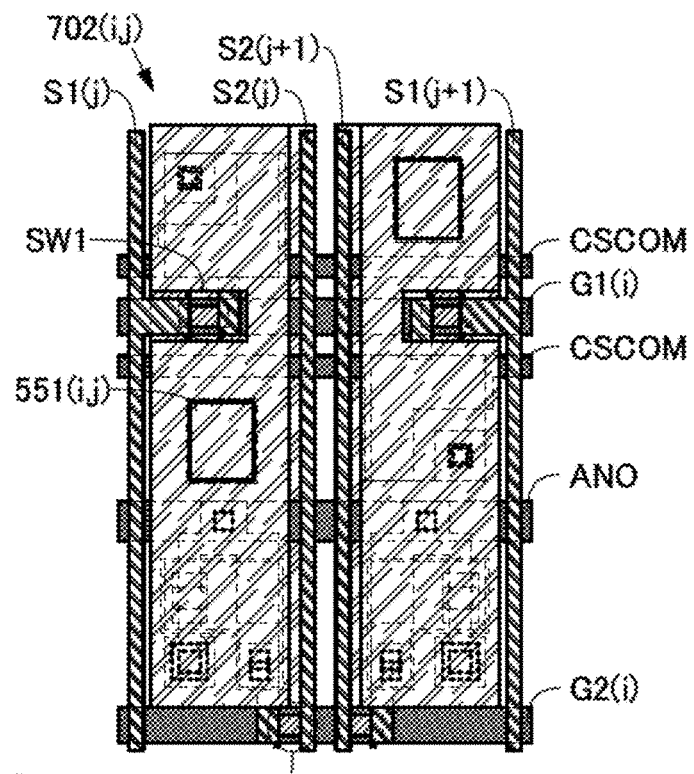
FIGS. 18A and 18B are bottom views each illustrating a structure of a pixel in a display device.
Figure 18B:
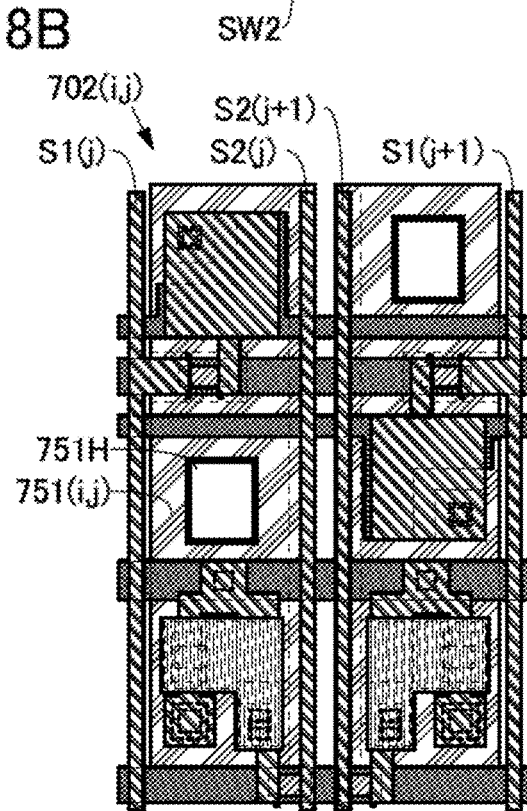

FIGS. 18A and 18B are bottom views each illustrating part of a pixel that can be used for the display device illustrated in FIG. 15A.

Figure 19:
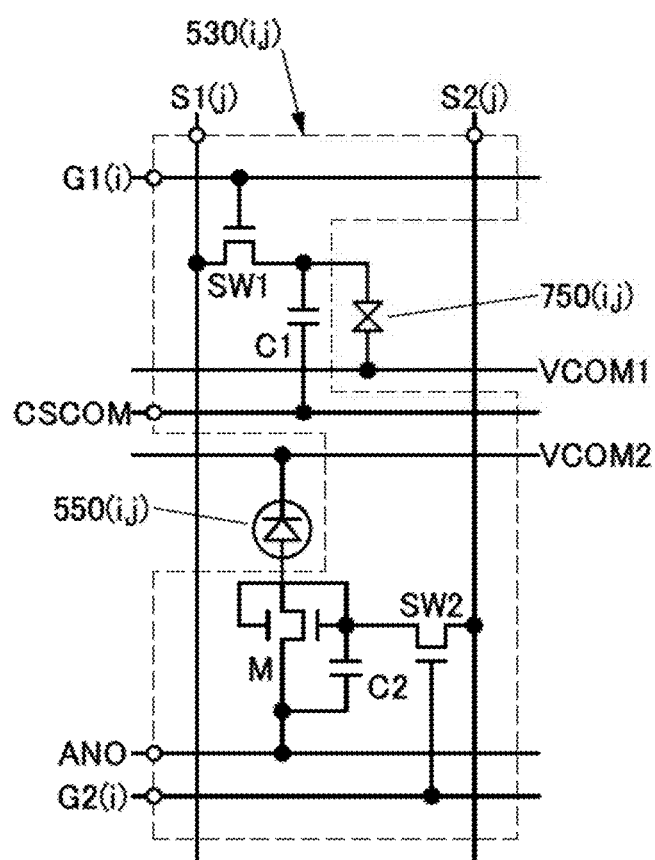
FIG. 19 is a circuit diagram illustrating a pixel circuit in a display device.

FIG. 19 is a circuit diagram illustrating the configuration of a pixel circuit included in a display device of one embodiment of the present invention.

Note that in this specification, an integral variable of 1 or more may be used for reference numerals. For example, "(p)" where p is an integral value of 1 or more may be used for part of a reference numeral that specifies any one of components (up top components). For another example, "(m,n)" where m and n are each an integral value of 1 or more may be used for part of a reference numeral that specifies any one of components (up to m×n components).

<Structural Example 1 of Display Device>

A display device 700 described in this embodiment includes a pixel 702(i,j) (see FIG. 15A).

<<Structural Example 1 of Pixel>>

The pixel 702(i,j) includes a functional layer 520, a first display element 750(i,j), and a second display element 550(i,j) (see FIG. 15A).

The functional layer 520 includes a pixel circuit 530(i,j). The functional layer 520 includes a region positioned between the first display element 750(i,j) and the second display element 550(i,j).

The pixel circuit 530(i,j) is electrically connected to the first display element 750(i,j) and the second display element 550(i,j).

<<Structural Example 1 of First Display Element 750(i,j)>>

The first display element 750(i, j) includes a first electrode 751(i, j), a second electrode 752, a layer 753 containing a liquid crystal material, and a reflective film 751B (see FIG. 10B and FIG. 11B). The first display element 750(i,j) has a function of controlling the intensity of light reflected by the reflective film 751B.

The second electrode 752 is provided such that an electric field in the direction intersecting the thickness direction of the layer 753 containing a liquid crystal material is formed between the second electrode 752 and the first electrode 751(i,j) (see FIG. 10B and FIG. 11A). For example, the second electrode 752 can have a comb-like shape. In this manner, an electric field in the direction intersecting the thickness direction of the layer 753 containing a liquid crystal material can be formed between the second electrode 752 and the first electrode 751(i,j). Alternatively, a display element operating in a VA-IPS mode can be used as the first display element.

Figure 22A:
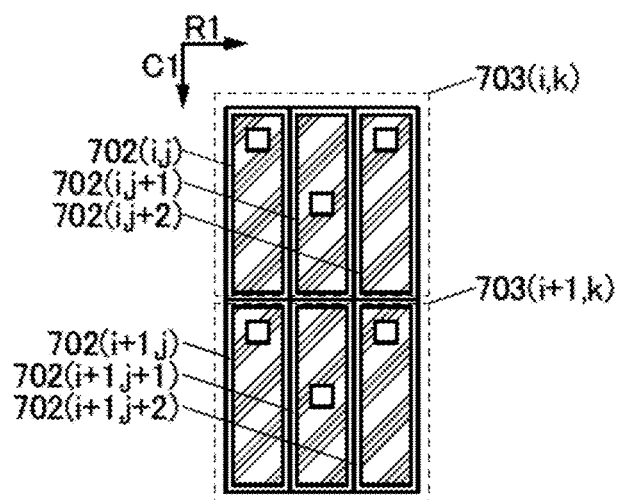
FIGS. 22A and 22B are top views illustrating pixels and subpixels in a display device.
Figure 22B:
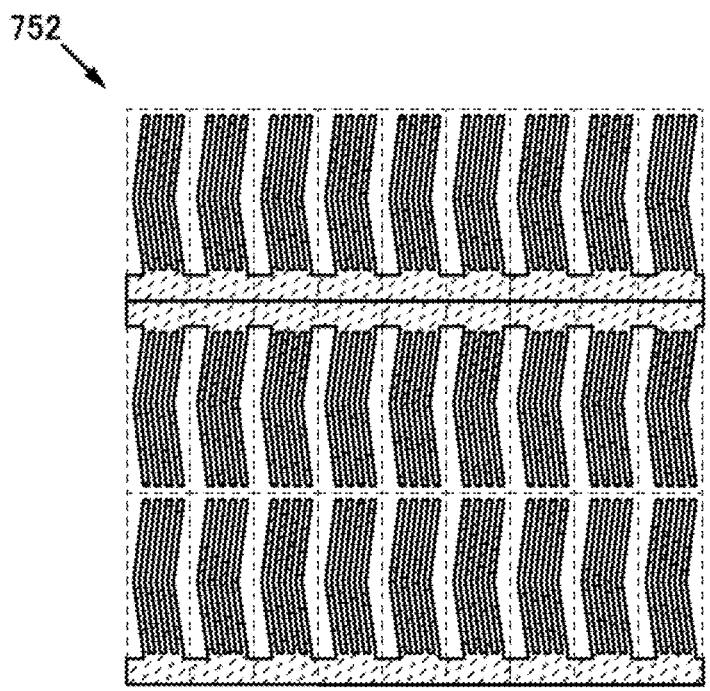

FIG. 22B is an external view of a matrix of the second electrodes 752 with a comb-like shape.

The reflective film 751B has a shape that does not block light emitted from the second display element 550(i,j). For example, the reflective film 751B can have a shape including a region 751H where light is not blocked.

<<Structural Example 1 of Second Display Element 550(i,j)>>

The second display element 550(i,j) has a function of emitting light and is provided such that display using the second display element can be seen from part of a region where display using the first display element 750(i,j) can be seen (see FIG. 11A).

With such a structure, display can be performed by controlling the intensity of light reflected by the reflective film with the use of the first display element. Furthermore, display using the first display element can be complemented using the second display element. Consequently, a novel display device with high convenience or high reliability can be provided.

<<Structural Example 2 of Pixel>>

In the display device 700 described in this embodiment, the pixel 702(i,j) includes an optical element 560 and a covering film 565.

<<Structural Example 1 of Optical Element>>

The optical element 560 has a light-transmitting property and includes a first region 560A, a second region 560B, and a third region 560C (see FIGS. 10B and 10C and FIG. 11B).

The first region 560A includes a region to which light is supplied. For example, the first region 560A receives light from the second display element 550(i,j).

The second region 560B includes a region in contact with the covering film 565.

The third region 560C has a function of allowing part of light to be extracted and has an area smaller than or equal to the area of the region of the first region 560A to which light is supplied.

<<Structural Example of Covering Film>>

The covering film 565 has light reflectivity and has a function of reflecting part of light and supplying it to the third region 560C. For example, the covering film 565 can reflect light emitted from the second display element 550(i,j) toward the third region 560C. Specifically, part of light incident on the optical element 560 through the first region 560A can be reflected by the covering film 565 in contact with the second region 560B and extracted from the third region 560C, as shown by a solid arrow (see FIG. 11B).

<<Structural Example 2 of First Display Element 750(i,j)>>

The reflective film 751B has a shape that does not block light extracted from the third region 560C.

With such a structure, display can be performed by controlling the intensity of light reflected by the reflective film with the use of the first display element. Alternatively, display using the first display element can be complemented using the second display element. Alternatively, the light supplied to the first region can be efficiently emitted from the third region. Alternatively, the light supplied to the first region can be gathered and emitted from the third region. For example, when a light-emitting element is used as the second display element, the area of the light-emitting element can be larger than that of the third region. Alternatively, light supplied from the light-emitting element having an area larger than the area of the third region can be gathered in the third region. Alternatively, the density of a current flowing through the light-emitting element can be decreased while the intensity of light emitted from the third region is maintained. Alternatively, the reliability of the light-emitting element can be increased. For example, an organic EL element or a light-emitting diode can be used as the light-emitting element. Consequently, a novel display device with high convenience or high reliability can be provided.

<<Structural Example 3 of Pixel>>

The pixel 702(i,j) includes part of the functional layer 520, a first display element 750(i,j), and a second display element 550(i,j) (see FIG. 15C).

<<Functional Layer 520>>

The functional layer 520 includes a first conductive layer, a second conductive layer, an insulating film 501C, and the pixel circuit 530(i,j). The functional layer 520 includes the optical element 560 and the covering film 565 (see FIG. 11A and FIG. 16A). The pixel circuit 530(i,j) includes a transistor M, for example.

The functional layer 520 includes a region positioned between the first display element 750(i,j) and the second display element 550(i,j) (see FIG. 16C). The region positioned between the first display element 750(i,j) and the second display element 550(i,j) has a thickness of less than 30 μm, preferably less than 10 μm, further preferably less than 5 μm.

In this manner, the second display element 550(i,j) can be close to the first display element 750(i,j). Parallax between display using the first display element 750(i,j) and display using the second display element 550(i,j) can be reduced. Display using an adjacent pixel (e.g., the pixel 702(i,j+1)) can be inhibited from being disturbed by display using the second display element 550(i,j). The color of display using an adjacent pixel (e.g., the pixel 702(i,j+1)) and the color of display using the second display element 550(i,j) can be inhibited from being mixed. The attenuation of light emitted by the second display element 550(i,j) can be inhibited. The weight of the display device can be reduced. The thickness of the display device can be reduced. The display device is easily bendable.

The functional layer 520 includes an insulating film 528, an insulating film 521A, an insulating film 521B, an insulating film 518, and an insulating film 516.

<<Pixel Circuit>>

The pixel circuit 530(i,j) has a function of driving the first display element 750(i,j) and the second display element 550(i,j) (see FIG. 19).

Thus, the first display element and the second display element that displays an image by a method different from that of the first display element can be driven using pixel circuits that can be formed in the same process. Specifically, a reflective display element is used as the first display element, whereby power consumption can be reduced. An image with high contrast can be favorably displayed in an environment with bright external light. An image can be favorably displayed in a dark environment with the use of the second display element which emits light. With the insulating film, impurity diffusion between the first display element and the second display element or between the first display element and the pixel circuit can be inhibited. Consequently, a novel display device with high convenience or high reliability can be provided.

A switch, a transistor, a diode, a resistor, an inductor, a capacitor, or the like can be used in the pixel circuit 530(i,j).

For example, one or a plurality of transistors can be used as a switch. Alternatively, a plurality of transistors connected in parallel, in series, or in combination of parallel connection and series connection can be used as a switch.

For example, the pixel circuit 530(i,j) is electrically connected to a signal line S1(j), a signal line S2(j), a scan line G1(i), a scan line G2(i), a wiring CSCOM, and a wiring ANO (see FIG. 19). Although not illustrated, a conductive layer 512A is electrically connected to the signal line S1(j).

The pixel circuit 530(i,j) includes a switch SW1 and a capacitor C11 (see FIG. 19).

The pixel circuit 530(i,j) includes a switch SW2, a transistor M, and a capacitor C12.

For example, a transistor including a gate electrode electrically connected to the scan line G1(i) and a first electrode electrically connected to the signal line S1(j) can be used as the switch SW1.

The capacitor C11 includes a first electrode electrically connected to a second electrode of the transistor used as the switch SW1 and a second electrode electrically connected to the wiring CSCOM.

For example, a transistor including a gate electrode electrically connected to the scan line G2(i) and a first electrode electrically connected to the signal line S2(j) can be used as the switch SW2.

The transistor M includes a gate electrode electrically connected to a second electrode of the transistor used as the switch SW2 and a first electrode electrically connected to the wiring ANO.

Note that a transistor including a conductive layer provided such that a semiconductor film is positioned between a gate electrode and the conductive layer can be used as the transistor M. For example, as the conductive layer, a conductive layer electrically connected to a wiring that can supply the same potential as that of the gate electrode of the transistor M can be used.

The capacitor C12 includes a first electrode electrically connected to the second electrode of the transistor used as the switch SW2 and a second electrode electrically connected to the first electrode of the transistor M.

A first electrode of the first display element 750(i,j) is electrically connected to the second electrode of the transistor used as the switch SW1. The second electrode 752 of the first display element 750(i,j) is electrically connected to a wiring VCOM1. This enables the first display element 750 to be driven.

The electrode 551(i,j) and the electrode 552 of the second display element 550(i,j) are electrically connected to a second electrode of the transistor M and a conductive layer VCOM2, respectively. This enables the second display element 550(i,j) to be driven.

<<Insulating Film 501C>>

The insulating film 501C includes a region positioned between the first conductive layer and the second conductive layer and has an opening 591A (see FIG. 17).

<<First Conductive Layer>>

The first conductive layer is electrically connected to the first display element 750(i,j). Specifically, the first conductive layer is electrically connected to the first electrode 751(i,j) of the first display element 750(i,j). The first electrode 751(i,j) can be used as the first conductive layer.

<<Second Conductive Layer>>

The second conductive layer includes a region overlapping with the first conductive layer. The second conductive layer is electrically connected to the first conductive layer through the opening 591A. For example, a conductive layer 512B can be used as the second conductive layer.

Note that the first conductive layer electrically connected to the second conductive layer in the opening 591A formed in the insulating film 501C can be referred to as a through electrode.

The second conductive layer is electrically connected to the pixel circuit 530(i,j). For example, a conductive layer that functions as a source electrode or a drain electrode of a transistor used as a switch SW1 of the pixel circuit 530(i,j) can be used as the second conductive layer.

<<Structural Example 2 of Second Display Element 550(i,j)>>

The second display element 550(i,j) is electrically connected to the pixel circuit 530(i,j) (see FIG. 16A and FIG. 19). The second display element 550(i,j) has a function of emitting light toward the functional layer 520. The second display element 550(i,j) has a function of emitting light toward the insulating film 501C or an opening formed in the insulating film 501C, for example.

The second display element 550(i,j) is provided such that display using the second display element 550(i,j) can be seen from part of a region where display using the first display element 750(i,j) can be seen. For example, dashed arrows shown in FIG. 17 denote the directions in which external light is incident on and reflected by the first display element 750(i,j) that displays image data by controlling the intensity of external light reflection. In addition, a solid arrow shown in FIG. 16A denotes the direction in which the second display element 550(i,j) emits light to part of the region where display using the first display element 750(i,j) can be seen.

Accordingly, display using the second display element can be seen from part of the region where display using the first display element can be seen. Alternatively, users can see display without changing the attitude or the like of the display device. Alternatively, an object color expressed by light reflected by the first display element and a light source color expressed by light emitted from the second display element can be mixed. Alternatively, an object color and a light source color can be used to display an image like a painting. Thus, a novel display device with high convenience or high reliability can be provided.

For example, the second display element 550(i,j) includes the electrode 551(i,j), the electrode 552, and the layer 553(j) containing a light-emitting material (see FIG. 16A).

The electrode 552 includes a region overlapping with the electrode 551(i,j).

The layer 553(j) containing a light-emitting material includes a region positioned between the electrode 551(i,j) and the electrode 552.

The electrode 551(i,j) is electrically connected to the pixel circuit 530(i,j) at a connection portion 522. The electrode 552 is electrically connected to the conductive layer VCOM2 (see FIG. 16A and FIG. 19).

<<Insulating Films 521, 528, 518, and 516>>

An insulating film 521 includes a region positioned between the pixel circuit 530(i,j) and the second display element 550(i,j).

For example, a laminated film can be used as the insulating film 521. For example, a stack including the insulating film 521A, the insulating film 521B, and an insulating film 521C can be used as the insulating film 521.

The insulating film 528 includes a region positioned between the insulating film 521 and the substrate 570 and has an opening in a region overlapping with the second display element 550(i,j). The insulating film 528 that is along the edge of the electrode 551(i,j) can avoid a short circuit between the electrode 551(i,j) and the electrode 552.

Note that a single-layer film or a stacked-layer film can be used for the insulating film 518. For example, an insulating film 518A and an insulating film 518B can be used for the insulating film 518. Alternatively, for example, an insulating film 518A1 and an insulating film 518A2 can be used for the insulating film 518.

The insulating film 518 includes a region positioned between the insulating film 521 and the pixel circuit 530(i,j).

The insulating film 516 includes a region positioned between the insulating film 518 and the pixel circuit 530(i,j).

Furthermore, the display device 700 can include an insulating film 501B. The insulating film 501B has an opening 592B (see FIG. 16A).

The opening 592B includes a region overlapping with a conductive layer 511B.

<Structural Example 2 of Display Device>

The display device 700 described in this embodiment includes a display region 231 (see FIGS. 15A to 15C).

<<Display Region 231>>

Although not specifically illustrated, the display region 231 includes one group of pixels 702($i$,1) to 702($i,n$), another group of pixels 702(1,$j$) to 702($m,j$), a scan line G1($i$), and a signal line S1($j$). As an example, FIGS. 15A to 15C illustrate the pixel 702($i,j$). The display region 231 includes the scan line G2($i$), the wiring CSCOM, the wiring ANO, and the signal line S2($j$) (see FIGS. 15A to 15C and FIG. 19). Note that i is an integer greater than or equal to 1 and less than or equal to m, j is an integer greater than or equal to 1 and less than or equal to n, and each of m and n is an integer greater than or equal to 1.

The one group of pixels 702($i$,1) to 702($i,n$) include the pixel 702($i,j$) and are arranged in the row direction (the direction indicated by the arrow R1 in the drawing).

The another group of pixels 702(1,$j$) to 702($m,j$) include the pixel 702($i,j$) and are arranged in the column direction (the direction indicated by the arrow C1 in the drawing) that intersects the row direction.

The scan line G1($i$) and the scan line G2($i$) are electrically connected to the group of pixels 702(1,1) to 702($i,n$) arranged in the row direction.

The signal line S1($i$) and the signal line S2($j$) are electrically connected to the another group of pixels 702(1,$j$) to 702($m,j$) arranged in the column direction.

<Structural Example 3 of Display Device>

The display device 700 described in this embodiment can include a plurality of pixels having functions of representing colors with different hues. Furthermore, colors with hues that cannot be represented by the plurality of pixels capable of representing colors with different hues can be represented by additive color mixing with the use of the pixels.

Note that when a plurality of pixels capable of representing colors with different hues are used for color mixture, each of the pixels can be referred to as a subpixel. In addition, a set of subpixels can be referred to as a pixel. Specifically, the pixel 702($i,j$) can be referred to as a subpixel, and the pixel 702($i,j$), a pixel 702($i,j$+1), and a pixel 702($i,j$+2) can be collectively referred to as a pixel 703($i,k$) (see FIG. 22A).

For example, a subpixel that represents blue, a subpixel that represents green, and a subpixel that represents red can be collectively used as the pixel 703($i,k$).

Alternatively, for example, a subpixel that represents cyan, a subpixel that represents magenta, and a subpixel that represents yellow can be collectively used as the pixel 703($i,k$).

Alternatively, for example, the above set to which a subpixel that represents white is added can be used as the pixel.

Alternatively, for example, a set of the following subpixels can be used as the pixel 703($i,k$): a subpixel including the first display element 750($i,j$) that represents cyan and the second display element 550($i,j$) that represents blue; a subpixel including a first display element 750($i,j$+1) that represents yellow and a second display element 550($i,j$+1) that represents green; and a subpixel including a first display element 750($i,j$+2) that represents magenta and a second display element 550($i,j$+2) that represents red. This allows bright display using the first display elements 750($i,j$) to 750($i,j$+2) or clear display using the second display elements 550($i,j$) to 550($i,j$+2).

<Structural Example 4 of Display Device>

The display device 700 described in this embodiment can include a driver circuit GD or a driver circuit SD (see FIG. 15A).

<<Driver Circuit GD>>

The driver circuit GD has a function of supplying a selection signal on the basis of control data.

For example, the driver circuit GD has a function of supplying a selection signal to one scan line at a frequency of 30 Hz or higher, preferably 60 Hz or higher, on the basis of control data. Accordingly, moving images can be smoothly displayed.

For example, the driver circuit GD has a function of supplying a selection signal to one scan line at a frequency of lower than 30 Hz, preferably lower than 1 Hz, more preferably less than once per minute, on the basis of control data. Accordingly, a still image can be displayed with reduced flickering.

A display device can include a plurality of driver circuits. For example, a display device 700B includes a driver circuit GDA and a driver circuit GDB (see FIGS. 15A to 15C).

For example, in the case where a plurality of driver circuits are provided, the driver circuits GDA and GDB may supply the selection signals at different frequencies. Specifically, the selection signal can be supplied at a higher frequency to a region on which moving images are displayed than to a region on which a still image is displayed. Accordingly, a still image can be displayed in a region with reduced flickering, and moving images can be smoothly displayed in another region.

<<Driver Circuit SD>>

Although not illustrated, the driver circuit SD includes a driver circuit SD1 and a driver circuit SD2. The driver circuit SD1 has a function of supplying an image signal on the basis of data V11. The driver circuit SD2 has a function of supplying an image signal on the basis of data V12 (see FIGS. 15A to 15C).

The driver circuit SD1 or the driver circuit SD2 has a function of generating an image signal and a function of supplying the image signal to a pixel circuit electrically connected to a display element. Specifically, the driver circuit SD1 or the driver circuit SD2 has a function of generating a signal whose polarity is inverted. Thus, for example, a liquid crystal display element can be driven.

For example, any of a variety of sequential circuits, such as a shift register, can be used as the driver circuit SD.

For example, an integrated circuit in which the driver circuit SD1 and the driver circuit SD2 are integrated can be used as the driver circuit SD. Specifically, an integrated circuit formed on a silicon substrate can be used as the driver circuit SD.

An integrated circuit can be mounted on a terminal by a chip on glass (COG) method or a chip on film (COF) method, for example. Specifically, an anisotropic conductive layer can be used to mount an integrated circuit on the terminal.

<Structural Example 5 of Display Device>

Moreover, the display device 700 described in this embodiment includes a functional layer 720, a terminal 519B, the substrate 570, a substrate 770, a bonding layer 505, a sealing material 705, a structure body KB1, a functional film 770P, a functional film 770D, and the like (see FIG. 16A and FIG. 17).

<<Functional Layer 720>>

The display device described in this embodiment includes the functional layer 720. The functional layer 720 includes a region positioned between the substrate 770 and the insulating film 501C. The functional layer 720 includes a light-blocking film BM, an insulating film 771, and a coloring film CF1 (see FIG. 16A and FIG. 17).

The light-blocking film BM has an opening in a region overlapping with the first display element 750(i,j).

The coloring film CF1 includes a region positioned between the substrate 770 and the first display element 750(i,j).

The insulating film 771 includes a region between the coloring film CF1 and the layer 753 containing a liquid crystal material and a region between the light-blocking film BM and the layer 753 containing a liquid crystal material. The insulating film 771 can reduce unevenness due to the thickness of the coloring film CF1. Alternatively, impurities can be prevented from being diffused from the light-blocking film BM, the coloring film CF1, or the like to the layer 753 containing a liquid crystal material.

Note that a single-layer film or a stacked-layer film can be used for the insulating film 771. For example, an insulating film 771A and an insulating film 771B can be used for the insulating film 771.

<<Terminal 519B>>

The display device described in this embodiment includes a terminal 519B (see FIG. 16A).

The terminal 519B includes the conductive layer 511B. The terminal 519B is electrically connected to the signal line S1(j), for example.

<<Substrate 570 and Substrate 770>>

In addition, the display device described in this embodiment includes the substrate 570 and the substrate 770.

The substrate 770 includes a region overlapping with the substrate 570. The substrate 770 includes a region positioned such that the functional layer 520 is sandwiched between the substrate 770 and the substrate 570.

The substrate 770 includes a region overlapping with the first display element 750(i,j). For example, a material with low birefringence can be used for the region.

<<Bonding Layer 505, Sealing Material 705, and Structure Body KB1>>

The display device described in this embodiment includes the bonding layer 505, the sealing material 705, and the structure body KB1.

The bonding layer 505 includes a region positioned between the functional layer 520 and the substrate 570, and has a function of bonding the functional layer 520 and the substrate 570 to each other.

The sealing material 705 includes a region positioned between the functional layer 520 and the substrate 770, and has a function of bonding the functional layer 520 and the substrate 770 to each other.

The structure body KB1 has a function of providing a certain space between the functional layer 520 and the substrate 770.

<<Functional Films 770PA, 770PB, and 770D>>

The display device described in this embodiment includes a functional film 770PA, a functional film 770PB, and the functional film 770D.

The functional films 770PA and 770PB each include a region overlapping with the first display element 750(i,j).

The functional film 770D includes a region overlapping with the first display element 750(i,j). The functional film 770D is provided such that the substrate 770 lies between the functional film 770D and the first display element 750(i,j). Thus, for example, light reflected by the first display element 750(i,j) can be diffused.

<Example of Components>

The display device 700 includes the substrate 570, the substrate 770, the structure body KB1, the sealing material 705, and the bonding layer 505.

The display device 700 also includes the functional layer 520, the optical element 560, the covering film 565, the insulating film 521, and the insulating film 528.

The display device 700 also includes the signal line S1(j), the signal line S2(j), the scan line G1(i), the scan line G2(i), the wiring CSCOM, and the wiring ANO.

The display device 700 also includes the first conductive layer and the second conductive layer.

The display device 700 also includes the terminal 519B and the conductive layer 511B.

The display device 700 also includes the pixel circuit 530(i,j) and the switch SW1.

The display device 700 also includes the first display element 750(i,j), the first electrode 751(i,j), the reflective film, the opening, the layer 753 containing a liquid crystal material, and the second electrode 752.

The display device 700 also includes an alignment film AF1, an alignment film AF2, the coloring film CF1, the light-blocking film BM, the insulating film 771, the functional film 770P, and the functional film 770D.

The display device 700 also includes the second display element 550(i,j), the electrode 551(i,j), the electrode 552, and the layer 553(j) containing a light-emitting material.

The display device 700 also includes the insulating film 501B and the insulating film 501C.

The display device 700 also includes the driver circuit GD and the driver circuit SD.

<<Substrate 570>>

The substrate 570 or the like can be formed using a material having heat resistance high enough to withstand heat treatment in the manufacturing process. For example, a material with a thickness greater than or equal to 0.1 mm and less than or equal to 0.7 mm can be used for the substrate 570. Specifically, a material polished to a thickness of approximately 0.1 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramic, or a metal can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, a silicon oxide film, a silicon nitride film, a silicon oxynitride film, an aluminum oxide film, or the like can be used for the substrate 570 or the like. Stainless steel, aluminum, or the like can be used for the substrate 570 or the like.

For example, a single crystal semiconductor substrate or a polycrystalline semiconductor substrate of silicon or silicon carbide, a compound semiconductor substrate of silicon germanium or the like, or an SOI substrate can be used as the substrate 570 or the like. Thus, a semiconductor element can be provided over the substrate 570 or the like.

For example, an organic material such as a resin, a resin film, or plastic can be used for the substrate 570 or the like. Specifically, a resin film or resin plate of polyester, polyolefin, polyamide, polyimide, polycarbonate, an acrylic resin, or the like can be used for the substrate 570 or the like.

For example, a composite material formed by attaching a metal plate, a thin glass plate, or a film of an inorganic material to a resin film or the like can be used for the substrate 570 or the like. For example, a composite material formed by dispersing a fibrous or particulate metal, glass, inorganic material, or the like into a resin film can be used for the substrate 570 or the like. For example, a composite material formed by dispersing a fibrous or particulate resin, organic material, or the like into an inorganic material can be used for the substrate 570 or the like.

Furthermore, a single-layer material or a layered material in which a plurality of layers are stacked can be used for the substrate 570 or the like. For example, a layered material in which a base, an insulating film that prevents diffusion of impurities contained in the base, and the like are stacked can be used for the substrate 570 or the like. Specifically, a layered material in which glass and one or more of a silicon oxide layer, a silicon nitride layer, a silicon oxynitride layer, and the like that prevent diffusion of impurities contained in the glass are stacked can be used for the substrate 570 or the like. Alternatively, a layered material in which a resin and a film for preventing diffusion of impurities that penetrate the resin, such as a silicon oxide film, a silicon nitride film, and a silicon oxynitride film are stacked can be used for the substrate 570 or the like.

Specifically, a resin film, a resin plate, a layered material, or the like containing polyester, polyolefin, polyamide, polyimide, polycarbonate, an acrylic resin, or the like can be used for the substrate 570 or the like.

Specifically, a material containing polyester, polyolefin, polyamide (e.g., nylon or aramid), polyimide, polycarbonate, polyurethane, an acrylic resin, an epoxy resin, or a resin having a siloxane bond, such as silicone can be used for the substrate 570 or the like.

Specifically, polyethylene terephthalate (PET), polyethylene naphthalate (PEN), polyethersulfone (PES), acrylic, or the like can be used for the substrate 570 or the like. Alternatively, a cycloolefin polymer (COP), a cycloolefin copolymer (COC), or the like can be used.

Alternatively, paper, wood, or the like can be used for the substrate 570 or the like.

For example, a flexible substrate can be used as the substrate 570 or the like.

Note that a transistor, a capacitor, or the like can be directly formed on the substrate. Alternatively, a transistor, a capacitor, or the like formed on a substrate for use in manufacturing processes that can resist heat applied in the manufacturing process can be transferred to the substrate 570 or the like. Thus, a transistor, a capacitor, or the like can be formed over a flexible substrate, for example.

<<Substrate 770>>

For example, a material that can be used for the substrate 570 can be used for the substrate 770. For example, a light-transmitting material that can be used for the substrate 570 can be used for the substrate 770. Alternatively, a material having a surface provided with an antireflective film with a thickness of 1 μm or less can be used for the substrate 770. Specifically, a stack including three or more, preferably five or more, more preferably 15 or more dielectrics can be used for the substrate 770. This allows reflectivity to be as low as 0.5% or less, preferably 0.08% or less. Alternatively, a material with low birefringence that can be used for the substrate 570 can be used for the substrate 770.

For example, aluminosilicate glass, tempered glass, chemically tempered glass, sapphire, or the like can be favorably used for the substrate 770 that is on the side closer to a user of the display device. This can prevent breakage or damage of the display device caused by the use.

For example, a resin film of a cycloolefin polymer (COP), a cycloolefin copolymer (COC), or triacetyl cellulose (TAC) can be favorably used as the substrate 770, in which case the substrate 770 can be lightweight. Alternatively, for example, the display device can be made less likely to suffer from damage by dropping.

A material with a thickness greater than or equal to 0.1 mm and less than or equal to 0.7 mm can be used for the substrate 770, for example. Specifically, a substrate polished to be reduced in the thickness can be used. In that case, the functional film 770D can be close to the first display element 750(i,j). As a result, image blur can be reduced, and an image can be displayed clearly.

<<Structure Body KB1>>

The structure body KB1 or the like can be formed using an organic material, an inorganic material, or a composite material of an organic material and an inorganic material, for example. Accordingly, a predetermined space can be provided between components between which the structure body KB1 and the like are provided.

Specifically, for the structure body KB1, polyester, polyolefin, polyamide, polyimide, polycarbonate, polysiloxane, an acrylic resin, or the like, or a composite material of a plurality of resins selected from these can be used. Alternatively, a photosensitive material may be used.

<<Sealing Material 705>>

For the sealing material 705 or the like, an inorganic material, an organic material, a composite material of an inorganic material and an organic material, or the like can be used.

For example, an organic material such as a thermally fusible resin or a curable resin can be used for the sealing material 705 or the like.

For example, an organic material such as a reactive curable adhesive, a light curable adhesive, a thermosetting adhesive, and/or an anaerobic adhesive can be used for the sealing material 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used for the sealing material 705 or the like.

<<Bonding Layer 505>>

For example, any of the materials that can be used for the sealing material 705 can be used for the bonding layer 505.

<<Insulating Film 521>>

For example, an insulating inorganic material, an insulating organic material, an insulating composite material containing an inorganic material and an organic material can be used for the insulating film 521 or the like.

Specifically, for example, an inorganic oxide film, an inorganic nitride film, an inorganic oxynitride film, or a material obtained by stacking any of these films can be used as the insulating film 521 or the like. For example, a film including any of a silicon oxide film, a silicon nitride film, a silicon oxynitride film, and an aluminum oxide film, or a film including a layered material obtained by stacking any of these films can be used as the insulating film 521 or the like.

Specifically, for the insulating film 521 or the like, polyester, polyolefin, polyamide, polyimide, polycarbonate, polysiloxane, an acrylic resin, or the like, or a laminated or composite material of a plurality of kinds of resins selected from these can be used. Alternatively, a photosensitive material may be used.

Thus, steps due to various components overlapping with the insulating film 521 can be reduced, for example.

<<Optical Element 560>>

The optical element 560 has an optical axis Z (see FIG. 10C). The optical axis Z passes through the center of the region of the first region 560A to which visible light is supplied and the center of the third region 560C. The second region 560B includes an inclined portion with an inclination B of 45° or more, preferably 75° or more and 85° or less, with respect to a plane orthogonal to the optical axis Z. For example, the second region 560B illustrated in the drawing entirely has an inclination of approximately 60° with respect to the plane orthogonal to the optical axis Z.

The inclined portion of the second region 560B is provided within greater than or equal to 0.05 μm and less than or equal to 0.2 μm of the end of the region of the first region 560A to which visible light is supplied. Note that in the case where the second display element 550(i,j) is in contact with the first region 560A, the region of the first region 560A to which visible light is supplied has the same area as the region of the second display element 550(i,j) that can supply visible light. For example, the inclined portion of the second region 560B illustrated in the drawing is positioned at a distance d from the end of the region of the first region 560A to which visible light is supplied.

The region of the first region 560A to which visible light is supplied has an area larger than 10% of the area of the pixel 702(i,j) (see FIG. 10D).

The third region 560C has an area smaller than or equal to 10% of the area of the pixel 702(i,j).

The reflective film 751B has an area larger than or equal to 70% of the area of the pixel 702(i,j).

The sum of the area of the region of the first region 560A to which visible light is supplied and the area of the reflective film 751B is larger than the area of the pixel 702(i,j).

For example, a rectangular pixel 27 μm wide and 81 μm long has an area of 2187 μm². In the case of such a pixel, the region of the first region 560A to which visible light is supplied has an area of 324 μm². The third region 560C has an area of 81 μm², and the reflective film 751B has an area of 1894 μm².

In this structure, the area of a region of the first region 560A to which visible light is supplied is approximately 14.8% of the area of the pixel.

The area of the reflective film 751B is approximately 86.6% of the area of the pixel.

The sum of the area of the region of the first region 560A to which visible light is supplied and the area of the reflective film 751B is 2218 μm².

Thus, in the second region, light incident through the first region at various angles can be gathered. Consequently, a novel display device with high convenience or high reliability can be provided.

Note that a plurality of materials can be used for the optical element 560. For example, a plurality of materials selected such that a difference between their refractive indices is 0.2 or less can be used for the optical element 560. Thus, reflection or scattering of light in the optical element or loss of light can be inhibited.

The optical element 560 can have any of various shapes. For example, the shape of a section orthogonal to the optical axis of the optical element 560 can be a circle or a polygon. The second region 560B of the optical element 560 can have a flat surface or a curved surface.

An example of a cross-sectional view along the optical axis of the optical element 560 having a quadrangle section orthogonal to the optical axis is illustrated in FIG. 23A-1, FIG. 23B-1, or FIG. 23C-1. FIG. 23A-2, FIG. 23B-2, or FIG. 23C-2 shows a perspective view of the optical element 560.

An example of a cross-sectional view along the optical axis of the optical element 560 having a circular section orthogonal to the optical axis is illustrated in FIG. 23D-1, FIG. 23E-1, or FIG. 23F-1. FIG. 23D-2, FIG. 23E-2, or FIG. 23F-2 shows a perspective view of the optical element 560.

<<Covering Film 565>>

A single-layer film or a laminated film can be used as the covering film 565. For example, a stack including a light-transmitting film and a reflective film can be used for the covering film 565.

For example, an inorganic material such as an oxide film, a fluoride film, or a sulfide film can be used for the light-transmitting film.

For example, a metal can be used for the reflective film. Specifically, a material containing silver can be used for the covering film 565. For example, a material containing silver, palladium, and the like or a material containing silver, copper, and the like can be used for the reflective film. Alternatively, a multilayer film of dielectrics can be used for the reflective film.

<<Insulating Film 528>>

For example, any of the materials that can be used for the insulating film 521 can be used for the insulating film 528 or the like. Specifically, a 1-μm-thick polyimide-containing film can be used as the insulating film 528.

<<Insulating Film 501B>>

For example, a material that can be used for the insulating film 521 can be used for the insulating film 501B. For example, a material having a function of supplying hydrogen can be used for the insulating film 501B.

Specifically, a material obtained by stacking a material containing silicon and oxygen and a material containing silicon and nitrogen can be used for the insulating film 501B. For example, a material having a function of releasing hydrogen by heating or the like to supply the hydrogen to another component can be used for the insulating film 501B. Specifically, a material having a function of releasing hydrogen taken in the manufacturing process, by heating or the like, to supply the hydrogen to another component can be used for the insulating film 501B.

For example, a film containing silicon and oxygen that is formed by a chemical vapor deposition method using silane or the like as a source gas can be used as the insulating film 501B.

Specifically, a material obtained by stacking a material containing silicon and oxygen and having a thickness greater than or equal to 200 nm and less than or equal to 600 nm and a material containing silicon and nitrogen and having a thickness of approximately 200 nm can be used for the insulating film 501B.

<<Insulating Film 501C>>

For example, any of the materials that can be used for the insulating film 521 can be used for the insulating film 501C. Specifically, a material containing silicon and oxygen can be used for the insulating film 501C. Thus, diffusion of impurities into the pixel circuit, the second display element, or the like can be inhibited.

For example, a 200-nm-thick film containing silicon, oxygen, and nitrogen can be used as the insulating film 501C.

<<Wiring, Terminal, and Conductive Layer>>

A conductive material can be used for the wiring or the like. Specifically, the conductive material can be used for the signal line S1($j$), the signal line S2($j$), the scan line G1($i$), the scan line G2($i$), the wiring CSCOM, the wiring ANO, the terminal 519B, the conductive layer 511B, or the like.

For example, an inorganic conductive material, an organic conductive material, a metal, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy containing any of the above-described metal elements, or the like can be used for the wiring or the like. In particular, an alloy of copper and manganese is suitably used in microfabrication using a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film containing graphene oxide is formed and subjected to reduction, whereby a film containing graphene can be formed. As a reducing method, a method with application of heat, a method using a reducing agent, or the like can be employed.

A film containing a metal nanowire can be used for the wiring or the like, for example. Specifically, a nanowire containing silver can be used.

Specifically, a conducting polymer can be used for the wiring or the like.

Note that the terminal 519B can be electrically connected to a flexible printed circuit FPC1 with the use of a conductive material ACF1, for example.

<<First Conductive Layer and Second Conductive Layer>>

For example, any of the materials that can be used for the wiring or the like can be used for the first conductive layer or the second conductive layer.

The first electrode 751($i,j$), the wiring, or the like can be used for the first conductive layer.

The conductive layer 512B functioning as the source electrode or the drain electrode of the transistor that can be used for the switch SW1, the wiring, or the like can be used for the second conductive layer.

<<First Display Element 750($i,j$)>>

For example, a display element having a function of controlling transmission or reflection of light can be used as the first display element 750($i,j$). For example, a combined structure of a liquid crystal element and a polarizing plate, a MEMS shutter display element, a MEMS optical coherence display element, or the like can be used. The use of a reflective display element can reduce the power consumption of the display device. For example, a display element using a microcapsule method, an electrophoretic method, an electrowetting method, or the like can be used as the first display element 750($i,j$). Specifically, a reflective liquid crystal display element can be used as the first display element 750($i,j$).

For example, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

Alternatively, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The first display element 750($i,j$) includes a first electrode, a second electrode, and a layer containing a liquid crystal material. The layer containing a liquid crystal material contains a liquid crystal material whose alignment can be controlled by voltage applied between the first electrode and the second electrode. For example, the alignment of the liquid crystal material can be controlled by an electric field in the thickness direction (also referred to as the vertical direction) or an electric field in the direction that intersects the vertical direction (also referred to as the horizontal direction or the diagonal direction) of the layer containing a liquid crystal material.

<<Layer 753 Containing Liquid Crystal Material>>

For example, thermotropic liquid crystal, low-molecular liquid crystal, high-molecular liquid crystal, polymer dispersed liquid crystal, ferroelectric liquid crystal, anti-ferroelectric liquid crystal, or the like can be used for the layer containing a liquid crystal material. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

For example, a negative liquid crystal material can be used for the layer containing a liquid crystal material.

For example, a liquid crystal material having a resistivity of greater than or equal to $1.0 \times 10^{13}$ Ω·cm, preferably greater than or equal to $1.0 \times 10^{14}$ Ω·cm, more preferably greater than or equal to $1.0 \times 10^{15}$ Ω·cm, is used for the layer 753 containing a liquid crystal material. This can suppress a variation in the transmittance of the first display element 750($i,j$). Alternatively, flickering of the first display element 750($i,j$) can be suppressed. Alternatively, the rewriting frequency of the first display element 750($i,j$) can be reduced.

<<First Electrode 751($i,j$)>>

For example, the material that is used for the wiring or the like can be used for the first electrode 751($i,j$). Specifically, a reflective film can be used for the first electrode 751($i,j$). For example, a material in which a light-transmitting conductive layer and a reflective film having an opening are stacked can be used for the first electrode 751($i,j$).

<<Reflective Film>>

For example, a material that reflects visible light can be used for the reflective film. Specifically, a material containing silver can be used for the reflective film. For example, a material containing silver, palladium, and the like or a material containing silver, copper, and the like can be used for the reflective film.

The reflective film reflects light that passes through the layer 753 containing a liquid crystal material, for example. This allows the first display element 750 to serve as a reflective liquid crystal element. Alternatively, for example, a material with unevenness on its surface can be used for the reflective film. In that case, incident light can be reflected in various directions so that a white image can be displayed.

For example, the first conductive layer, the first electrode 751($i,j$), or the like can be used as the reflective film.

Figure 20A:
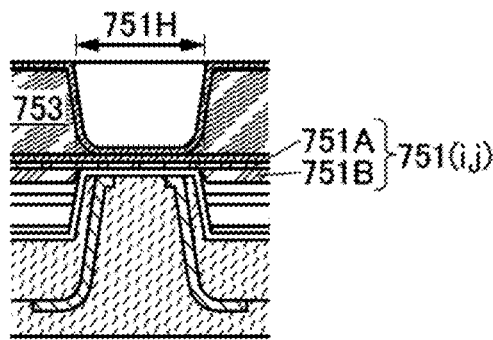
FIGS. 20A to 20D are cross-sectional views each illustrating a structure of a reflective film in a display device.

For example, a film including a region positioned such that a light-transmitting conductive layer 751A is sandwiched between the region and the layer 753 containing a liquid crystal material can be used as the reflective film 751B (see FIG. 20A).

Figure 20B:
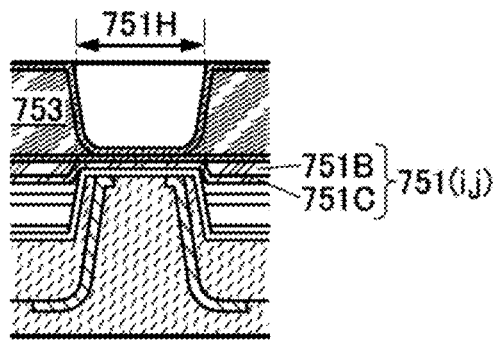

For example, a film including a region positioned between the layer 753 containing a liquid crystal material and a light-transmitting conductive layer 751C can be used as the reflective film 751B (see FIG. 20B).

Figure 20C:
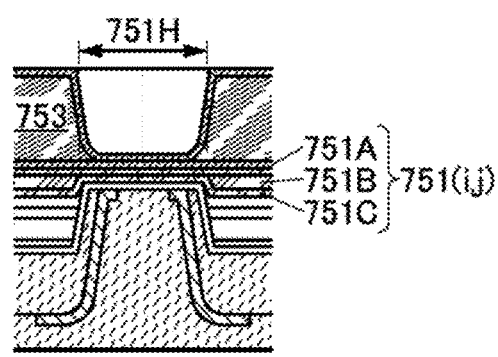

For example, a film including a region positioned between the light-transmitting conductive layer 751A and the light-transmitting conductive layer 751C can be used as the reflective film 751B (see FIG. 20C).

Figure 20D:
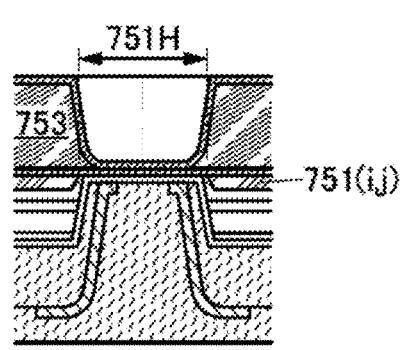

For example, a film reflecting visible light may be used for the first electrode 751($i,j$) (see FIG. 20D).

Figure 21A:
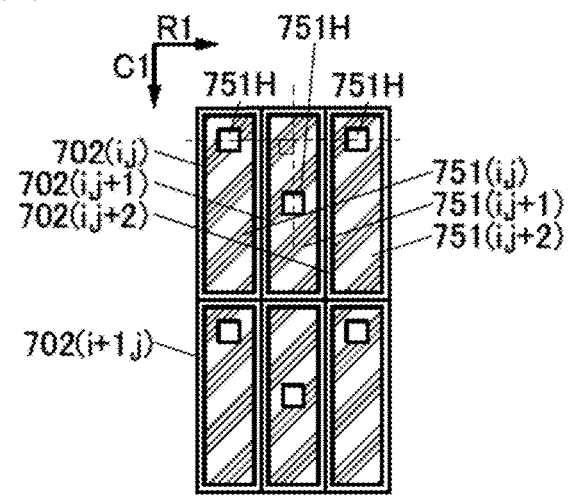
FIGS. 21A to 21C are top views each illustrating a structure of a reflective film in a display device.
Figure 21B:
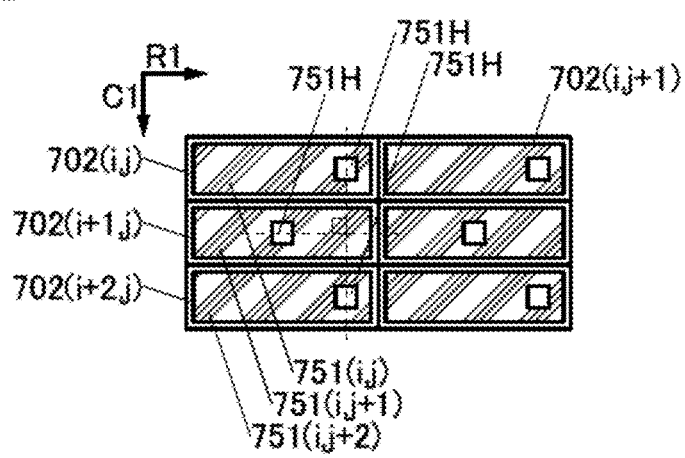
Figure 21C:
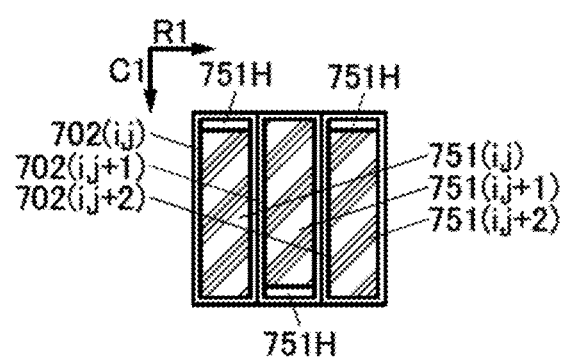

The reflective film has a shape including the region 751H where light emitted from the second display element 550($i,j$) is not blocked (see FIGS. 21A to 21C).

For example, the reflective film can have one or more openings. Specifically, the region 751H may have a polygonal shape, a quadrangular shape, an elliptical shape, a circular shape, a cross-like shape, or the like. The region 751H may alternatively have a stripe shape, a slit-like shape, or a checkered pattern.

If the ratio of the total area of the region 751H to the total area of the reflective film is too large, an image displayed using the first display element 750($i,j$) is dark.

If the ratio of the total area of the region 751H to the total area of the reflective film is too small, an image displayed using the second display element 550($i,j$) is dark. The reliability of the second display element 550($i,j$) may be degraded.

For example, the region 751H provided in the pixel 702($i,j$+1) is not provided on a line that extends in the row direction (the direction indicated by the arrow R1 in the drawing) through the region 751H provided in the pixel 702($i,j$) (see FIG. 21A). Alternatively, for example, the region 751H provided in the pixel 702($i$+1,j) is not provided on a line that extends in the column direction (the direction indicated by the arrow C1 in the drawing) through the region 751H provided in the pixel 702($i,j$) (see FIG. 21B).

For example, the region 751H provided in the pixel 702($i,j$+2) is provided on a line that extends in the row direction through the region 751H provided in the pixel 702($i,j$) (see FIG. 21A). In addition, the region 751H provided in the pixel 702($i,j$+1) is provided on a line that is perpendicular to the above line between the region 751H provided in the pixel 702($i,j$) and the region 751H provided in the pixel 702($i,j$+2).

Alternatively, for example, the region 751H provided in the pixel 702($i$+2,j) is provided on a line that extends in the column direction through the region 751H provided in the pixel 702($i,j$) (see FIG. 21B). In addition, for example, the region 751H provided in the pixel 702($i$+1,j) is provided on a line that is perpendicular to the above line between the region 751H provided in the pixel 702($i,j$) and the region 751H provided in the pixel 702($i,j$+2,j).

When the second display elements are provided in the above manner to overlap with the regions where light is not blocked, the second display element of one pixel adjacent to another pixel can be apart from a second display element of the another pixel. A display element that displays color different from that displayed from the second display element of one pixel can be provided as the second display element of another pixel adjacent to the one pixel. The difficulty in arranging a plurality of display elements that represent different colors adjacent to each other can be lowered. Thus, a novel display device with high convenience or high reliability can be provided.

The reflective film can have a shape in which an end portion is cut off so as to form the region 751H (see FIG. 21C). Specifically, the reflective film can have a shape in which an end portion is cut off so as to be shorter in the column direction (the direction indicated by the arrow C1 in the drawing).

<<Second Electrode 752>>

For example, a material that can be used for the wiring or the like can be used for the second electrode 752. For example, a material that has a light-transmitting property selected from materials that can be used for the wiring or the like can be used for the second electrode 752.

For example, a conductive oxide, a metal film thin enough to transmit light, a metal nanowire, or the like can be used for the second electrode 752.

Specifically, a conductive oxide containing indium can be used for the second electrode 752. Alternatively, a metal thin film with a thickness greater than or equal to 1 nm and less than or equal to 10 nm can be used for the second electrode 752. Alternatively, a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Alignment Films AF1 and AF2>>

The alignment films AF1 and AF2 can be formed using a material containing polyimide or the like, for example. Specifically, a material formed by rubbing treatment or an optical alignment technique such that a liquid crystal material has predetermined alignment can be used.

For example, a film containing soluble polyimide can be used for the alignment film AF1 or AF2. In that case, the temperature required in forming the alignment film AF1 or AF2 can be low. As a result, damage to other components caused when the alignment film AF1 or the alignment film AF2 is formed can be reduced.

<<Coloring Film CF1>>

The coloring film CF1 can be formed using a material transmitting light of a certain color and can thus be used for a color filter or the like.

For example, a material that transmits blue light, green light, or red light can be used for the coloring film CF1. In that case, the spectral width of light that is transmitted through the coloring film CF1 can be narrowed, so that clear display can be provided.

Furthermore, for example, a material that absorbs blue light, green light, or red light can be used for the coloring film CF1. Specifically, a material transmitting yellow light, magenta light, or cyan light can be used for the coloring film CF1. In that case, the spectral width of light that is absorbed by the coloring film CF1 can be narrowed, so that bright display can be provided.

<<Light-Blocking Film BM>>

The light-blocking film BM can be formed with a material that prevents light transmission and can thus be used as a black matrix, for example.

Specifically, a resin containing a pigment or dye can be used for the light-blocking film BM. For example, a resin in which carbon black is dispersed can be used for the blocking film.

Alternatively, an inorganic compound, an inorganic oxide, a composite oxide containing a solid solution of a plurality of inorganic oxides, or the like can be used for the light-blocking film BM. Specifically, a black chromium film, a film containing cupric oxide, or a film containing copper chloride or tellurium chloride can be used for the light-blocking film BM.

<<Insulating Film 771>>

For example, a material that can be used for the insulating film 521 can be used for the insulating film 771. The insulating film 771 can be formed of polyimide, an epoxy resin, an acrylic resin, or the like. Alternatively, a film including any of a silicon oxide film, a silicon nitride film, a silicon oxynitride film, and an aluminum oxide film, and the like, or a film including a layered material obtained by stacking any of these films can be used for the insulating film 771.

<<Functional Films 770P and 770D>>

An antireflective film, a polarizing film, a retardation film, a light diffusion film, a condensing film, or the like can be used for the functional film 770P or the functional film 770D, for example.

Specifically, a film containing a dichromatic pigment can be used for the functional film 770P or the functional film 770D. Alternatively, a material with a columnar structure having an axis along the direction intersecting a surface of a base can be used for the functional film 770P or the functional film 770D. In that case, light can be easily transmitted in the direction along the axis and easily scattered in other directions.

Alternatively, an antistatic film preventing the attachment of a foreign substance, a water repellent film suppressing the attachment of stain, a hard coat film suppressing a scratch in use, or the like can be used as the functional film 770P.

Specifically, a circularly polarizing film can be used for the functional film 770P. Furthermore, a light diffusion film can be used for the functional film 770D.

<<Second Display Element 550(i,j)>>

For example, a display element having a function of emitting light can be used as the second display element 550(i,j). Specifically, an organic electroluminescent element, an inorganic electroluminescent element, a light-emitting diode, a quantum-dot LED (QDLED), or the like can be used as the second display element 550(i,j).

For example, a light-emitting organic compound can be used for the layer 553(j) containing a light-emitting material.

For example, quantum dots can be used for the layer 553(j) containing a light-emitting material. Accordingly, the half width becomes narrow, and light of a bright color can be emitted.

A layered material for emitting blue light, green light, or red light can be used for the layer 553(j) containing a light-emitting material, for example.

For example, a belt-like layered material that extends in the column direction along the signal line S2(j) can be used for the layer 553(j) containing a light-emitting material.

Alternatively, a layered material for emitting white light can be used for the layer 553(j) containing a light-emitting material. Specifically, a layered material in which a layer containing a light-emitting material including a fluorescent material that emits blue light, and a layer containing materials that are other than a fluorescent material and that emit green light and red light or a layer containing a material that is other than a fluorescent material and that emits yellow light are stacked can be used for the layer 553(j) containing a light-emitting material.

For example, the material that can be used for the wiring or the like can be used for the electrode 551(i,j).

For example, a material that transmits visible light among the materials that can be used for the wiring or the like can be used for the electrode 551(i,j).

Specifically, conductive oxide, indium-containing conductive oxide, indium oxide, indium tin oxide, indium zinc oxide, zinc oxide, zinc oxide to which gallium is added, or the like can be used for the electrode 551(i,j). Alternatively, a metal film that is thin enough to transmit light can be used as the electrode 551(i,j). Further alternatively, a metal film that transmits part of light and reflects another part of light can be used for the electrode 551(i,j). Accordingly, the second display element 550(i,j) can have a microcavity structure. As a result, light of a predetermined wavelength can be extracted more efficiently than light of other wavelengths.

For example, a material that can be used for the wiring or the like can be used for the electrode 552. Specifically, a material that reflects visible light can be used for the electrode 552.

<<Driver Circuit GD>>

Any of a variety of sequential circuits, such as a shift register, can be used as the driver circuit GD. For example, a transistor MD, a capacitor, and the like can be used in the driver circuit GD. Specifically, a transistor including a semiconductor film that can be formed in the same process as the semiconductor film of the transistor M or the transistor that can be used as the switch SW1 can be used.

As the transistor MD, a transistor having a structure different from that of the transistor that can be used as the switch SW1 can be used, for example.

Note that the transistor MD can have the same structure as the transistor M.

<<Transistor>>

For example, semiconductor films formed in the same process can be used for transistors in the driver circuit and the pixel circuit.

As the transistor in the driver circuit or the pixel circuit, a bottom-gate transistor or a top-gate transistor can be used, for example.

A manufacturing line for a bottom-gate transistor including amorphous silicon as a semiconductor can be easily remodeled into a manufacturing line for a bottom-gate transistor including an oxide semiconductor as a semiconductor, for example. Furthermore, for example, a manufacturing line for a top-gate transistor including polysilicon as a semiconductor can be easily remodeled into a manufacturing line for a top-gate transistor including an oxide semiconductor as a semiconductor. In either reconstruction, a conventional manufacturing line can be effectively used.

For example, a transistor including a semiconductor containing an element belonging to Group 14 for a semiconductor film can be used. Specifically, a semiconductor containing silicon can be used for a semiconductor film. For example, single crystal silicon, polysilicon, microcrystalline silicon, or amorphous silicon can be used for the semiconductor film of the transistor.

Note that the temperature for forming a transistor using polysilicon as a semiconductor is lower than the temperature for forming a transistor using single crystal silicon as a semiconductor.

In addition, the transistor using polysilicon as a semiconductor has higher field-effect mobility than the transistor using amorphous silicon as a semiconductor, and therefore a pixel including the transistor using polysilicon can have a high aperture ratio. Moreover, pixels arranged at high resolution, a gate driver circuit, and a source driver circuit can be formed over the same substrate. As a result, the number of components included in an electronic device can be reduced.

In addition, the transistor using polysilicon as a semiconductor has higher reliability than the transistor using amorphous silicon as a semiconductor.

Alternatively, a transistor including a compound semiconductor can be used. Specifically, a semiconductor containing gallium arsenide can be used for a semiconductor film.

Alternatively, a transistor including an organic semiconductor can be used. Specifically, an organic semiconductor containing any of polyacenes and graphene can be used for a semiconductor film.

For example, a transistor using an oxide semiconductor for a semiconductor film can be used. Specifically, an oxide semiconductor containing indium or an oxide semiconductor containing indium, gallium, and zinc can be used for a semiconductor film. Note that the details of the oxide semiconductor example will be described in Embodiment 4.

For example, a transistor having a lower leakage current in an off state than a transistor using amorphous silicon for a semiconductor film can be used. Specifically, a transistor using an oxide semiconductor for a semiconductor film can be used.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of a data processing device that includes the above pixel circuit can be reduced, and power consumption for driving can be reduced.

For example, a transistor including a semiconductor film 508, a conductive layer 504, the conductive layer 512A, and the conductive layer 512B can be used as the switch SW1 (see FIG. 16B). The insulating film 506 includes a region positioned between the semiconductor film 508 and the conductive layer 504.

The conductive layer 504 includes a region overlapping with the semiconductor film 508. The conductive layer 504 functions as a gate electrode. The insulating film 506 functions as a gate insulating film.

The conductive layers 512A and 512B are electrically connected to the semiconductor film 508. The conductive layer 512A has one of a function of a source electrode and a function of a drain electrode, and the conductive layer 512B has the other.

Furthermore, a transistor including the conductive layer 524 can be used as the transistor included in the driver circuit or the pixel circuit (see FIG. 16B). The conductive layer 524 includes a region provided such that the semiconductor film 508 is positioned between the conductive layer 504 and the conductive layer 524. The insulating film 516 includes a region positioned between the conductive layer 524 and the semiconductor film 508. For example, the conductive layer 524 can be electrically connected to a wiring that supplies the same potential as that supplied to the conductive layer 504.

A conductive layer in which a 10-nm-thick film containing tantalum and nitrogen and a 300-nm-thick film containing copper are stacked can be used as the conductive layer 504, for example. A film containing copper includes a region provided such that a film containing tantalum and nitrogen is positioned between the film containing copper and the insulating film 506.

A material in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region provided such that the film containing silicon, oxygen, and nitrogen is positioned between the film containing silicon and nitrogen and the semiconductor film 508.

For example, a 25-nm-thick film containing indium, gallium, and zinc can be used as the semiconductor film 508.

For example, a conductive layer in which a 50-nm-thick film containing tungsten, a 400-nm-thick film containing aluminum, and a 100-nm-thick film containing titanium are stacked can be used as the conductive layer 512A or 512B. Note that the film containing tungsten includes a region in contact with the semiconductor film 508.

<Structural Example 6 of Display Device>

A structure of a display device of one embodiment of the present invention will be described with reference to FIGS. 12A and 12B.

FIGS. 12A and 12B illustrate the structure of the display device of one embodiment of the present invention. FIG. 12A is a cross-sectional view of the pixel, which corresponds to the cross-sectional view taken along line Y1-Y2 in FIG. 10A. FIG. 12B is a cross-sectional view illustrating part of the structure of the pixel in FIG. 12A.

The structure of the display device described in this structural example is the same as that of the display device 700 described with reference to FIGS. 11A and 11B except that a lens 580 is provided. Different portions will be described in detail below, and the above description is referred to for the similar portions.

The display device described in this embodiment includes the lens 580. The lens 580 includes a region positioned between the optical element 560 and the second display element 550($i,j$) (see FIGS. 12A and 12B).

The lens 580 is a convex lens that includes a material with a refractive index of 1.5 or more and 2.5 or less.

With such a structure, light emitted from the second display element can be gathered toward the optical axis of the optical element, for example. Alternatively, light emitted from the second display element can be used efficiently. The density of current flowing through the light-emitting element can be decreased. Alternatively, the area of the second display element can be increased. Alternatively, the reliability of the light-emitting element can be increased. For example, an organic EL element or a light-emitting diode can be used as the light-emitting element. Consequently, a novel display device with high convenience or high reliability can be provided.

For example, a plano-convex lens can be used as the lens 580.

<<Lens 580>>

A plano-convex lens or a double-convex lens can be used as the lens 580.

A material that transmits visible light can be used for the lens 580. Alternatively, a material whose refractive index is greater than or equal to 1.3 and less than or equal to 2.5 can be used for the lens 580. For example, an inorganic material or an organic material can be used for the lens 580.

For example, a material including an oxide or a sulfide can be used for the lens 580.

Specifically, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, or the like can be used for the lens 580. Alternatively, zinc sulfide or the like can be used for the lens 580.

For example, the lens 580 can be formed using a material containing a resin. Specifically, the lens 580 can be formed using a resin to which chlorine, bromine, or iodine is introduced, a resin to which a heavy metal atom is introduced, a resin to which an aromatic ring is introduced, a resin to which sulfur is introduced, or the like. Alternatively, the lens 580 can be formed using a material containing a resin and nanoparticles of a material whose refractive index is higher than that of the resin. Titanium oxide, zirconium oxide, or the like can be used for the nanoparticles.

<Structural Example 7 of Display Device>

A structure of a display device of one embodiment of the present invention is described with reference to FIGS. 13A and 13B.

FIGS. 13A and 13B illustrate the structure of the display device of one embodiment of the present invention. FIG. 13A is a cross-sectional view of the pixel, which corresponds to the cross-sectional view taken along line Y1-Y2 in FIG. 10A. FIG. 13B is a cross-sectional view illustrating part of the structure of the pixel in FIG. 13A.

The structure of the display device described in this structural example is the same as that of the display device 700 described with reference to FIGS. 11A and 11B except that a liquid crystal element that can operate in a guest-host liquid crystal mode is used as the first display element 750($i,j$) and that a bottom-gate transistor is used. Different portions will be described in detail below, and the above description is referred to for the similar portions.

The display device described in this embodiment includes a liquid crystal element that can operate in a guest-host liquid crystal mode as the first display element 750($i,j$). Thus, a reflective display device can be obtained without a polarizing plate. Furthermore, an image displayed by the display device can be made bright.

<<Layer 753 Containing Liquid Crystal Material>>

For example, nematic liquid crystal, thermotropic liquid crystal, low-molecular liquid crystal, high-molecular liquid crystal, polymer dispersed liquid crystal, or the like can be used for the layer containing a liquid crystal material. Alternatively, a liquid crystal material which exhibits a cholesteric phase or the like can be used. Alternatively, a liquid crystal material which exhibits a blue phase can be used.

Furthermore, the layer 753 containing a liquid crystal material can contain a dichromatic colorant. Note that a liquid crystal material containing a dichroic dye is called a guest-host liquid crystal.

Specifically, a material that has high absorbance in the major axis direction of molecules and low absorbance in the minor-axis direction orthogonal to the major axis direction can be used for the dichroic dye. It is preferable to use a material with a dichroic ratio of 10 or higher, further preferably 20 or higher for the dichroic dye.

An azo dye, an anthraquinone dye, a dioxazine dye, or the like can be used as the dichroic dye, for example.

Two liquid crystal layers including dichroic dyes having homogeneous alignment that are stacked such that their alignment directions are orthogonal to each other can be used as the layer containing a liquid crystal material. With the structure, light can be easily absorbed in all directions. Contrast can be increased.

A phase transition guest-host liquid crystal or a structure in which a droplet containing a guest-host liquid crystal is dispersed in a polymer can be used for the layer 753 containing a liquid crystal material.

<Structural Example 8 of Display Device>

A structure of a display device of one embodiment of the present invention is described with reference to FIGS. 14A and 14B.

FIGS. 14A and 14B illustrate the structure of the display device of one embodiment of the present invention. FIG. 14A is a cross-sectional view of the pixel, which corresponds to the cross-sectional view taken along line Y1-Y2 in FIG. 10A. FIG. 14B is a cross-sectional view illustrating part of the structure of the pixel in FIG. 14A.

The structure of the display device described in this structural example is the same as that of the display device 700 described with reference to FIGS. 13A and 13B except that the lens 580 is provided.

<Operation Example of Display Device>

Operation of the display device of one embodiment of the present invention is described with reference to FIGS. 24A to 24C.

Figure 24A:
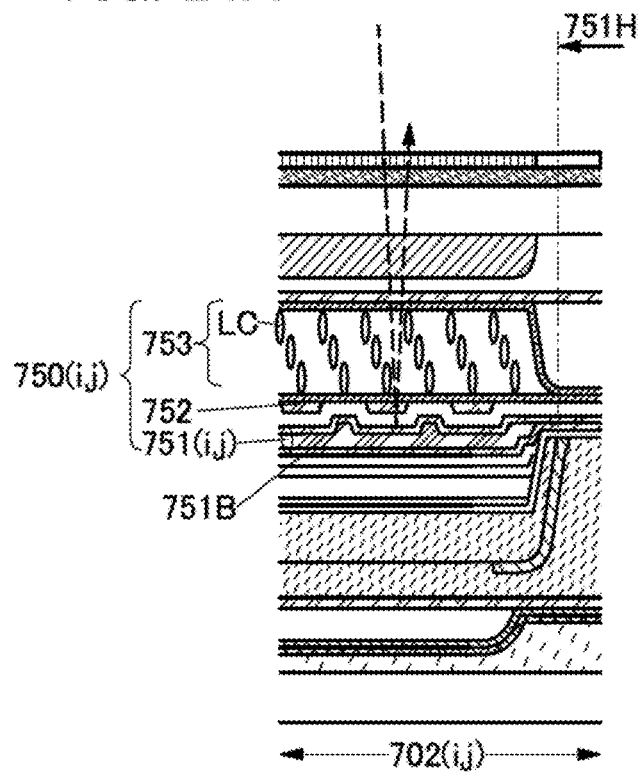
FIGS. 24A to 24C each illustrate operation of a display device.
Figure 24B:
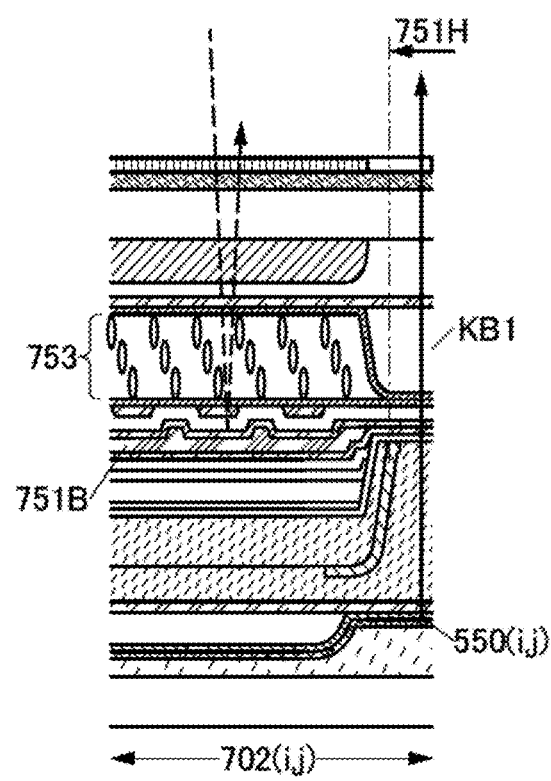
Figure 24C:
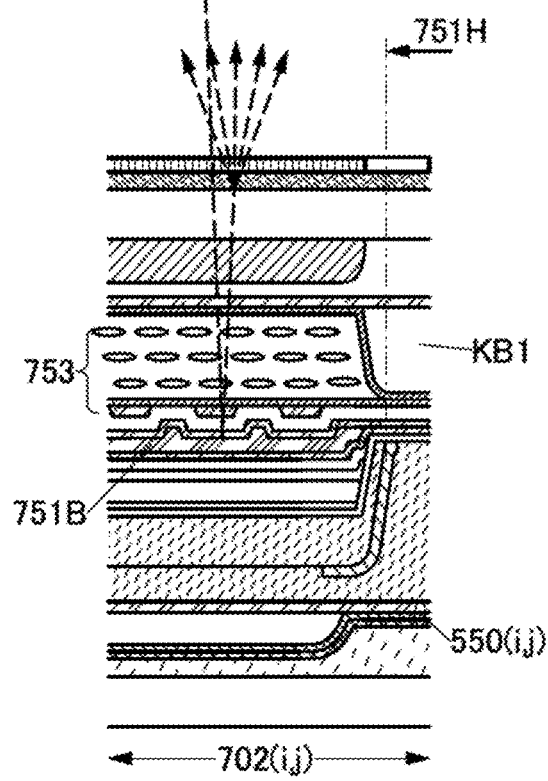

FIGS. 24A to 24C each illustrate operation of the display device of one embodiment of the present invention. FIG. 24A is a cross-sectional view illustrating an operation state of part of the pixel illustrated in FIG. 11A, and FIG. 24B is a cross-sectional view illustrating an operation state different from that in FIG. 24A. FIG. 24C is a cross-sectional view illustrating an operation state different from that in FIG. 24A or FIG. 24B. Note that dashed arrows shown in the drawings denote the directions in which external light is incident on and reflected by the first display element 750($i,j$). A solid arrow in the drawing denotes the direction in which the second display element 550($i,j$) emits light.

<<Operation State 1>>

FIG. 24A illustrates an operation state in which a liquid crystal material LC is aligned in the thickness direction of the layer 753 containing a liquid crystal material. For example, the alignment of the liquid crystal material LC is controlled with an alignment film.

When a circularly polarizing plate, the reflective film 751B, and a VA-IPS mode are used, for example, a low gray level can be displayed in this operation state with no electric field applied. In other words, operation of a normally black liquid crystal display element is achieved.

Although not illustrated, in the case of using the reflective film 751B and a guest-host liquid crystal mode, for example, a high gray level can be displayed in this operation state with no electric field applied. In other words, operation of a normally white liquid crystal display element is achieved.

<<Operation State 2>>

In the operation state illustrated in FIG. 24B, the second display element 550 emits light while the liquid crystal material LC is aligned in the thickness direction of the layer 753 containing a liquid crystal material. Note that the light emitted by the second display element 550($i,j$) does not pass through the layer 753 containing a liquid crystal material but passes through the structure body KB1.

In the case of using a circularly polarizing plate, the reflective film 751B, and a VA-IPS mode, for example, display can be performed with the second display element 550 while a low gray level is displayed by the first display element 750($i,j$) in this operation state with no electric field applied. In this manner, an image can be displayed with a high contrast. Alternatively, an image can be displayed with bright colors.

<<Operation State 3>>

FIG. 24C illustrates an operation state in which the liquid crystal material LC is aligned in the direction intersecting the thickness direction of the layer 753 containing a liquid crystal material. For example, the alignment of the liquid crystal material LC is controlled with an electric field.

When a circularly polarizing plate, the reflective film 751B, and a VA-IPS mode are used, for example, a high gray level can be displayed.

Although not illustrated, in the case of using the reflective film 751B and a guest-host liquid crystal mode, for example, a low gray level can be displayed without a polarizing plate.

When the electrode with a comb-like shape illustrated in FIGS. 22A and 22B and FIGS. 24A to 24C is provided, the touch sensor described in Embodiment 1 can be easily incorporated in the first display element.

Note that a hybrid display method is a method for displaying a plurality of lights in one pixel or one subpixel to display a letter and/or an image. A hybrid display is an aggregate which displays a plurality of lights in one pixel or one subpixel included in a display portion to display a letter and/or an image.

As an example of the hybrid display method, a method in which first light and second light are displayed with different timings in one pixel or one subpixel can be given. At this time, in one pixel or one subpixel, the first light and the second light having the same color tone (any one of red, green, and blue, or any one of cyan, magenta, and yellow) can be displayed at the same time, and a letter and/or an image can be displayed on a display portion.

As another example of the hybrid display method, a method in which reflected light and self-emission light are displayed in one pixel or one subpixel can be given. Reflected light and self-emission light (e.g., organic electroluminescent light and light emitted from a light-emitting diode (LED)) having the same color tone can be displayed at the same time in one pixel or one subpixel.

Note that in a hybrid display method, a plurality of lights may be displayed in not one pixel or one subpixel but adjacent pixels or adjacent subpixels. Furthermore, displaying first light and second light at the same time means displaying the first light and the second light for the same length of time to the extent that flickering is not perceived by a viewer's eye. As long as flickering is not perceived by a viewer's eye, the display period of the first light may deviate from the display period of the second light.

Moreover, the hybrid display is an aggregate which includes a plurality of display elements in one pixel or one subpixel and in which the plurality of display elements perform display in the same period. The hybrid display includes the plurality of display elements and active elements for driving the display elements in one pixel or one subpixel. As the active elements, switches, transistors, thin film transistors, or the like can be given. The active element is connected to each of the plurality of display elements, so that display of the plurality of display elements can be individually controlled.

In Embodiment 2, one embodiment of the present invention has been described. Other embodiments of the present invention will be described in Embodiments 1, 3, and 4. Note that one embodiment of the present invention is not limited to these embodiments. In other words, various embodiments of the invention are described in in this embodiment and the other embodiments, and one embodiment of the present invention is not limited to a particular embodiment. Although an example in which one embodiment of the present invention is applied to a display device is described, one embodiment of the present invention is not limited thereto. Depending on circumstances or conditions, one embodiment of the present invention is not necessarily applied to a display device. One embodiment of the present invention may be applied to a semiconductor device with another function, for example. Although an example in which a channel formation region, a source region, a drain region, and the like of a transistor contain an oxide semiconductor is described as one embodiment of the present invention, one embodiment of the present invention is not limited thereto. Depending on circumstances or conditions, various transistors or a channel formation region, a source region, a drain region, and the like of a transistor in one embodiment of the present invention may contain a variety of semiconductors. Depending on circumstances or conditions, various transistors or a channel formation region, a source region, a drain region, and the like of a transistor in one embodiment of the present invention may contain at least one of silicon, germanium, silicon germanium, silicon carbide, gallium arsenide, aluminum gallium arsenide, indium phosphide, gallium nitride, and an organic semiconductor, for example, or alternatively do not necessarily contain an oxide semiconductor.

The structure and method described in this embodiment can be implemented by being combined as appropriate with any of the other structures and methods described in the other embodiments.

Embodiment 3

In this embodiment, the structures of a data processing device of one embodiment of the present invention will be described with reference to FIGS. 25A to 25E and FIGS. 26A to 26E.

Figure 25A:
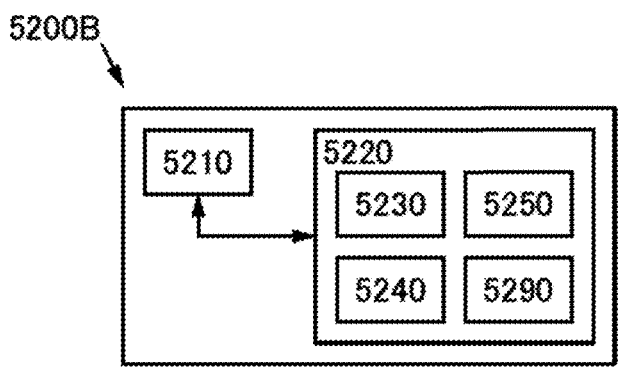
FIGS. 25A to 25E each illustrate a structural example of an electronic device.

FIGS. 25A to 25E and FIGS. 26A to 26E illustrate the structures of the data processing device of one embodiment of the present invention. FIG. 25A is a block diagram of the data processing device, and FIGS. 25B to 25E are perspective views illustrating the structures of the data processing device. FIGS. 26A to 26E are perspective views illustrating the structures of the data processing device.

<Data Processing Device>

A data processing device 5200B described in this embodiment includes an arithmetic device 5210 and an input/output device 5220 (see FIG. 25A).

The arithmetic device 5210 has a function of receiving operation data and a function of supplying image data on the basis of the operation data.

The input/output device 5220 includes a display portion 5230, an input portion 5240, a sensor portion 5250, and a communication portion 5290 and has a function of supplying operation data and a function of receiving image data. The input/output device 5220 also has a function of supplying sensing data, a function of supplying communication data, and a function of receiving communication data.

The input portion 5240 has a function of supplying operation data. For example, the input portion 5240 supplies operation data on the basis of operation by the user of the data processing device 5200B.

Specifically, a keyboard, a hardware button, a pointing device, a touch sensor, an audio input device, a viewpoint input device, or the like can be used as the input portion 5240.

The display portion 5230 includes a display device and has a function of displaying image data. For example, the display device described in Embodiment 1 can be used for the display portion 5230.

The sensor portion 5250 has a function of supplying sensing data. For example, the sensor portion 5250 has a function of sensing a surrounding environment where the data processing device is used and supplying sensing data.

Specifically, an illuminance sensor, an imaging device, an attitude determination device, a pressure sensor, a human motion sensor, or the like can be used as the sensor portion 5250.

The communication portion 5290 has a function of receiving and supplying communication data. For example, the communication portion 5290 has a function of being connected to another electronic device or a communication network by wireless communication or wired communication. Specifically, the communication portion 5290 has a function of local area wireless communication, telephone communication, or near field wireless communication, for example.

<<Structural Example 1 of Data Processing Device>>

Figure 25B:
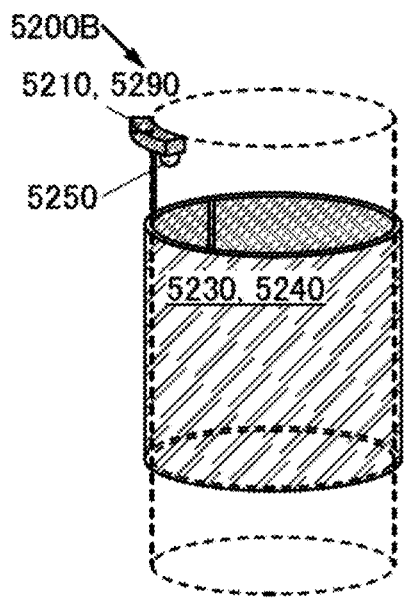

For example, the display portion 5230 can have an outer shape along a cylindrical column (see FIG. 25B). Furthermore, the display portion 5230 has a function of changing a displaying method in accordance with the illuminance of a usage environment and a function of changing displayed contents when sensing the existence of a person. Thus, the data processing device can be mounted on a column of a building, for example. Alternatively, the data processing device can display advertisement, information, or the like. The data processing device can be used for a digital signage or the like.

<<Structural Example 2 of Data Processing Device>>

Figure 25C:
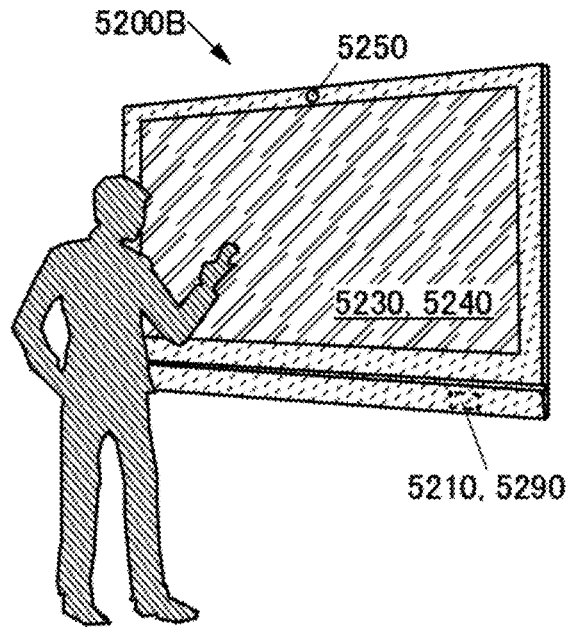

For example, the data processing device has a function of generating image data on the basis of the path of a pointer used by a user (see FIG. 25C). Specifically, it is possible to use a display device with a diagonal of 20 inches or more, preferably 40 inches or more, further preferably 55 inches or more. Alternatively, display devices can be arranged in one display region. Alternatively, display devices can be arranged to be used as a multiscreen. In this case, the data processing device can be used for an electronic blackboard, an electronic bulletin board, a digital signage, or the like.

<<Structural Example 3 of Data Processing Device>>

Figure 25D:
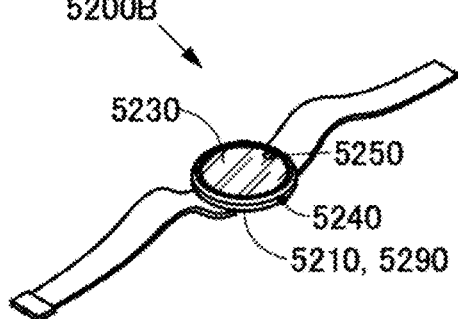

For example, the data processing device has a function of changing a displaying method in accordance with the illuminance of a usage environment (see FIG. 25D). Thus, it is possible to obtain a smartwatch with reduced power consumption, for example. Alternatively, it is possible to obtain a smartwatch that can display an image such that the smartwatch is favorably used even in an environment with intense external light, e.g., in the open air under fine weather.

<<Structural Example 4 of Data Processing Device>>

Figure 25E:
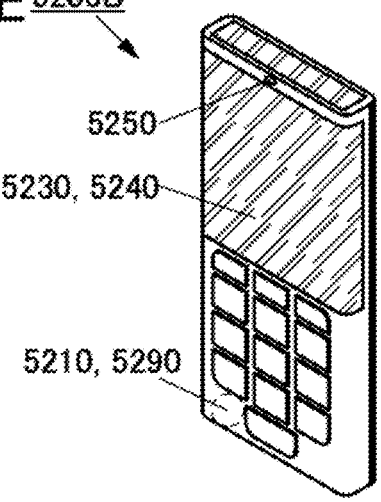

The display portion 5230 has a surface gently curved along a side surface of a housing (see FIG. 25E). The display portion 5230 includes a display device that has, for example, a function of performing display on a front surface, side surfaces, and a top surface. Thus, it is possible to obtain a mobile phone that can display image data on not only its front surface but also its side surfaces and top surface.

<<Structural Example 5 of Data Processing Device>>

Figure 26A:
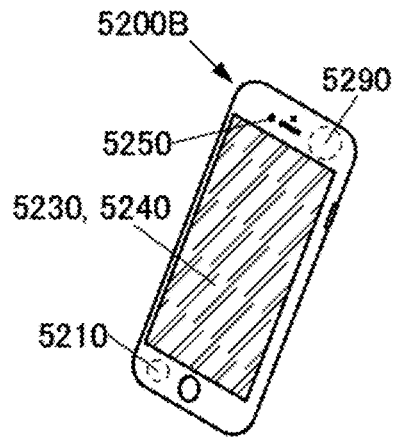
FIGS. 26A to 26E each illustrate a structural example of an electronic device.

For example, the data processing device has a function of changing a displaying method in accordance with the illuminance of a usage environment (see FIG. 26A). Thus, it is possible to obtain a smartphone with reduced power consumption. Alternatively, it is possible to obtain a smartphone that can display an image such that the smartphone is favorably used even in an environment with intense external light, e.g., in the open air under fine weather.

<<Structural Example 6 of Data Processing Device>>

Figure 26B:
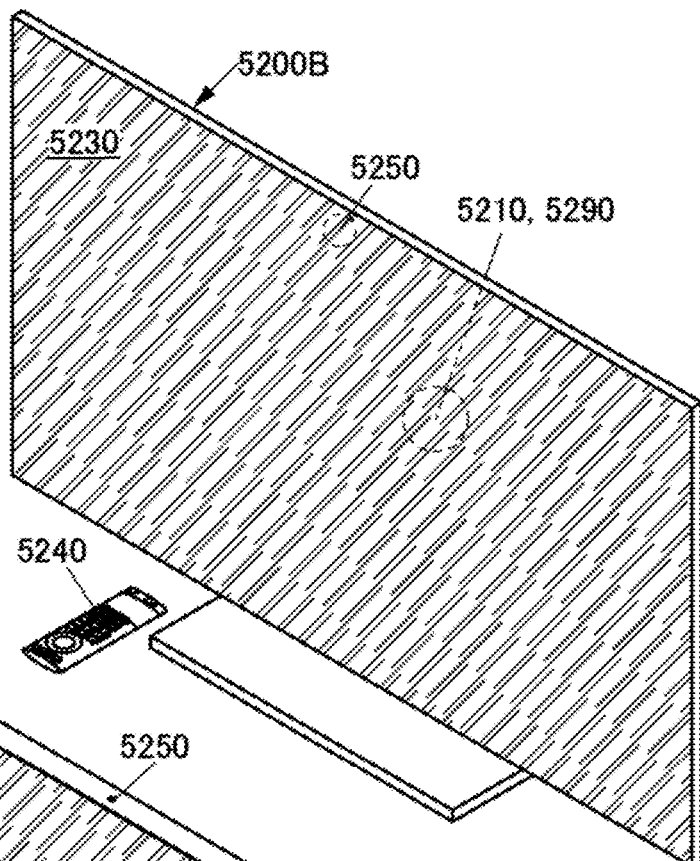

For example, the data processing device has a function of changing a displaying method in accordance with the illuminance of a usage environment (see FIG. 26B). Thus, it is possible to obtain a television system that can display an image such that the television system is favorably used even when exposed to intense external light poured into a room in a sunny day.

<<Structural Example 7 of Data Processing Device>>

Figure 26C:
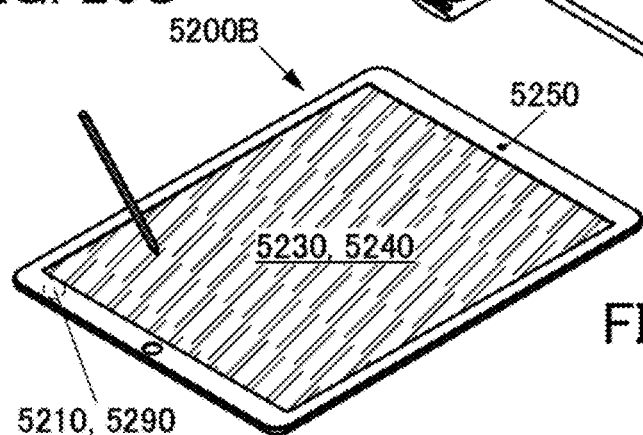

For example, the data processing device has a function of changing a displaying method in accordance with the illuminance of a usage environment (see FIG. 26C). Thus, it is possible to obtain a tablet computer that can display an image such that the tablet computer is favorably used even in an environment with intense external light, e.g., in the open air under fine weather.

<<Structural Example 8 of Data Processing Device>>

Figure 26D:
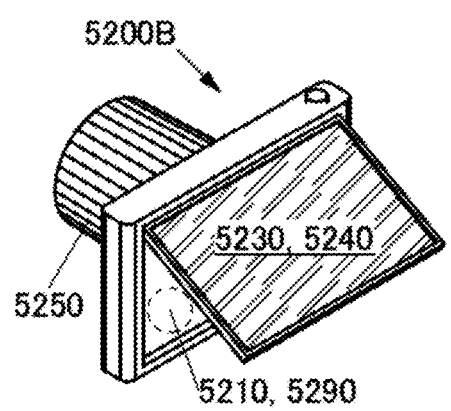

For example, the data processing device has a function of changing a displaying method in accordance with the illuminance of a usage environment (see FIG. 26D). Thus, it is possible to obtain a digital camera that can display a subject such that an image is favorably viewed even in an environment with intense external light, e.g., in the open air under fine weather.

<<Structural Example 9 of Data Processing Device>>

Figure 26E:
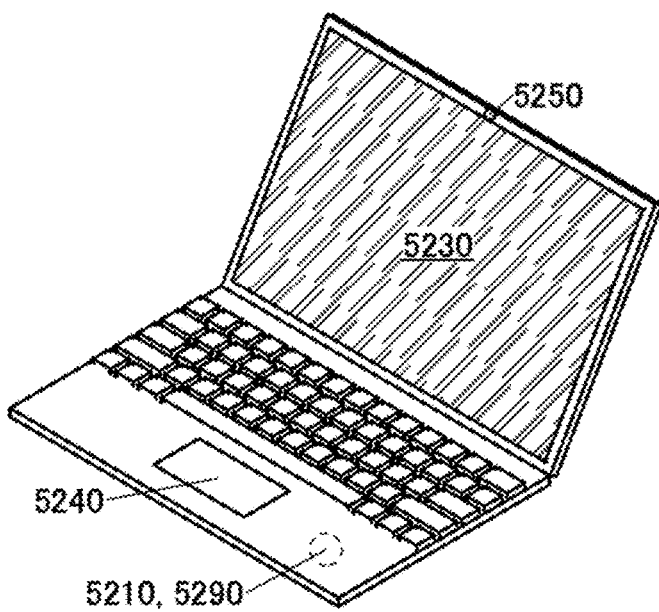

For example, the data processing device has a function of changing a displaying method in accordance with the illuminance of a usage environment (see FIG. 26E). Thus, it is possible to obtain a personal computer that can display an image such that the personal computer is favorably used even in an environment with intense external light, e.g., in the open air under fine weather.

Embodiment 4

[Transistor]

The transistor includes a conductive layer serving as a gate electrode, a semiconductor layer, a conductive layer serving as a source electrode, a conductive layer serving as a drain electrode, and an insulating layer serving as a gate insulating layer. FIGS. 13A and 13B show the case where a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer contains an In-M-Zn-based oxide, it is preferable that the atomic ratio of metal elements of a sputtering target used for forming a film of the In-M-Zn oxide satisfy In≥M and Zn≥M The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed semiconductor layer varies from the above atomic ratios of metal elements of the sputtering targets in a range of ±40%.

The bottom-gate transistor described in this embodiment is preferable because the number of manufacturing steps can be reduced. When a metal oxide, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

A metal oxide film with low carrier density is used as the semiconductor layer. For example, the semiconductor layer is a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such a metal oxide is referred to as a highly purified intrinsic or substantially highly purified intrinsic metal oxide. The metal oxide has a low impurity concentration and a low density of defect states and can thus be referred to as a metal oxide having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the metal oxide contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to a metal oxide, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the metal oxide contained in the semiconductor layer, electrons serving as carriers are generated and the carrier density increases, so that the semiconductor layer easily becomes n-type. Thus, a transistor including a metal oxide that contains nitrogen is likely to be normally on. Hence, the concentration of nitrogen in the semiconductor layer which is measured by secondary ion mass spectrometry is preferably lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor) including a c-axis aligned crystal, a polycrystalline structure, a microcrystalline structure, or an amorphous structure, for example. Among the non-single-crystal structures, an amorphous structure has the highest density of defect states, whereas CAAC-OS has the lowest density of defect states.

A metal oxide film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

<Composition of CAC-OS>

Described below is the composition of a cloud-aligned composite oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 27:
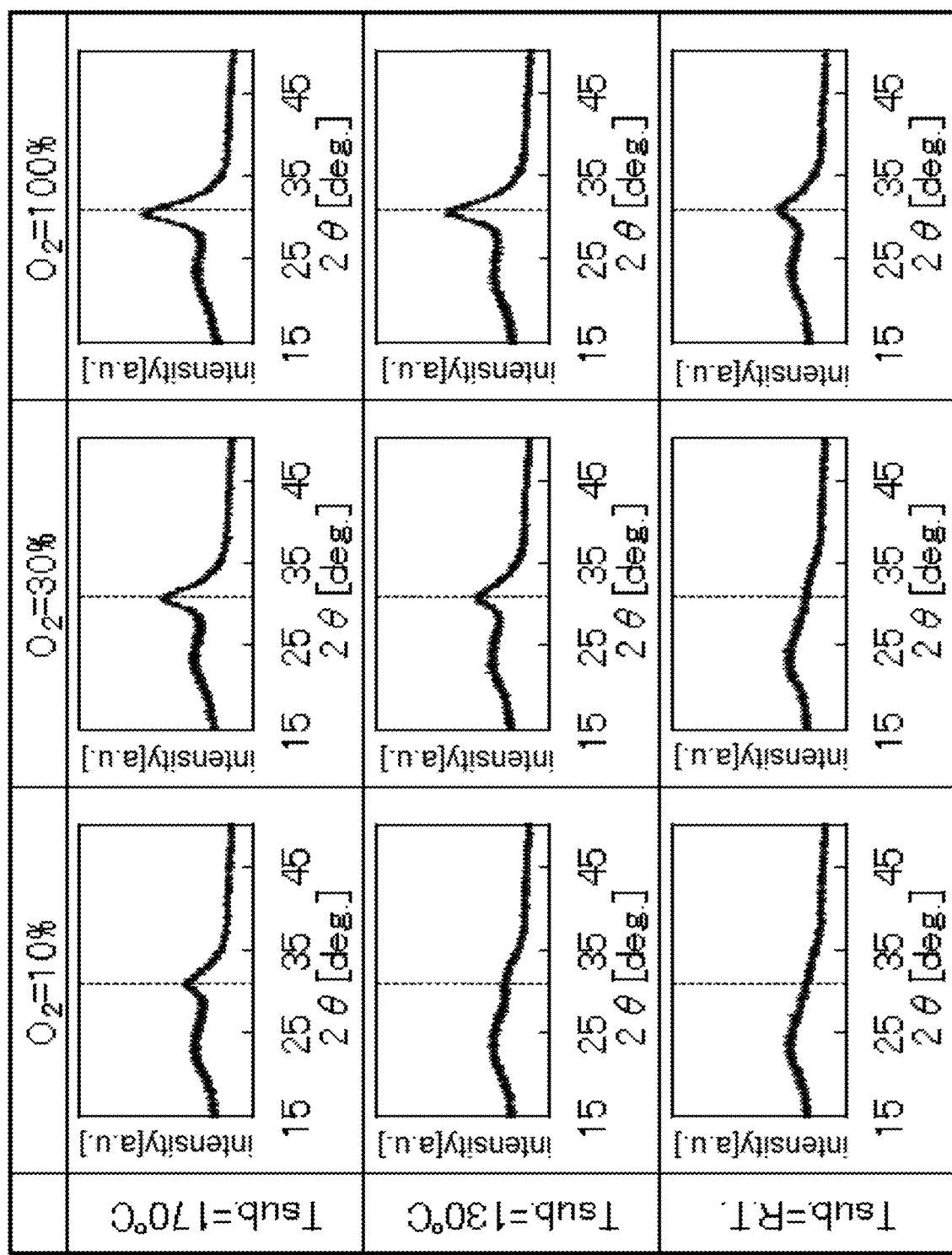
FIG. 27 shows measured XRD spectra of samples.

FIG. 27 shows XRD spectra measured by an out-of-plane method. In FIG. 27, the top row shows the measurement results of the samples formed at a substrate temperature of 170° C.; the middle row shows the measurement results of the samples formed at a substrate temperature of 130° C.; and the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; and the right column shows the measurement results of the samples formed with an oxygen gas flow rate ratio of 100%.

In the XRD spectra shown in FIG. 27, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 27, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 28A is a plan-view TEM image of the sample formed at a substrate temperature of R.T. and with an oxygen gas flow rate ratio of 10%. FIG. 28B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 28A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 28C, 28D, 28E, 28F, and 28G show the results of the points indicated by the black dots a1, a2, a3, a4, and a5, respectively.

In FIGS. 28C, 28D, 28E, 28F, and 28G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 28B of the sample formed at a substrate temperature of R.T. and an oxygen gas flow rate ratio of 10% are observed. FIGS. 28H, 28I, 28J, 28K, and 28L show the results of the points indicated by the black dots b1, b2, b3, b4, and b5, respectively.

In FIGS. 28H, 28I, 28J, 28K, and 28L, regions with high luminance in a ring pattern can be shown. Furthermore, a plurality of spots can be shown in a ring-like shape.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 29A:
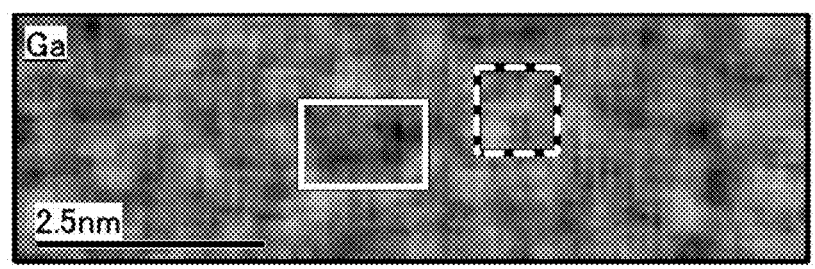
FIGS. 29A to 29C show EDX mapping images of a sample.
Figure 29B:
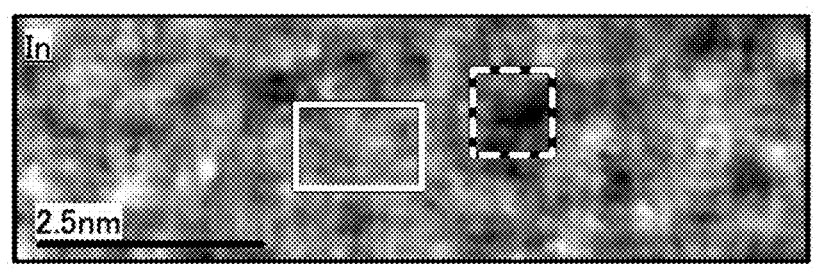
Figure 29C:
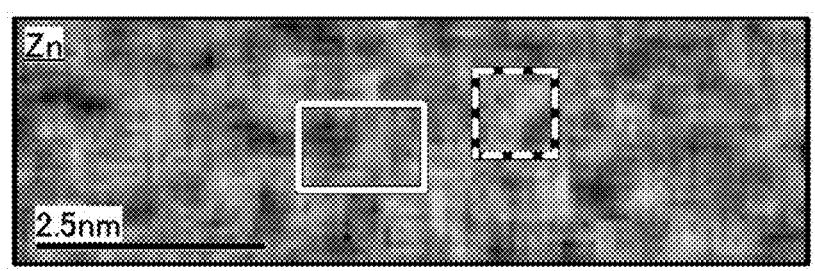

FIGS. 29A to 29C show EDX mapping images in a cross section of the sample formed at a substrate temperature of R.T. and with an oxygen gas flow rate ratio of 10%. FIG. 29A shows an EDX mapping image of Ga atoms. The proportion of the Ga atoms in all the atoms is 1.18 atomic % to 18.64 atomic %. FIG. 29B shows an EDX mapping image of In atoms. The proportion of the In atoms in all the atoms is 9.28 atomic % to 33.74 atomic %. FIG. 29C shows an EDX mapping image of Zn atoms. The proportion of the Zn atoms in all the atoms is 6.69 atomic % to 24.99 atomic %. FIGS. 29A to 29C show the same region in the cross section of the sample formed at a substrate temperature of R.T. and with an oxygen gas flow rate ratio of 10%. In the EDX mapping images, the proportion of an element is indicated by gray scale: the more measured atoms exist in a region, the brighter the region is; the less measured atoms exist in a region, the darker the region is. The magnification of the EDX mapping images in FIGS. 29A to 29C is 7200000 times.

The EDX mapping images in FIGS. 29A to 29C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 29A to 29C are examined.

In FIG. 29A, a relatively dark region occupies a large area in the area surrounded by the solid line, while a relatively bright region occupies a large area in the area surrounded by the dashed line. In FIG. 29B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 29C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 29C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 29A to 29C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 29A to 29C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, a high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility (μ) can be achieved.

A semiconductor element including a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, a typical example of which is a gate line driver circuit that generates a gate signal, allows a display device to have a narrow bezel. Furthermore, the use of the transistor in a signal line driver circuit (particularly in a demultiplexer connected to an output terminal of a shift register included in a signal line driver circuit) that is included in a display device and supplies a signal from a signal line can reduce the number of wirings connected to the display device.

Furthermore, the transistor including a CAC-OS in the semiconductor layer does not need a laser crystallization step like a transistor including low-temperature polysilicon. Thus, the manufacturing cost of a display device can be reduced, even when the display device is formed using a large substrate. In addition, when the transistor including a CAC-OS in the semiconductor layer is used for a driver circuit and a display portion in a large display device having high resolution such as ultra high definition ("4K resolution", "4K2K", and "4K") or super high definition ("8K resolution", "8K4K", and "8K"), writing can be performed in a short time, and display defects can be reduced, which is preferable.

Alternatively, silicon may be used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has a higher field effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. The top-gate transistor is particularly preferable when polycrystalline silicon, single-crystal silicon, or the like is employed.

At least part of this embodiment can be implemented in combination with any of the other embodiments described in this specification as appropriate.

REFERENCE NUMERALS

ACF1: conductive material, ADD: wiring, AF1: alignment film, AF2: alignment film, ANO: wiring, BM: light-blocking film, C11: capacitor, C12: capacitor, CF1: coloring film, COM: wiring, COM-Rx: wiring, COM-Tx: wiring, CSCOM: wiring, CTRL: wiring, G1: scan line, G2: scan line, GVSS: wiring, KB1: structure body, L1: visible light, L2: light, ND1: wiring, ND2: wiring, ND3: wiring, R1: arrow, S1: signal line, S2: signal line, SD1: driver circuit, SD2: driver circuit, SW1: switch, SW2: switch, V11: data, V12: data, VCOM1: wiring, VCOM2: conductive layer, 10: display device, 11: substrate, 12: substrate, 13: FPC, 14: conductive layer, 20: liquid crystal element, 21: conductive layer, 21a: conductive layer, 21b: conductive layer, 22: conductive layer, 22a: conductive layer, 22b: conductive layer, 22c: conductive layer, 23: liquid crystal, 24: insulating layer, 31: coloring film, 61: gate driver, 61a: decoder, 61b: selection circuit, 61c: shift register, 61d: switch, 61e: switch, 61f: switch, 61g: buffer, 61h: switch, 62: receiver circuit, 63: touch sensor, 64: pixel, 64a: selection transistor, 64b: capacitor, 64c: liquid crystal display element, 64d: contact, 64e: contact, 64f: common electrode, 64g: contact, 64h: wiring, 65: scan line, 66: signal line, 67: capacitor, 68: pixel electrode, 200: liquid crystal display device, 201: display portion, 202: gate line driver circuit, 203: pixel, 231: display region, 305a: connection portion, 307a: liquid crystal element, 307b: liquid crystal element, 311: substrate, 312: insulating layer, 313: insulating layer, 315: insulating layer, 317: insulating layer, 319: insulating layer, 331: conductive layer, 333: conductive layer, 335: conductive layer, 341: coloring film, 343: light-blocking film, 345: insulating layer, 347: spacer, 349: liquid crystal, 351: conductive layer, 352: conductive layer, 352a: wiring, 353: insulating layer, 361: substrate, 365: adhesive layer, 367: connector, 368: IC, 369: FPC, 370a: transistor, 372: polysilicon film, 373: conductive layer, 374a: conductive layer, 374b: conductive layer, 380a: transistor, 501B: insulating film, 501C: insulating film, 504: conductive layer, 505: bonding layer, 506: insulating film, 508: semiconductor film, 511B: conductive layer, 512A: conductive layer, 512B: conductive layer, 516: insulating film, 518: insulating film, 518A: insulating film, 518A1: insulating film, 518A2: insulating film, 518B: insulating film, 519B: terminal, 520: functional layer, 521: insulating film, 521A: insulating film, 521B: insulating film, 521C: insulating film, 522: connection portion, 524: conductive layer, 528: insulating film, 530: pixel circuit, 550: display element, 551: electrode, 552: electrode, 553: layer containing a light-emitting material, 560: optical element, 560A: region, 560B: region, 560C: region, 565: covering film, 570: substrate, 580: lens, 591A: opening, 592B: opening, 700: display device, 700B: display device, 702: pixel, 703: pixel, 705: sealing material, 720: functional layer, 750: display element, 751: first electrode, 751A: conductive layer, 751B: reflective film, 751C: conductive layer, 751H: region, 752: second electrode, 753: layer containing a liquid crystal material, 770: substrate, 770D: functional film, 770P: functional film, 770PA: functional film, 770PB: functional film, 771: insulating film, 771A: insulating film, 771B: insulating film, 5200B: data processing device, 5210: arithmetic device, 5220: input/output device, 5230: display portion, 5240: input portion, 5250: sensor portion, 5290: communication portion This application is based on Japanese Patent Application Serial No. 2016-207008 filed with Japan Patent Office on Oct. 21, 2016, the entire contents of which are hereby incorporated by reference.

The invention claimed is:

1. A display device comprising:
    a gate driver;
    g wirings;
    a plurality of touch sensors arranged in a matrix with m rows and k columns;
    m wirings; and
    a plurality of first touch wirings, each of the plurality of first touch wirings provided between two of the g wirings,
    wherein the m wirings are respectively connected to the plurality of touch sensors in an n-th column of the k columns and the first to m-th rows that are directly adjacent,
    wherein the gate driver is configured to supply a first scan signal to the g wirings at a same first timing,
    wherein the plurality of touch sensors in different positions are configured to sense a plurality of touches at a same second timing,
    wherein g, m, and k are each a natural number of 2 or more, and n is a natural number of 1 or more, and
    wherein the plurality of touch sensors are spaced apart from each other.

2. The display device according to claim 1, further comprising a pixel,
    wherein the gate driver is configured to supply a second scan signal to the plurality of first touch wirings,
    wherein the m wirings electrically connected to a receiver circuit intersect with the plurality of first touch wirings,
    wherein the pixel comprises a first display element, and
    wherein the first display element is a transmissive liquid crystal element.

3. The display device according to claim 1, further comprising a pixel,
wherein the pixel comprises a first display element, and
wherein the first display element is a reflective liquid crystal element.

4. The display device according to claim 3,
wherein the pixel comprises the first display element and a second display element,
wherein the first display element is configured to reflect visible light, and
wherein the second display element is configured to emit visible light.

5. The display device according to claim 4, wherein the second display element is a light-emitting element.

6. The display device according to claim 4, wherein an image is displayed with one or both of first light reflected by the first display element and second light emitted by the second display element.

7. The display device according to claim 1, further comprising:
a transistor,
wherein the transistor comprises polysilicon in a semiconductor layer, and
wherein the gate driver further includes a decoder, a plurality of selection circuits, and a plurality of buffers.

8. The display device according to claim 1, further comprising:
a transistor,
wherein the transistor comprises a metal oxide in a semiconductor layer, and
wherein the m wirings electrically connected to a receiver circuit overlap with the g wirings and the plurality of touch sensors.

9. A display device comprising:
a receiver circuit,
a display region; and
a gate driver,
wherein the display region comprises a pixel, a plurality of touch sensors arranged in a matrix with m rows and k columns, g wirings, and m wirings,
wherein the g wirings are provided for touch sensors of the plurality of touch sensors in a plurality of columns and a single row,
wherein the m wirings are respectively connected to the plurality of touch sensors in an n-th column of the k columns and the first to m-th rows that are directly adjacent,
wherein the gate driver is configured to supply a first scan signal to a plurality of scan lines,
wherein the m wirings are electrically connected to the receiver circuit,
wherein the gate driver is configured to supply a second scan signal for sensing a touch to the g wirings, and
wherein g, m, and k are each a natural number of 2 or more, and n is a natural number of 1 or more.

10. The display device according to claim 9,
wherein the plurality of touch sensors are spaced apart from each other,
wherein the pixel comprises a first display element, and
wherein the first display element is a transmissive liquid crystal element.

11. The display device according to claim 10, wherein touch sensors adjacent to each other in a row direction are spaced a part from each other.

12. The display device according to claim 9,
wherein the m wirings intersect with the g wirings,
wherein the pixel comprises a first display element, and
wherein the first display element is a reflective liquid crystal element.

13. The display device according to claim 12,
wherein the pixel comprises the first display element and a second display element,
wherein the first display element is configured to reflect visible light, and
wherein the second display element is configured to emit visible light.

14. The display device according to claim 13, wherein the second display element is a light-emitting element.

15. The display device according to claim 13, wherein an image is displayed with one or both of first light reflected by the first display element and second light emitted by the second display element.

16. The display device according to claim 13, further comprising:
a transistor in the pixel,
wherein the transistor comprises polysilicon in a semiconductor layer, and
wherein the gate driver further includes a decoder, a plurality of selection circuits, and a plurality of buffers.

17. The display device according to claim 13, further comprising:
a transistor in the pixel,
wherein the transistor comprises a metal oxide in a semiconductor layer, and
wherein the plurality of scan lines overlap with the plurality of touch sensors and the m wirings.

18. The display device according to claim 1, wherein touch sensors adjacent to each other in a row direction are spaced a part from each other.

* * * * *